(12) United States Patent
Kawano et al.

(10) Patent No.: US 7,317,236 B2
(45) Date of Patent: *Jan. 8, 2008

(54) SEMICONDUCTOR LIGHT-RECEIVING MODULE CAPABLE OF CONVERTING LIGHT INTO CURRENT EFFICIENTLY AT LIGHT ABSORBING LAYER

(75) Inventors: Kenji Kawano, Atsugi (JP); Hiroaki Yoshidaya, Atsugi (JP); Jun Hiraoka, Atsugi (JP); Yuichi Sasaki, Nagasaki (JP)

(73) Assignee: Anritsu Corporation, Atsugi-shi (JP)

( * ) Notice: Subject to any disclaimer, the term of this patent is extended or adjusted under 35 U.S.C. 154(b) by 27 days.

This patent is subject to a terminal disclaimer.

(21) Appl. No.: 11/054,746

(22) Filed: Feb. 9, 2005

(65) Prior Publication Data

US 2005/0145966 A1 Jul. 7, 2005

Related U.S. Application Data

(62) Division of application No. 10/618,424, filed on Jul. 11, 2003, now Pat. No. 6,909,160.

(30) Foreign Application Priority Data

Jul. 22, 2002 (JP) ............................. 2002-212865

(51) Int. Cl.
*H01L 31/0232* (2006.01)
(52) U.S. Cl. ...................... 257/436; 257/452; 257/466; 257/E31.038
(58) Field of Classification Search ................ 252/433, 252/434, 438, 436, 452, 661, 664, 666; 257/184, 257/436, 452, 466, E31.038
See application file for complete search history.

(56) References Cited

U.S. PATENT DOCUMENTS

| 6,353,250 | B1 | 3/2002 | Fukano | |
| 6,909,160 | B2 * | 6/2005 | Kawano et al. | 257/436 |
| 7,071,524 | B2 * | 7/2006 | Kawano et al. | 257/436 |
| 2004/0012063 | A1 * | 1/2004 | Kawano et al. | 257/436 |
| 2005/0145967 | A1 * | 7/2005 | Kawano et al. | 257/436 |

FOREIGN PATENT DOCUMENTS

| JP | 3-105985 A | 5/1991 |
| JP | 3-120876 A | 5/1991 |
| JP | 9-64480 A | 3/1997 |
| JP | 11-195807 A | 7/1999 |
| JP | 2001-053328 A | 2/2001 |
| JP | 2001-111094 A | 4/2001 |
| JP | 2001-320076 A | 11/2001 |
| JP | 2004-55620 A | 2/2004 |
| JP | 2004-55915 A | 2/2004 |
| WO | WO 02/091484 A1 | 11/2002 |

* cited by examiner

*Primary Examiner*—Minh-Loan Tran
(74) *Attorney, Agent, or Firm*—Frishauf, Holtz, Goodman & Chick, P.C.

(57) ABSTRACT

A semiconductor light-receiving module includes a semiconductor light-receiving element and an incident light direction device. The semiconductor light-receiving element includes a substrate, at least a light absorbing layer and an upper cladding layer formed sequentially on the substrate, a light incident facet formed at least at one facet of the substrate and the light absorbing layer, and electrodes which output an electric signal generated by absorption of the light entering from the light incident facet in the light absorbing layer. The incident light direction device directs to irradiate the light obliquely to the light incident facet of the semiconductor light-receiving element, and to cause at least part of the light to irradiate the light absorbing layer at the light incident facet.

9 Claims, 25 Drawing Sheets

$D=0.7\mu m$ $D=3.5\mu m$

SEMICONDUCTOR LIGHT-RECEIVING MODULE CAPABLE OF CONVERTING LIGHT INTO CURRENT EFFICIENTLY AT LIGHT ABSORBING LAYER

CROSS-REFERENCE TO RELATED APPLICATIONS

The present application is a Divisional Application of U.S. application Ser. No. 10/618,424, filed Jul. 11, 2003, now U.S. Pat. No. 6,909,160, which is based upon and claims the benefit of priority from and/or is related to the prior Japanese Patent Applications No. 2002-207471, filed Jul. 16, 2002; No. 2002-212865, filed Jul. 22, 2002; and No. 2003-143485, filed May 21, 2003, the entire contents of all of which are incorporated herein by reference.

BACKGROUND OF THE INVENTION

1. Field of the Invention

The present invention relates to a semiconductor light-receiving module having a semiconductor light-receiving element for converting an incoming optical signal from an incident light direction device into an electrical signal.

2. Description of the Related Art

Hitherto, a semiconductor light-receiving element composed of a semiconductor element for converting an optical signal into an electrical signal has been known.

FIG. 36 is a perspective view explaining a general configuration of a semiconductor light-receiving element composed of such semiconductor element for converting an incident light into current.

That is, as shown in FIG. 36, in this semiconductor light-receiving element, a lower cladding layer 5 made of n-InP is formed on a substrate 6 made of $n^+$-InP.

Further on this lower cladding layer 5, a light absorbing layer 4 made of i-InGaAs, an upper cladding layer 3 made of p-InP, and a contact layer 2 made of $p^+$-InGaAs are formed sequentially.

On the top face of the contact layer 2, a p-electrode 1 is provided.

On the bottom face of the substrate 2, an n-electrode 7 is provided.

Moreover, polyimide 8 for reducing the capacitance is formed in part of each side of the contact layer 2, upper cladding layer 3, light absorbing layer 4 and lower cladding layer 5, and in the lower part of the p-electrode 1.

The light absorbing layer 4 made of i-InGaAs, upper cladding layer 3 made of p-InP, and lower cladding layer 5 made of n-InP are combined to compose an optical waveguide for guiding the light entering inside from the light incident plane of the facet of this semiconductor light-receiving element as shown in FIG. 36.

In this optical waveguide, the refractive index of the light absorbing layer 4 is set higher than the refractive index of the upper cladding layer 3 or refractive index of the lower cladding layer 5.

That is, in the semiconductor light-receiving element of waveguide type, this light absorbing layer 4 functions as the core of playing the vital role of guiding the incident light.

In the semiconductor light-receiving element of this waveguide type, the width of mesa is about 4 µm, and the length is about 10 µm.

In the semiconductor light-receiving element having such configuration, while the incident light propagates through the optical waveguide composed of the light absorbing layer 4 made of i-InGaAs, upper cladding layer 3 made of p-InP, and lower cladding layer 5 made of n-InP, it is absorbed by the light absorbing layer 4, and is converted into an electrical signal.

At this time, the intensity I of the light is absorbed according to formula (1):

$$I = I_0 \exp(-\alpha z) \tag{1}$$

where $I_0$ is power of the incident light on the light incident facet, $\alpha$ is an absorption coefficient, and z is a distance from the light incident facet.

FIG. 37 is a diagram showing the relation of the intensity I between the light propagating in the optical waveguide of the semiconductor light-receiving element and the distance z.

As understood from formula (1) and FIG. 37, when the light enters the optical waveguide, it is attenuated exponentially.

That is, the light is absorbed almost completely in a short distance from the light incident facet, and is converted into current.

In FIG. 37, the axis of abscissas represents the distance z from the light incident facet, and the axis of ordinates represents the intensity of the light propagating in the light absorbing layer 4, that is, the magnitude of the current caused as the incident light is absorbed by the light absorbing layer 4.

Joule heat occurring at each point in the light absorbing layer 4 is $I^2R$ where R is the load resistance, and therefore the fact that the light is absorbed almost completely in a short distance from the incident facet means that heat generation occurs suddenly in this short distance.

As a result, if the power of the incident light is large, the Joule heat generated in the short distance is extremely large, and this semiconductor light-receiving element may be broken.

Although not shown in the perspective view of FIG. 37 for the sake of simplicity of explanation, actually, to realize a multiple-mode optical waveguide, usually, a quaternary SCH (separate confinement heterostructure) layer of InGaAsP composition of about 1.3 µm in band gap wavelength is interposed above and beneath the light absorbing layer 4.

Accordingly, supposing the thickness of the light absorbing layer 4 to be 0.6 µm, and the total thickness of upper and lower SCH layers to be about 2 µm, the thickness of the crystal to be grown is as much as 3 to 4 µm in total, and it takes much time in crystal growth and the mesa etching process is complicated, thereby causing to limit the manufacturing yield of the semiconductor light-receiving element.

In order to eliminate such inconvenience, a semiconductor light-receiving element of loaded optical waveguide type as shown in FIGS. 38 and 39 is proposed.

FIG. 38 is a perspective view, and FIG. 39 is a cross sectional view.

In FIGS. 38 and 39, same reference numerals are given in the same parts as in the semiconductor light-receiving element shown in FIG. 36.

That is, as shown in FIGS. 38 and 39, in the semiconductor light-receiving element of this loaded optical waveguide type, a loaded optical waveguide layer 9 is formed on a substrate 6 made of $n^+$-InP.

On this loaded optical waveguide layer 9, a light absorbing layer 4 made of i-InGaAs, an upper cladding layer 3 made of p-InP, and a contact layer 2 made of p⁺-InGaAs are formed sequentially.

On the upper side of the contact layer 2, a p-electrode 1 is provided.

On the bottom face of the substrate 6, an n-electrode 7 is provided.

Moreover, polyimide 8 for reducing the capacitance is formed in part of each side of the contact layer 2, upper cladding layer 3, light absorbing layer 4 and loaded optical waveguide layer 9, and in the lower part of the p-electrode 1.

The loaded optical waveguide layer 9 is made of a material of which refractive index is smaller than that of the light absorbing layer 4 and larger than that of the substrate 6, and, for example, n-InGaAsP having a band gap wavelength of 1.3 μm is used.

In such semiconductor light-receiving element of loaded optical waveguide type, as shown in FIGS. 38 and 39, light from outside enters the facet of the loaded optical waveguide layer 9.

Part of light propagating in this loaded optical waveguide layer 9 exudes to an adjacent light absorbing layer 4 and is coupled as shown in a cross sectional view in FIG. 39, and the photo responsivity of this light is proportional to the square of the absolute value of overlapping integration of an eigen-mode wave function $\phi_S$ of the loaded optical waveguide layer 9 and an eigen-mode wave function $\phi_C$ of the light absorbing layer 4, and is expressed in formula (2).

$$\Gamma = |\int\int \phi_S \cdot (\phi_C)^* dx dy|^2 \quad (2)$$

FIGS. 40A and 40B are diagrams schematically showing the mode of evanescent coupling and absorbing of the light in the light absorbing layer 4 in the course of propagation through the loaded optical waveguide layer 9.

FIG. 40A shows a case where the thickness D of the loaded optical waveguide layer 9 is small (for example, D=0.7 μm).

FIG. 40B shows a case where the thickness D of the loaded optical waveguide layer 9 is large (for example, D=3 to 5 μm).

FIGS. 41A and 41B are diagrams showing the power I of the light propagating in the semiconductor light-receiving element as the function of the distance z in the light absorbing layer 4.

FIG. 41A shows a case where the thickness D of the loaded optical waveguide layer 9 is small (for example, D=0.7 μm).

FIG. 41B shows a case where the thickness D of the loaded optical waveguide layer 9 is large (for example, D=⅗ μm).

When the thickness D of the loaded optical waveguide layer 9 is small as shown in FIGS. 40A and 41A, the spot size of the light propagating in the loaded optical waveguide layer 9 is small, and the light propagating in the loaded optical waveguide layer 9 is strongly coupled evanescently to the light absorbing layer 4.

In other words, since the spot size of the light propagating in the loaded optical waveguide layer 9 is small, the value of the portion overlapping with the light absorbing layer 4 is greater in the wave function $\phi_S$ of the light propagating in the loaded optical waveguide layer 9, and hence the square of the absolute value of overlapping integration Γ expressed in formula (2) is also greater.

The spot size of the light entering the facet of the loaded optical waveguide layer 9 is set equal regardless of the thickness D of the loaded optical waveguide layer 9.

As a result, although the length La of the light absorbing layer 4 necessary for realizing the photo responsivity required as the semiconductor light-receiving element can be shortened, same as in the case of the semiconductor light-receiving element shown in FIG. 37, a great Joule heat is generated in a short distance z, and the element may be broken.

In order to avoid breakage of element by Joule heat, it is effective to weaken the degree of evanescent coupling of the light propagating in the loaded optical waveguide layer 9 to the light absorbing layer 4, that is, to increase the spot size of the light propagating in the loaded optical waveguide layer 9 by increasing the thickness D of the loaded optical waveguide layer 9 as shown in FIGS. 40B and 41B.

In other words, it is enough to decrease the value of the overlapping portion with the light absorbing layer 4 out of the wave function $\phi_S$ of the light propagating in the loaded optical waveguide layer 9.

In this case, however, since the square value Γ of the absolute value of the overlapping integration shown in formula (2) also becomes smaller, a longer length La of the light absorbing layer 4 is needed for realizing the photo responsivity required as the semiconductor light-receiving element.

Since the longer length La of the light absorbing layer 4 means the capacitance as the semiconductor light-receiving element becomes larger, the 3 dB bandwidth $\Delta f(=1/(\pi RC))$ becomes smaller and it is hard to apply this semiconductor light-receiving element in a high speed transmission system of, for example, 40 Gbps.

In this case, still more, since the thickness D of the loaded optical waveguide layer 9 is large, the total thickness of the semiconductor layers to be grown is large, and the load to crystal growth is extremely large.

Generally, when the crystal is grown thicker than 3 μm, strains are present in the semiconductor layer of crystal growth, and the film quality of the light absorbing layer 4 grown thereon deteriorates.

This deterioration of film quality is known to spoil the dark current characteristic as semiconductor light-receiving element indispensable for realizing a clear eye pattern in optical transmission.

Further, when the thickness D of the loaded optical waveguide layer 9 is increased and the spot size becomes larger, the increase of the upper cladding layer 3 must be also increased in order to reduce the light absorption loss due to the contact layer 2, and it becomes more difficult to achieve a favorable crystal growth.

Thus, in the semiconductor light-receiving element of loaded optical waveguide type shown in FIGS. 38 and 39, to realize high speed operation, if the spot size of the light propagating in the loaded optical waveguide layer 9 is decreased in order to shorten the length (element length) La of the light absorbing layer 4, the element is more likely to be broken by Joule heat. In addition, when the spot size of the light propagating in the loaded optical waveguide layer 9 is increased to avoid such thermal breakdown, the element length La becomes longer, and high speed operation is difficult, to the contrary.

In this semiconductor light-receiving element, moreover, it is hard to grow the light absorbing layer 4 of excellent crystallinity and small dark current on a thick grown crystal, and the characteristic as the semiconductor light-receiving element deteriorates.

To eliminate such inconvenience, it has been proposed to use a semiconductor light-receiving element of facet refractive type having a structure as shown in a cross sectional view in FIG. 42 (Jpn. Pat. Appln. KOKAI Publication No. 11-195807).

That is, as shown in FIG. 42, in this semiconductor light-receiving element of facet refractive type, a lower cladding layer 10 made of n$^+$-InP, a light absorbing layer 4 made of i-InGaAs, an upper cladding layer 3 made of p-InP, and a contact layer 2 made of p$^+$-InGaAs are sequentially formed on a substrate 11 made of a semi-insulating InP (SI-IP) material.

On the top face of the contact layer 2, a p-electrode 1 is provided.

On the lower cladding layer 10 made of n-InP, an n-electrode 7 is provided.

In this light-receiving element, as shown in FIG. 42, a light incident facet 12 formed of the facets of the substrate 11 and lower cladding layer 10 is inclined by wet etching.

The inclination angle of the light incident facet 12 to the top face of the lower cladding layer 10 (bottom face of the light absorbing layer 4) is about 54 degrees owing to the directivity of crystal at the time of etching.

The principle of operation of the semiconductor light-receiving element of facet refractive type having such configuration is explained below.

The incident light is refracted by the inclined incident facet 12, absorbed by the light absorbing layer 4, and converted into current.

Specifically, in the case of this semiconductor light-receiving element of facet refractive type, depending on the difference in refractive index between air (refractive index=1) and the lower cladding layer 10 made of n-InP (refractive index of InP is 3.17, but its refractive index is lowered to about 3.15 by n$^+$ doping), the optical path of the light is changed obliquely upward, and passes obliquely above the light absorbing layer 4.

Thus, in the case of the semiconductor light-receiving element of facet refractive type, since the light passes the light absorbing layer 4 obliquely, the effective absorption length when passing the light absorbing layer 4 is longer, and the photo responsivity is enhanced.

Actually, however, the light passing obliquely above the light absorbing layer 4 further propagates obliquely above the upper cladding layer 3 and contact layer 2, and is reflected by the bottom face of the p-electrode 1, and the direction of optical path is changed obliquely downward.

The light of which optical path is changed obliquely downward passes again the contact layer 2 and upper cladding layer 3, and passes the light absorbing layer 4 obliquely downward.

Regrettably, however, in the contact layer 2 made of p$^+$-InGaAs, since the absorbed light is not converted into current, it merely results in light absorption loss.

Further, at the time of reflection at the bottom face of the p-electrode 1, light scatter loss occurs due to roughness of the bottom face of the p-electrode 1.

Thus, the semiconductor light-receiving element of facet refractive type is likely to cause loss, and its photo responsivity is thereby low at 0.6 A/W or less.

In order to solve the problems of photo responsivity, a semiconductor light-receiving element having a structure as shown in a cross sectional view in FIG. 43 is proposed (Jpn. Pat. Appln. KOKAI Publication No. 2001-53328).

That is, as shown in FIG. 43, in this semiconductor light-receiving element, an InGaAsP layer 14, an n-InGaAsP layer 13, a light absorbing layer 4 made of i-InGaAs, an upper cladding layer 3 made of p-InP, and a contact layer 2 made of p$^+$-InGaAs are sequentially formed on a substrate 11 made of a semi-insulating InP (SI-IP) material.

On the top face of the contact layer 2, a p-electrode 1 is provided.

On the n-InGaAsP layer 13, an n-electrode 7 is provided.

In this semiconductor light-receiving element, a light incident facet 12 formed of the facets of the InGaAsP layer 14 and n-InGaAsP layer 13 is inclined by wet etching.

The principle of operation of the semiconductor light-receiving element having such configuration is explained below while referring to FIG. 44.

Generally, the refractive index is decreased by n-doping, but for the sake of simplicity of explanation, herein, supposing the refractive index $n_{13}$ of the n-InGaAsP layer 13 and the refractive index $n_{14}$ of the InGaAsP layer 14 to be equal to each other ($n_{13}=n_{14}=3.439$), in FIG. 44, the n-InGaAsP layer 13 and InGaAsP layer 14 are represented by the InGaAsP layer 13.

In this semiconductor light-receiving element, all power of the light enters the InGaAsP layer 14 which is higher in the refractive index than the upper cladding layer 3.

As a result, the light is absorbed in the light absorbing layer 4 and propagates obliquely upward, and is totally reflected by the interface between the light absorbing layer 4 and the upper cladding 3.

As stated in claim 1 of Jpn. Pat. Appln. KOKAI Publication No. 2001-53328, "incident light entering from the lower semiconductor layer side passes the light absorbing layer obliquely in the film thickness direction, and is totally reflected by the interface of the first semiconductor layer at the light absorbing layer side, and passes the light absorbing layer again obliquely," and the detailed description of the invention specifies "100% of light passes again the light absorbing layer and is absorbed," and "the light passes the light-receiving layer two times and the effective light absorbing length is doubled."

Further, in all embodiments illustrated in Jpn. Pat. Appln. KOKAI Publication No. 2001-53328, the light is once totally reflected, and propagates obliquely downward, and passes through the light absorbing layer.

In this semiconductor light-receiving element, as shown in FIG. 44, the light is absorbed in the light absorbing layer 4, and propagates obliquely upward, and 100% of the light is reflected at the interface between the light absorbing layer 4 and the upper cladding layer 3, and propagates the light absorbing layer 4 obliquely downward.

Therefore, as understood from FIG. 44, supposing the thickness of the light absorbing layer 4 to be T and the light passing angle to be φ, the effective absorption length Le for light is determined in formula (3).

$$Le=2T/\cos\theta=2T/\cos(\pi/2-\phi) \qquad (3)$$

That is, for example, if the thickness T of the light absorbing layer 4 is 0.4 μm, and the light passing angle φ is 25.8 degrees, the effective absorption length Le of light in this semiconductor light-receiving element is only about 4.6 times of the thickness T of the light absorbing layer 4 (because 1/cos θ=1/cos (π/2−25.8 degrees)=2.3), and it is insufficient for the absorption length.

Also as estimated from explanatory drawings of all embodiments and FIG. 43 described in Jpn. Pat. Appln. KOKAI Publication No. 2001-53328, in this semiconductor light-receiving element, 100% of light is reflected at the interface between the light absorbing layer 4 and the upper cladding layer 3, and propagates and passes obliquely downward in the light absorbing layer 4.

Therefore, in this semiconductor light-receiving element, the photo responsivity is not improved if the light absorbing layer 4 is extended over a specific length.

Further in this semiconductor light-receiving element, as understood from the described embodiments, all power of the light must be entered within the layer of high refractive index such as InGaAsP layer 14.

The light spot size (the radius of power of $1/e^2$) is 2 μm to 5 μm, that is, the diameter of power of $1/e^2$ is as wide as 4 μm to 10 μm.

As mentioned in relation to the semiconductor light-receiving element of loaded optical waveguide type in FIGS. 38 and 39, on a thick grown crystal, it is hard to grow a light absorbing layer of small dark current and favorable crystallinity.

On a GaAs substrate shown in the embodiment of Jpn. Pat. Appln. KOKAI Publication No. 2001-53328, fabrication of a structure in which InGaAsP or InGaAs for 1.55 μm bandwidth is crystal-grown is practically impossible from the viewpoint of lattice mismatching.

Therefore, the semiconductor light-receiving element shown in FIG. 43 is extremely difficult to manufacture, in reality.

As explained herein, in the semiconductor light-receiving element of waveguide type shown in FIG. 36, there is a problem in reliability of high optical input.

In the semiconductor light-receiving element of loaded optical waveguide type shown in FIGS. 38 and 39, there is a problem in reliability of high optical input, high speed response, and crystallinity of the light absorbing layer (in other words, dark current characteristic).

In the semiconductor light-receiving element of facet refractive type shown in FIGS. 42 and 43, there is a problem in photo responsivity and crystallinity of the light absorbing layer.

BRIEF SUMMARY OF THE INVENTION

It is hence an object of the invention to provide a semiconductor light-receiving module capable of converting light into current efficiently at a light absorbing layer, and enhanced substantially in the photo responsivity, optical input resistance, high speed response, and dark current characteristic of a semiconductor light-receiving element, by adjusting the propagation path of light entering the light absorbing layer of the semiconductor light-receiving element by an incident light direction device.

In order to achieve the above object, according to a first aspect of the present invention, there is provided a semiconductor light-receiving module comprising:
a semiconductor light-receiving element (100); and
an incident light direction device (200),
wherein the semiconductor light-receiving element (100) comprises:
a substrate (6);
at least a light absorbing layer (4) and an upper cladding layer (3) formed sequentially on the substrate (6);
a light incident facet (12) formed on at least one facet of the substrate (6) and the light absorbing layer (4); and
electrodes (1, 7) which output an electric signal generated by absorption of the light entering from the light incident facet (12) in the light absorbing layer (4), and
wherein the incident light direction device (200) directs to irradiate the light obliquely to the light incident facet (12) of the semiconductor light-receiving element (100), and to cause at least one part of the light to irradiate the light absorbing layer (4) at the light incident facet (12).

In the semiconductor light-receiving module having such configuration, as shown in FIG. 1 of a corresponding first embodiment, the incident light direction device 200 orients the light to enter obliquely to the light incident facet 12 of the semiconductor light-receiving element 100, and at least part of the light to irradiate the light absorbing layer 4 at the light incident facet 12, and therefore the effective index of the incident light can be set higher than the refractive index of the upper cladding layer 3 of the semiconductor light-receiving element 100.

Therefore, the light propagating in the light absorbing layer 4 does not pass through the light absorbing layer 4, but causes a reflected light propagating the light absorbing layer 4 obliquely at the interface between the light absorbing layer 4 and the upper cladding layer 3, and it is free from absorption loss occurring at the time of passing through the light absorbing layer 4 or light scatter loss at the time of reflection on the bottom face of the electrode 1, so that an efficient current conversion is realized in the light absorbing layer 4.

In this semiconductor light-receiving module, since light is irradiated over a wide range at the bottom face of the light absorbing layer 4 obliquely from beneath the semiconductor light-receiving element 100 by the incident light direction device 200, unlike the semiconductor light-receiving element of optical waveguide type or the element of loaded optical waveguide type having a thin load optical waveguide, current is not concentrated in a specific portion of the light absorbing layer 4, so that breakdown of the semiconductor light-receiving element 100 due to Joule heat can be prevented.

Further, in this semiconductor light-receiving module, the portion of a large power of the light obliquely from beneath the semiconductor light-receiving element 100 can be directly irradiated to the light absorbing layer 4 by the incident light direction device 200, and part of the light is absorbed in the light absorbing layer 4 by propagation. Therefore, the photo responsivity of the semiconductor light-receiving element 100 is high, and hence a shorter light absorption length is enough, so that the bandwidth limited by the CR time constant can be widened.

Also in this semiconductor light-receiving module, since the thickness of the first semiconductor layer in the semiconductor light-receiving element 100 may be smaller than the diameter of the incident light, the load to the crystal growth is small at the time of manufacture of the semiconductor light-receiving element, and the manufacturing efficiency is favorable, so that a semiconductor light-receiving element having an excellent characteristic may be realized.

In order to achieve the above object, according to a second aspect of the present invention, there is provided a semiconductor light-receiving module according to the first aspect, wherein the incident light direction device (200) directs to irradiate the light obliquely to the light incident facet (12), and to cause at least part of the light to irradiate the light absorbing layer (4) at the light incident facet (12), such that an effective index of the light becomes higher than a refractive index of the upper cladding layer (3) of the semiconductor light-receiving element (100) and wherein the semiconductor light-receiving element (100) propagates, of the light entering the light absorbing layer (4), at least one of a component propagating parallel to the interface with the upper cladding layer (3) positioned above the light absorbing layer (4), and a component propagating in an oblique direction in the light absorbing layer (4) by reflecting at the interface above the light absorbing layer (4).

In order to achieve the above object, according to a third aspect of the present invention, there is a semiconductor light-receiving module according to the first aspect, wherein the upper cladding layer (3) of the semiconductor light-receiving element (100) is made of a p-type or n-type semiconductor material.

In order to achieve the above object, according to a fourth aspect of the present invention, there is a semiconductor light-receiving module according to the first aspect, wherein an angle formed between the light incident facet (12) and the bottom face of the light absorbing layer (4) of the semiconductor light-receiving element (100) is set at 90 degrees.

In order to achieve the above object, according to a fifth aspect of the present invention, there is a semiconductor light-receiving module according to the first aspect, wherein an angle formed between the light incident facet (12) and the bottom face of the light absorbing layer (4) of the semiconductor light-receiving element (100) is set at less than 90 degrees, and at an angle determined by a crystal azimuth of a material for composing the light incident facet (12).

In order to achieve the above object, according to a sixth aspect of the present invention, there is a semiconductor light-receiving module according to the first aspect, wherein an angle formed between the light incident facet (12) and the bottom face of the light absorbing layer (4) of the semiconductor light-receiving element (100) is set at less than 90 degrees, and at an angle larger than the angle determined by a crystal azimuth of a material for composing the light incident facet (12).

In order to achieve the above object, according to a seventh aspect of the present invention, there is a semiconductor light-receiving module comprising:

a semiconductor light-receiving element (100); and an incident light direction device (200), wherein the semiconductor light-receiving element (100) comprises:

a substrate (11);

a lower semiconductor layer (15) formed on the substrate (11), and having a function as an optical waveguide;

a light absorbing layer (4) formed on the lower semiconductor layer (15), and having a refractive index higher than that of the lower semiconductor layer;

an upper cladding layer (3) formed on the light absorbing layer (4), and having a refractive index lower than that of the lower semiconductor layer;

a light incident facet (12) formed on so as to include at least one facet of the substrate (11), the lower semiconductor layer (15) and the light absorbing layer (4); and electrodes (1,7) which output current generated by absorption of the light entering from the light incident facet (12) in the light absorbing layer (4), by way of the upper cladding layer (3) and the lower semiconductor layer, and wherein the incident light direction device (200) directs to irradiate the light at a predetermined angle from the light incident facet (12) of the semiconductor light-receiving element (100), and thereby a part of the light entering the light absorbing layer (4) of the semiconductor light-receiving element (100) can propagate in a parallel direction to the bottom face of the upper cladding layer in at least one of the light absorbing layer (4) and in the lower semiconductor layer, while another part of the light entering the light absorbing layer (4) is reflected at the bottom face of the upper cladding layer and can propagate in an oblique direction in the light absorbing layer (4) and the lower semiconductor layer.

In the semiconductor light-receiving module having such configuration, as shown in FIG. 12 of a corresponding seventh embodiment, the light absorbing layer 4 having a refractive index higher than the lower semiconductor layer 15 is sandwiched between the lower semiconductor layer 15 of the semiconductor light-receiving element 100 and the upper cladding layer 3 having a refractive index lower than the lower semiconductor layer 15.

By the incident light direction device 200, when the light enters the light incident facet 12 of the semiconductor light-receiving element 100 at a predetermined angle, this light propagates the light absorbing layer 4 obliquely, and is partly reflected by the bottom face of the upper cladding layer 3.

In the process of propagation of the reflected light in the light absorbing layer 4 and the lower semiconductor layer 15 in oblique direction, this reflected light is absorbed in the light absorbing layer 4.

Further, part of the light propagating obliquely the light absorbing layer 4 is not reflected by the bottom face of the upper cladding layer 3, that is, does not propagate oblique downward in the light absorbing layer 4 and lower semiconductor layer 15, but propagates in a parallel direction at the bottom face of the upper semiconductor layer 3 in the light absorbing layer 4 or lower semiconductor layer 15.

Therefore, this light is absorbed by effectively utilizing the overall length of the light absorbing layer 4, and converted into current, and by extending the length of the light absorbing layer as far as allowed by the bandwidth of the semiconductor light-receiving element 100, it is possible to enhance the photo responsivity as the semiconductor light-receiving element 100.

In this semiconductor light-receiving module, since light is irradiated over a wide range at the bottom face of the light absorbing layer 4 obliquely from beneath the semiconductor light-receiving element 100 by the incident light direction device 200.

Therefore, in this semiconductor light-receiving module, unlike the semiconductor light-receiving element of optical waveguide type or the semiconductor light-receiving element of loaded optical waveguide type having a thin load optical waveguide, current is not concentrated in a specific portion of the light absorbing layer 4 in the semiconductor light-receiving element 100, so that breakdown of the semiconductor light-receiving element 100 due to Joule heat can be prevented.

Further, in this semiconductor light-receiving module, the portion of a large power of the light entering the semiconductor light-receiving element 100 can be directly irradiated to the light absorbing layer 4 obliquely from beneath by the incident light direction device 200, and a part of the light is absorbed in the light absorbing layer 4 or lower semiconductor layer by propagation. Therefore, the photo responsivity of the semiconductor light-receiving element 100 is high as compared with that of the semiconductor light-receiving element of loaded optical wavelength type having a thick loaded optical path or semiconductor light-receiving element of facet refractive type, and hence a shorter light absorption length is enough, so that the bandwidth limited by the CR time constant can be widened.

Also in this semiconductor light-receiving module, since the thickness of the lower semiconductor layer in the semiconductor light-receiving element 100 may be smaller than the diameter of the incident light, the load to the crystal growth is small at the time of manufacture of the semiconductor light-receiving element, and the manufacturing efficiency is favorable, so that a semiconductor light-receiving element 100 having an excellent characteristic may be realized.

In order to achieve the above object, according to an eighth aspect of the present invention, there is provided a semiconductor light-receiving module according to the seventh aspect, wherein an angle formed between the light incident facet (12) and the bottom face of the light absorbing layer (4) of the semiconductor light-receiving element (100) is set at 90 degrees.

In order to achieve the above object, according to a ninth aspect of the present invention, there is provided a semiconductor light-receiving module according to the seventh aspect, wherein an angle formed between the light incident facet (12) and the bottom face of the light absorbing layer (4) of the semiconductor light-receiving element (100) is set at less than 90 degrees, and at an angle determined by a crystal azimuth of a material for composing the light incident facet (12).

In order to achieve the above object, according to a tenth aspect of the present invention, there is provided a semiconductor light-receiving module according to the seventh aspect, wherein an angle formed between the light incident facet (12) and the bottom face of the light absorbing layer (4) of the semiconductor light-receiving element (100) is set at less than 90 degrees, and at an angle larger than the angle determined by a crystal azimuth of a material for composing the light incident facet (12).

In order to achieve the above object, according to an eleventh aspect of the present invention, there is provided a semiconductor light-receiving module according to the seventh aspect, wherein the lower semiconductor layer of the semiconductor light-receiving element (100) is made of a semiconductor material of quaternary composition.

In order to achieve the above object, according to a twelfth aspect of the present invention, there is provided a semiconductor light-receiving module according to the seventh aspect, wherein the lower semiconductor layer (15) is composed of a combination of a high-refractive-index layer and a low-refractive-index layer such that an effective index of the lower semiconductor layer (15) becomes higher than a refractive index of the upper cladding layer (3), for the light entering the light incident facet (12) of the semiconductor light-receiving element (100).

In order to achieve the above object, according to a thirteenth aspect of the present invention, there is provided a semiconductor light-receiving module according to the seventh aspect, wherein the lower semiconductor layer (15) of the semiconductor light-receiving element (100) is made of an n-type semiconductor material, and the upper cladding layer (3) is made of a p-type semiconductor material.

In order to achieve the above object, according to a fourteenth aspect of the present invention, there is provided a semiconductor light-receiving module according to the seventh aspect, wherein the lower semiconductor layer (15) of the semiconductor light-receiving element (100) is made of a p-type semiconductor material, and the upper cladding layer (3) is made of an n-type semiconductor material.

In order to achieve the above object, according to a fifteenth aspect of the present invention, there is provided a semiconductor light-receiving module according to the seventh aspect, wherein the light entering the light incident facet is irradiated the light absorbing layer (4) through at least the lower semiconductor layer, by adjusting at least one of the incident position and incident angle of the light with respect to the light incident facet (12) of the semiconductor light-receiving element (100).

In order to achieve the above object, according to a sixteenth aspect of the present invention, there is provided a semiconductor light-receiving module comprising:

a semiconductor light-receiving element (100); and an incident light direction device (200), wherein the semiconductor light-receiving element comprises:

a substrate (11);

a lower semiconductor layer (15) formed on the substrate (11), and having a function as an optical waveguide;

a light absorbing layer (4) formed on the lower semiconductor layer (15), and having a refractive index higher than that of the lower semiconductor layer;

an upper cladding layer (3) formed on the light absorbing layer (4), and having a refractive index lower than that of the lower semiconductor layer;

a light incident facet (12) formed on so as to include at least one facet of the substrate (11), the lower semiconductor layer (15) and the light absorbing layer (4); and electrodes (1, 7) which output current generated by absorption of the light entering from the light incident facet (12) in the light absorbing layer (4), by way of the upper cladding layer (3) and the lower semiconductor layer (15), and wherein the incident light direction device (200) directs to irradiate the light at a predetermined angle from the light incident facet (12) of the semiconductor light-receiving element (100), and thereby the light entering the light absorbing layer (4) of the semiconductor light-receiving element (100) is allowed to enter the bottom face of the upper cladding layer at a critical angle and to be totally reflected at the bottom face of the upper cladding layer, is also allowed to propagate in at least one of the light absorbing layer (4) and the lower semiconductor layer in a parallel direction to the bottom face of the upper cladding layer.

In the semiconductor light-receiving module having such configuration, as shown in FIG. 24 of a corresponding fifteenth embodiment, by the incident light direction device 200, when the light enters the light incident facet 12 of the semiconductor light-receiving element 100 at a predetermined angle, this light propagates the light absorbing layer 4 of the semiconductor light-receiving element 100 obliquely, and enters the bottom face of the upper cladding layer 3 at a critical angle, and is totally reflected by the bottom face of the upper cladding layer 3.

The totally reflected light does not propagate obliquely downward in the light absorbing layer 4, but propagates in parallel direction at the bottom side of the upper cladding layer 3 in the light absorbing layer 4 or lower semiconductor layer 15, and in this process it is absorbed in the light absorbing layer 4.

Therefore, this light is absorbed by effectively utilizing the overall length of the light absorbing layer 4, and converted into current, and by extending the length of the light absorbing layer as far as allowed by the bandwidth as the semiconductor light-receiving element 100, it is possible to enhance the photo responsivity as the semiconductor light-receiving element 100.

Other advantages and functions of this semiconductor light-receiving module are same as the advantages and functions of the semiconductor light-receiving module of the seventh aspect mentioned above.

In order to achieve the above object, according to a seventeenth aspect of the present invention, there is provided a semiconductor light-receiving module according to the sixteenth aspect, wherein the angle formed between the light incident facet (12) and the bottom face of the light absorbing layer (4) of the semiconductor light-receiving element (100) is set at 90 degrees.

In order to achieve the above object, according to an eighteenth aspect of the present invention, there is provided a semiconductor light-receiving module according to the sixteenth aspect, wherein an angle formed between the light incident facet (12) and the bottom face of the light absorbing layer (4) of the semiconductor light-receiving element (100) is set at less than 90 degrees, and at an angle determined by a crystal azimuth of a material for composing the light incident facet (12).

In order to achieve the above object, according to a nineteenth aspect of the present invention, there is provided a semiconductor light-receiving module according to the sixteenth aspect, wherein an angle formed between the light incident facet (12) and the bottom face of the light absorbing layer (4) of the semiconductor light-receiving element (100) is set at less than 90 degrees, and at an angle larger than the angle determined by a crystal azimuth of a material for composing the light incident facet (12).

In order to achieve the above object, according to a twentieth aspect of the present invention, there is provided a semiconductor light-receiving module according to the sixteenth aspect, wherein the lower semiconductor layer of the semiconductor light-receiving element (100) is made of a semiconductor material of quaternary composition.

In order to achieve the above object, according to a twenty-first aspect of the present invention, there is provided a semiconductor light-receiving module according to the sixteenth aspect, wherein the lower semiconductor layer (15) is composed of a combination of a high-refractive-index layer and a low-refractive-index layer such that an effective index of the lower semiconductor layer (15) becomes higher than a refractive index of the upper cladding layer (3), for the light entering the light incident facet (12) of the semiconductor light-receiving element (100).

In order to achieve the above object, according to a twenty-second aspect of the present invention, there is provided a semiconductor light-receiving module according to the sixteenth aspect, wherein the lower semiconductor layer (15) of the semiconductor light-receiving element (100) is made of an n-type semiconductor material, and the upper cladding layer (3) is made of a p-type semiconductor material.

In order to achieve the above object, according to a twenty-third aspect of the present invention, there is provided a semiconductor light-receiving module according to the sixteenth aspect, wherein the lower semiconductor layer (15) of the semiconductor light-receiving element (100) is made of a p-type semiconductor material, and the upper cladding layer (3) is made of an n-type semiconductor material.

In order to achieve the above object, according to a twenty-fourth aspect of the present invention, there is provided a semiconductor light-receiving module according to the sixteenth aspect, wherein the light entering the light incident facet is irradiated the light absorbing layer (4) through at least the lower semiconductor layer, by adjusting at least one of the incident position and incident angle of the light with respect to the light incident facet (12) of the semiconductor light-receiving element (100).

In order to achieve the above object, according to a twenty-fifth aspect of the present invention, there is provided a semiconductor light-receiving module comprising:

a semiconductor light-receiving element (100) having at least a light incident facet (12), a light absorbing layer (4) and an upper cladding layer formed on the light absorbing layer; and an incident light direction device (200) which directs light to the light incident facet (12) of the semiconductor light-receiving element (100), wherein the incident light direction device (200) directs to irradiate the light obliquely to the light incident facet (12) of the semiconductor light-receiving element (100), such that an effective index of the light irradiated the light incident facet becomes higher than a refractive index of the upper cladding layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

DETAILED DESCRIPTION OF THE INVENTION

Figure 1:
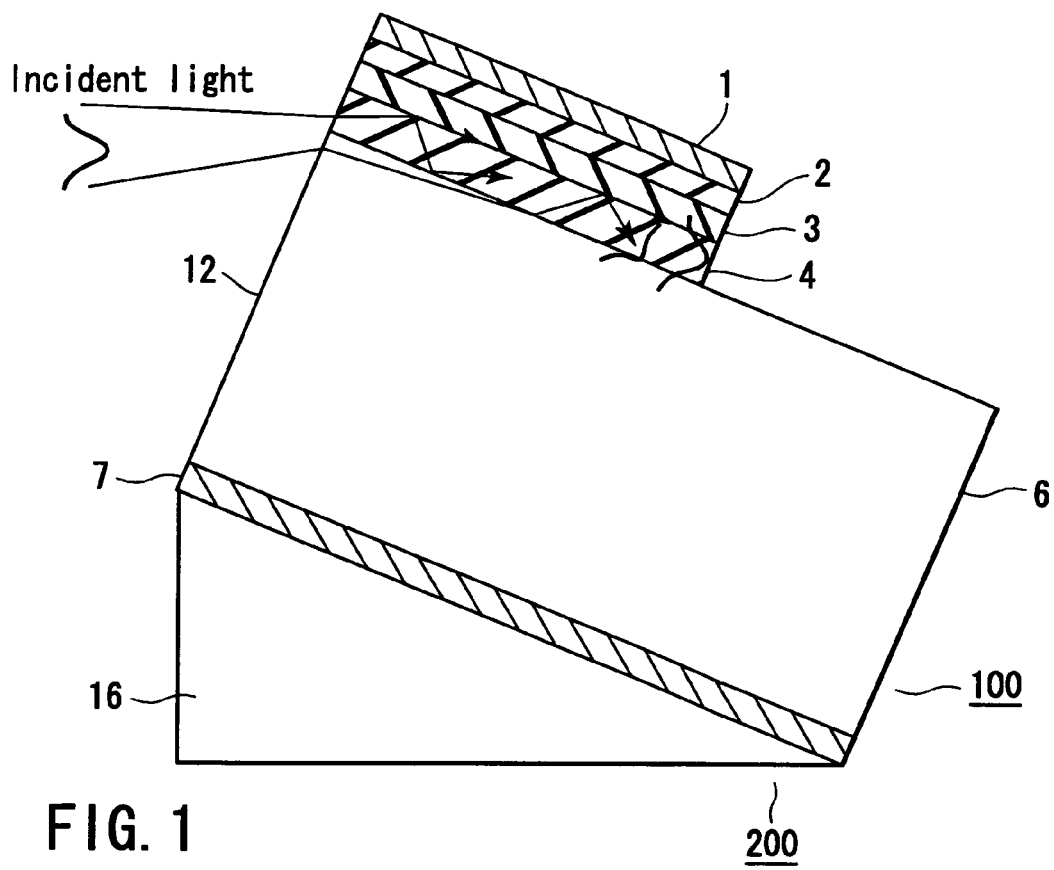
FIG. 1 is a cross sectional view showing a schematic configuration of a semiconductor light-receiving module according to a first embodiment of the invention.

Reference will now be made in detail to the presently preferred embodiments of the invention as illustrated in the accompanying drawings, in which like reference numerals designate like or corresponding parts.

Preferred embodiments of the invention are described below while referring to the accompanying drawings.

First Embodiment

FIG. 1 is a cross sectional view showing a schematic configuration of a semiconductor light-receiving module according to a first embodiment of the invention.

Figure 36:
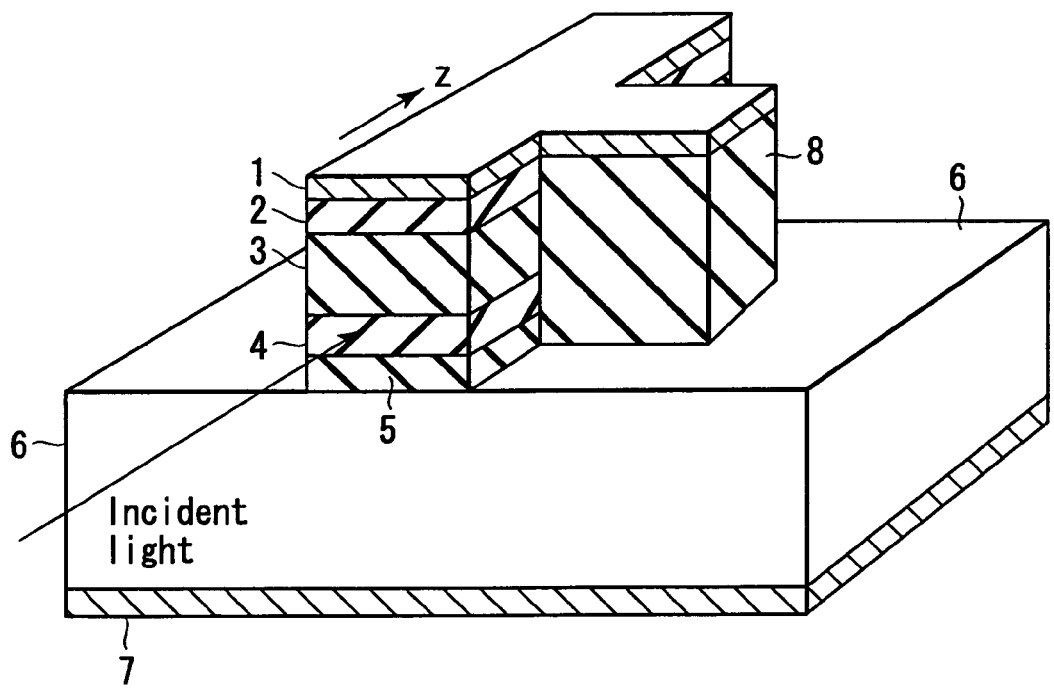
FIG. 36 is a perspective view showing a schematic configuration of a conventional semiconductor light-receiving element.
Figure 37:
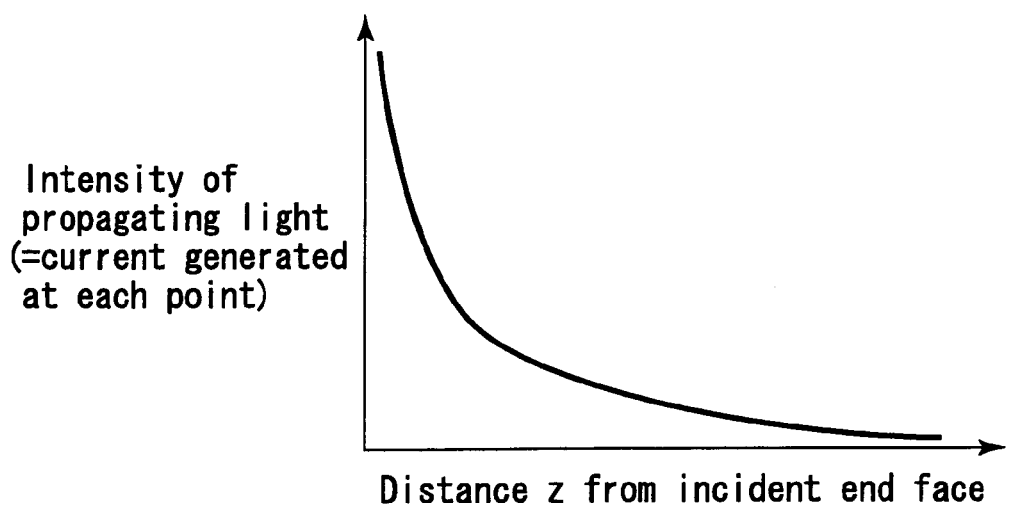
FIG. 37 is a diagram explaining problems of the semiconductor light-receiving element in FIG. 36.

In FIG. 1, same parts as in the conventional semiconductor light-receiving element shown in FIG. 36 are identified with same reference numerals, and detailed description of duplicate parts is omitted.

That is, as shown in FIG. 1, the semiconductor light-receiving module of the first embodiment comprises, as described specifically later, a semiconductor light-receiving element 100 having at least a light absorbing layer 4 and an upper cladding layer 3 sequentially formed on a substrate 6, for outputting an electrical signal generated by the light entering from a light incident facet 12 formed at least on one facet of the substrate 6 and the light absorbing layer 4 and being absorbed in the light absorbing layer 4 to outside from a p-electrode 1 and an n-electrode 7, and an incident light direction device 200 which directs the incident light obliquely to irradiate the light incident facet 12 of the semiconductor light-receiving element 100.

Herein, the semiconductor light-receiving element 100 is formed by sequentially laminating the light absorbing layer 4 made of i-InGaAs, the upper cladding layer 3 made of p-InP, and a contact layer 2 made of $p^+$-InGaAs, on the substrate 6 made of $n^+$-InP.

At the upper side of the contact layer 2, the p-electrode 1 is provided for taking out current.

At the lower side of the substrate 6, similarly, the n-electrode 7 is provided for taking out current.

This semiconductor light-receiving element 100 is inclined by a wedge-shaped pedestal 16 as part of the incident light direction device 200 for emitting the light obliquely to the light incident facet 12 disposed at the lower side of the substrate 6.

In the semiconductor light-receiving element 100, too, same as the conventional semiconductor light-receiving element shown in FIG. 36, a lower cladding layer 5 made of n-InP is usually formed beneath the light absorbing layer 4 in order to improve the crystallinity of the light absorbing layer 4, but it is omitted herein for the sake of simplicity of explanation.

Similarly, in the semiconductor light-receiving element 100, too, same as the conventional semiconductor light-receiving element shown in FIG. 36, polyimide 8 is formed, but it is omitted herein for the sake of simplicity of explanation.

In the semiconductor light-receiving element 100, the angle formed between the light incident facet 12 formed of at least at one facet of the substrate 6 and light absorbing layer 4 and the lower side of the light absorbing layer 4 is set at 90 degrees. Specifically, the light incident facet 12 of this semiconductor light-receiving element 100 is formed by cleavage.

The refractive index (about 3.6) of the light absorbing layer 4 made of i-InGaAs in the semiconductor light-receiving element 100 in the semiconductor light-receiving module in the first embodiment is higher than the refractive index (3.17) of the upper cladding layer 3 made of p-InP, or the refractive index of the substrate 6 made of n$^+$-InP (the refractive index of InP is 3.17, but actually its refractive index is lowered to about 3.15 due to n$^+$ doping, but for the sake of simplicity of explanation, herein, the refractive index of the substrate 6 is supposed to be 3.17).

Figure 3:
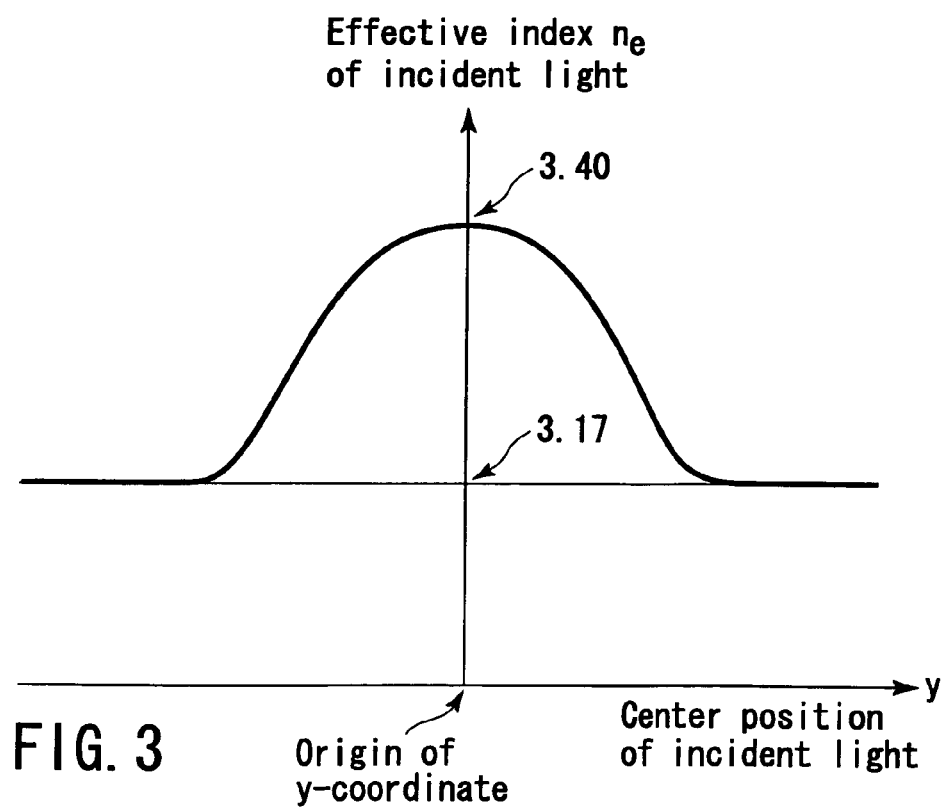
FIG. 3 is a diagram showing a photo responsivity characteristic of the semiconductor light-receiving element in FIG. 1.
Figure 2:
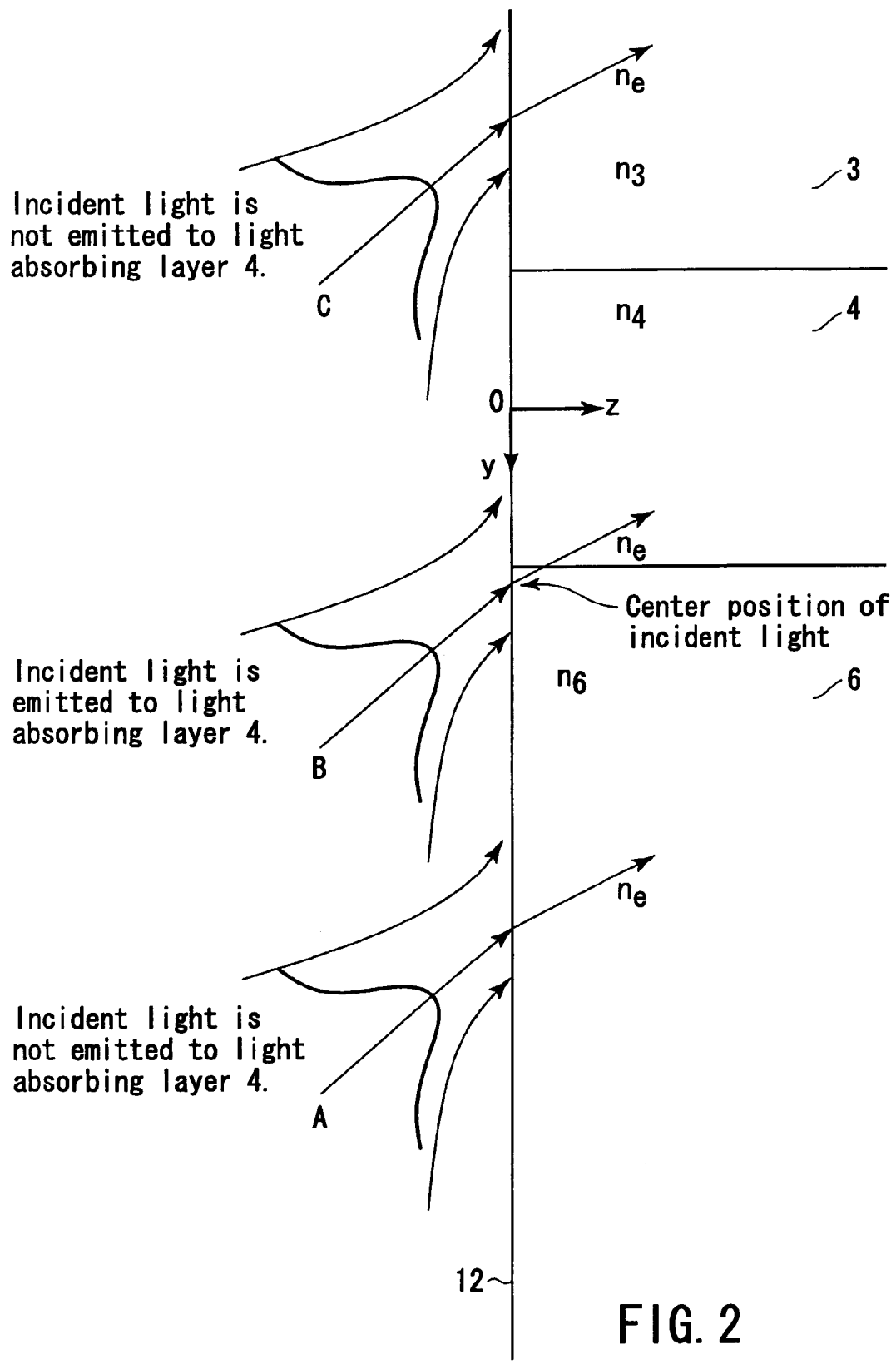
FIG. 2 is a diagram explaining an operation of a semiconductor light-receiving element in FIG. 1.
Figure 4:
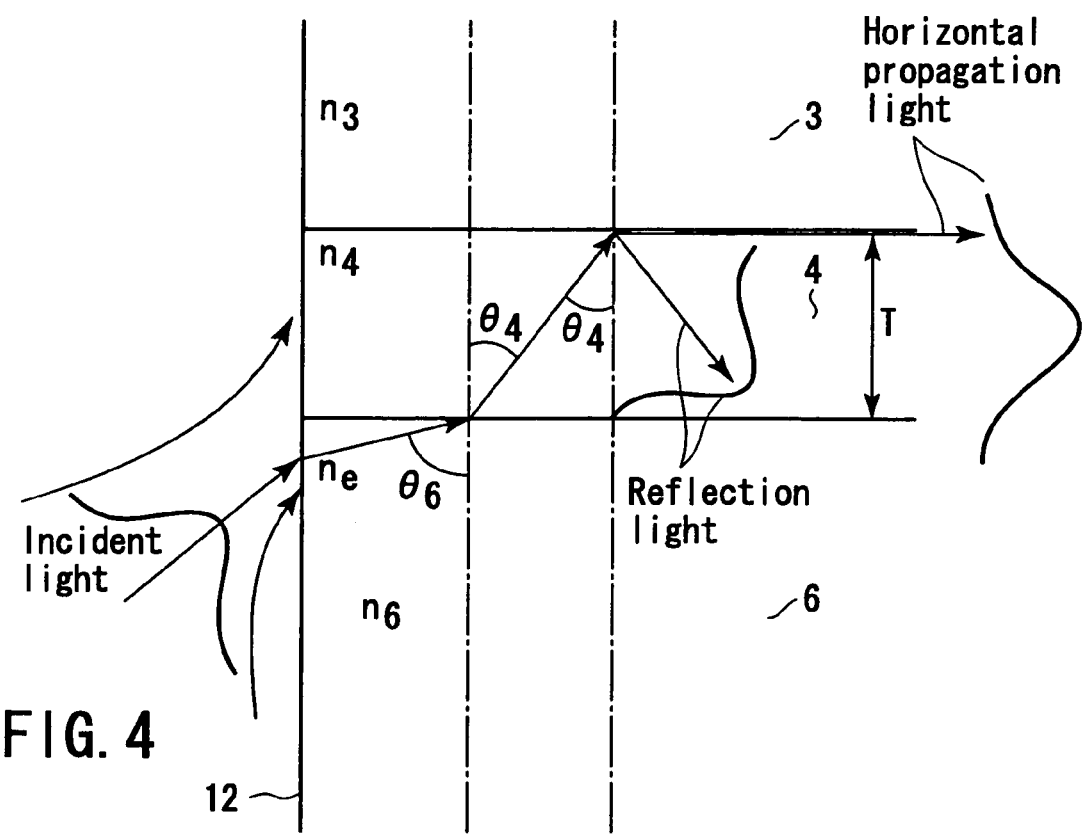
FIG. 4 is a diagram explaining other operation of the semiconductor light-receiving element in FIG. 1.

The principle of operation of the semiconductor light-receiving module of the first embodiment having such configuration is explained by referring to FIGS. 2, 3, and 4.

An actual incident light to the semiconductor light-receiving element 100 of this semiconductor light-receiving module is not linear but is wide and distributed.

FIG. 2 shows three incident states A, B, C of light into the light incident facet 12.

In the case of incident state A, the incident light enters only the substrate 6 of which refractive index is low at 3.17.

In the case of incident state B, the incident light enters not only the substrate 6 of which refractive index is low at 3.17 or the upper cladding layer 3 of refractive index of 3.17, but also enters the light absorbing layer 4 of which refractive index is high at about 3.6.

Meanwhile, if the light absorbing layer 4 is thick as compared with the spot size of the incident light, all power of the incident light may enter the light absorbing layer 4 only.

In the case of incident state C, the incident light enters only the upper cladding layer 3 of which refractive index is low at 3.17.

FIG. 3 shows the result of calculation of the effective index $n_e$ of incident light by varying the position of the center of the incident light.

Herein, the thickness of the light absorbing layer 4 is 1 µm, and the spot size of the incident light is 2 µm.

As clear from FIG. 3, when the incident light is not irradiated to the light absorbing layer 4 as in incident state A and incident state C in FIG. 2, the effective index $n_e$ of the incident light is 3.17, which is same as the refractive index of the upper cladding layer 3 (considering effects of decrease of the refractive index due to n doping in the substrate 6 made of n$^+$-InP, the effective index $n_e$ of the incident light is lower than the refractive index of the upper cladding layer 3).

However, in incident state B, that is, when at least part of the incident light enters the light absorbing layer 4 of high refractive index, the effective index $n_e$ of the incident light is higher than the refractive index of the substrate 6 or upper cladding layer 3.

Incidentally, if the center of the incident light coincides with the center of the light absorbing layer 4, the effective index $n_e$ of the incident light is about 3.4.

That is, as shown in FIG. 4, when at least one part of the incident light enters the light absorbing layer 4 and its high refractive index is felt, the effective index $n_e$ of the incident light can be set higher than the refractive index 3.17 of the upper cladding layer 3.

In FIG. 4, Snell's law established at the interface between the substrate 6 and the light absorbing layer 4 is as follows:

$$n_e \sin \theta_6 = n_4 \sin \theta_4 \qquad (4)$$

At the interface between the light absorbing layer 4 and the p-InP cladding layer 3, it is as follows:

$$n_4 \sin \theta_4 = n_3 \qquad (5)$$

That is, putting formula (5) into formula (4), when the formula $$n_e \sin \theta_6 = n_3 \qquad (6)$$

is established, total reflection occurs at the interface (the incident angle $\theta_4$ of the light to the upper cladding layer 3 at this time is called the critical angle).

Accordingly, considering the refractive index of the light absorbing layer 4 and substrate 6, it is important to have a feeling of high refractive index of the light absorbing layer 4 in the incident light such that the effective index $n_e$ of the incident light is higher than the refractive index $n_3$ of the upper cladding layer 3, and also to select properly the incident angle of the light to the light incident facet 12.

Thus, in the semiconductor light-receiving module of the invention, an incident light direction device 200 is provided for emitting the incident light obliquely to the light incident facet 12 of the semiconductor light-receiving element 100.

As compared with the upper cladding layer 3 or substrate 6, the light absorbing layer 4 has a higher refractive index, and has a function of an optical waveguide for guiding the light, and hence by setting $\theta_4$ at the critical angle for inducing total reflection, it is possible to cause horizontal propagation light (waveguide light) propagating in the horizontal direction.

Alternatively, by setting $\theta_4$ at higher than the critical angle for inducing total reflection, it causes reflection light propagating obliquely in the light absorbing layer 4 at the interface between the light absorbing layer 4 and the upper cladding layer 3, but actually, aside from the reflection light, horizontal propagation light propagating in the horizontal direction can be generated.

That is, according to the embodiment, the incident light direction device 200 operates, in a simple structure, to set the effective index $n_e$ of the incident light higher than the refractive index $n_3$ of the upper cladding layer 3 of the semiconductor light-receiving element 100, to cause the incident light to feel a high refractive index of the light absorbing layer 4 of the semiconductor light-receiving element 100, and to light to the light absorbing layer 4 from an oblique direction. Therefore, the light propagating in the light absorbing layer 4 does penetrate through the light absorbing layer 4, but reflection light is generated to propagate the light absorbing layer 4 obliquely at the interface between the light absorbing layer 4 and the upper cladding layer 3.

Accordingly, it is free from absorption loss in the contact layer 2 made of $p^+$-InGaAs or light scatter loss at the time of reflection on the bottom face of the p-electrode 1, so that an efficient current conversion is realized in the light absorbing layer 4.

Further, in this embodiment, in addition to the reflection light, a horizontal propagation light propagating in the horizontal direction can be also generated.

In this way, the light propagating in the light absorbing layer 4 is more efficiently absorbed in the light absorbing layer 4, and is converted into an electrical current.

Figure 5:
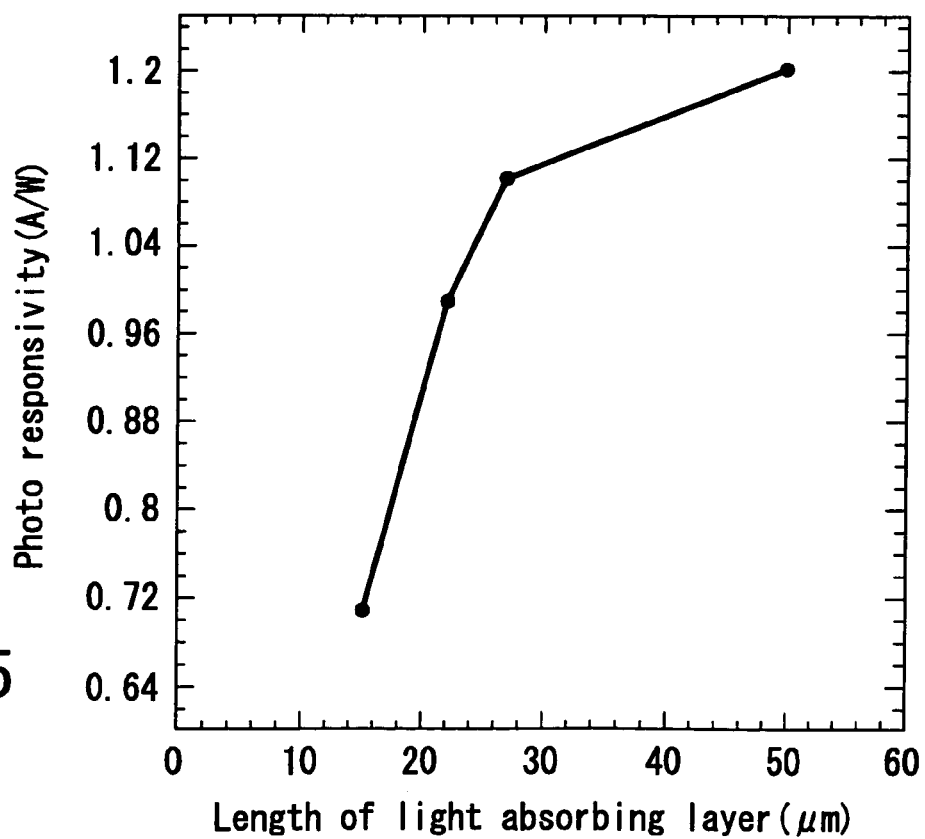
FIG. 5 is a diagram showing results of measurement of characteristics of four semiconductor light-receiving elements manufactured as trial products for semiconductor light-receiving elements to be used in the semiconductor light-receiving module of the first embodiment.

FIG. 5 shows results of measurement of characteristics of four semiconductor light-receiving elements manufactured as trial products for semiconductor light-receiving elements to be used in the semiconductor light-receiving module of the first embodiment.

In FIG. 5, the axis of ordinates denotes the photo responsivity (A/W) of the trial product for the semiconductor light-receiving element, and the axis of abscissas represents the length of the light absorbing layer 4 of the trial product for the semiconductor light-receiving element.

As clear from FIG. 5, the photo responsivity is improved even in the semiconductor light-receiving element of which length of light absorbing layer 4 is 30 μm or more.

In the four trial products for the semiconductor light-receiving element, the thickness T of each light absorbing layer 4 is 1.0 μm, the thickness D of the n-InGaAsP optical waveguide layer 15 is 2.0 μm, and the incident angle of the light from the horizontal direction is 40 degrees.

In this case, the effective index $n_e$ of the incident light is 3.3.

Figure 6:
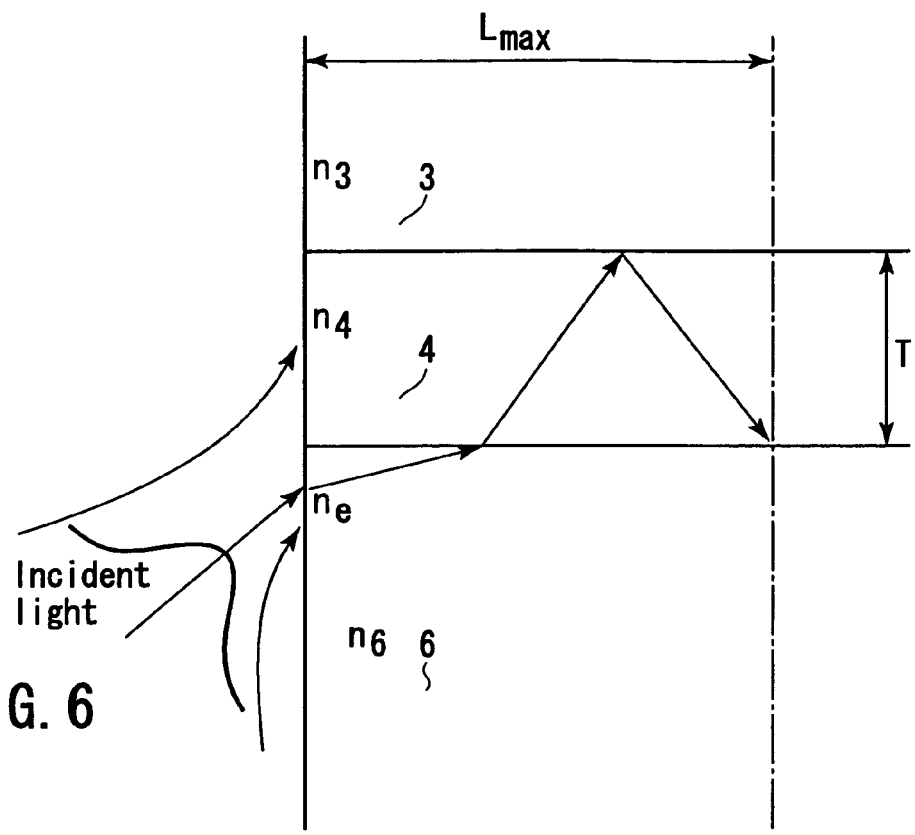
FIG. 6 is a diagram assuming that the light once entering from near the lower end of a light absorbing layer is reflected once at the interface between the light absorbing layer and an upper cladding layer, and passes through the light absorbing layer, in the semiconductor light-receiving element in FIG. 1.

As shown in FIG. 6, supposing the light entering from near the lower end of the light absorbing layer 4, being once reflected at the interface between the light absorbing layer 4 and the upper cladding layer 3, and passing through the light absorbing layer 4, the length Lmax of the light absorbing layer 4 is sufficiently shorter than 20 μm.

However, as mentioned above, even in the semiconductor light-receiving element of which length of the light absorbing layer 4 is more than 30 μm, the photo responsivity is improved.

It is considered because, aside from the component of the light reflected at the interface between the light absorbing layer 4 and the upper cladding layer 3, there is a portion of light propagating in the length direction of the light absorbing layer 4 and it is absorbed in the light absorbing layer 4.

Figure 43:
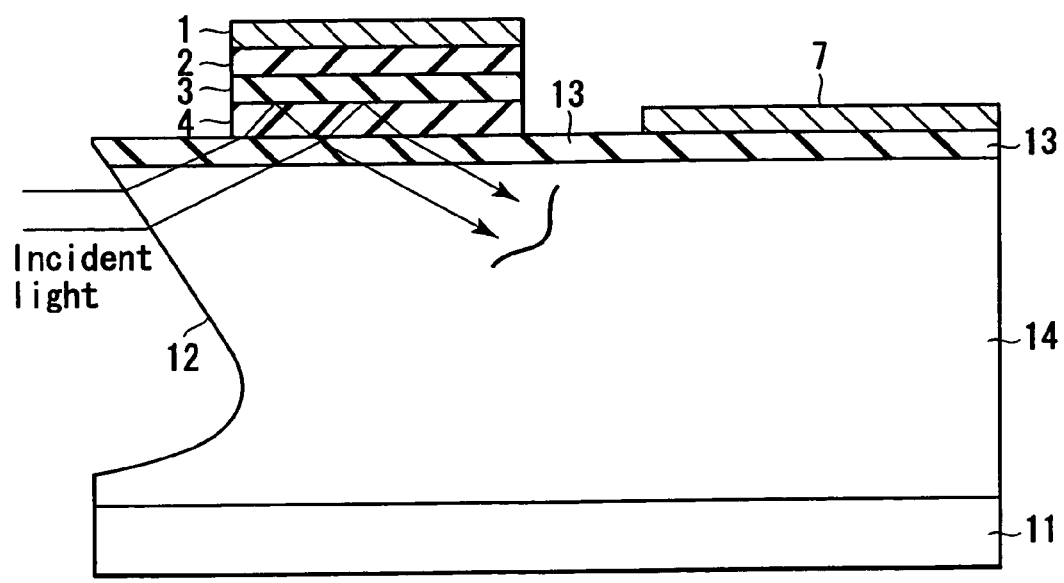
FIG. 43 is a cross sectional view showing a schematic configuration of a further different conventional semiconductor light-receiving element.
Figure 44:
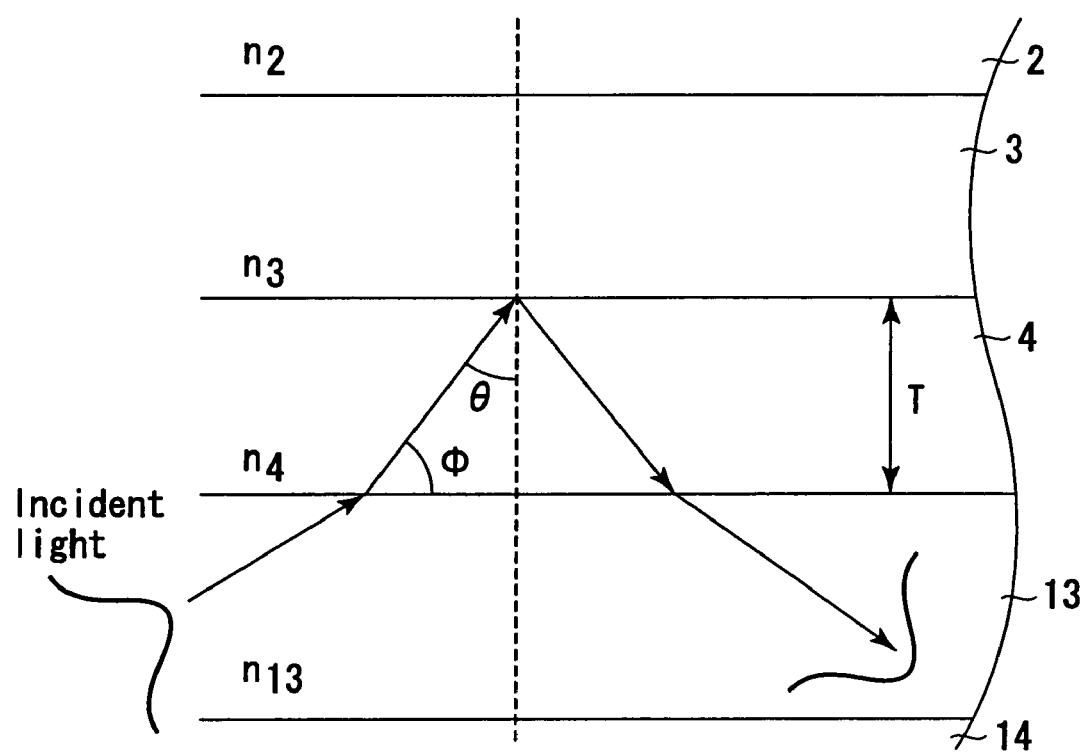
FIG. 44 is a diagram explaining an operation of the semiconductor light-receiving element in FIG. 43.

Thus, in the semiconductor light-receiving element 100 to be used in the semiconductor light-receiving module according to the first embodiment, unlike the conventional semiconductor light-receiving element shown in FIG. 43, by extending the length of the light absorbing layer 4 as far as permitted by the bandwidth as the semiconductor light-receiving element 100, the photo responsivity as the semiconductor light-receiving element can be enhanced.

Figure 38:
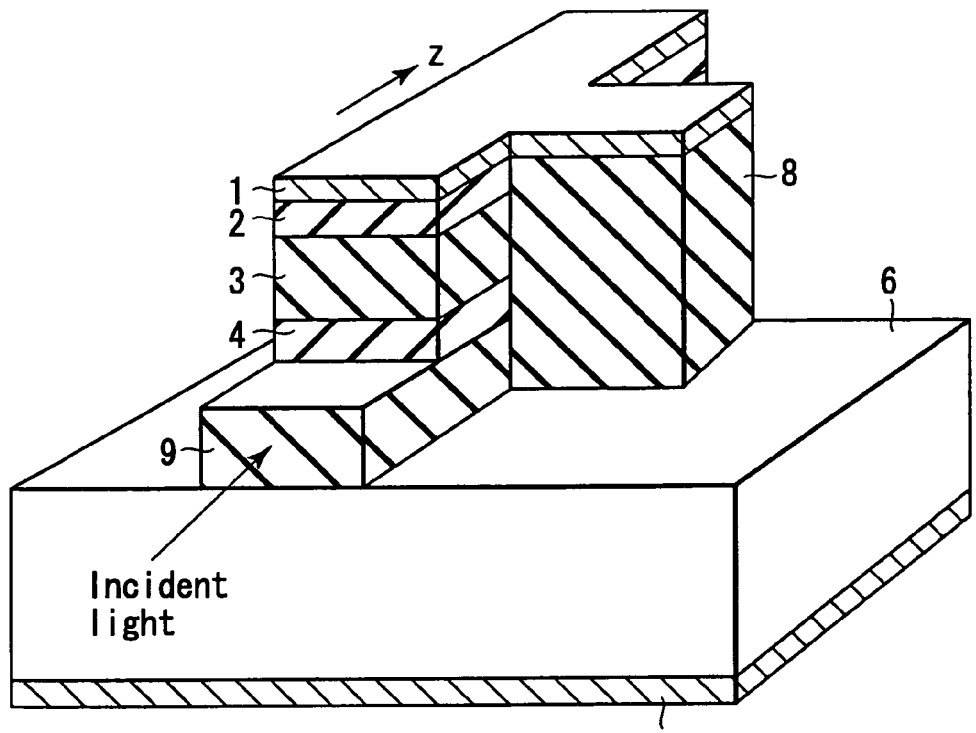
FIG. 38 is a perspective view showing a schematic configuration of another conventional semiconductor light-receiving element.
Figure 39:
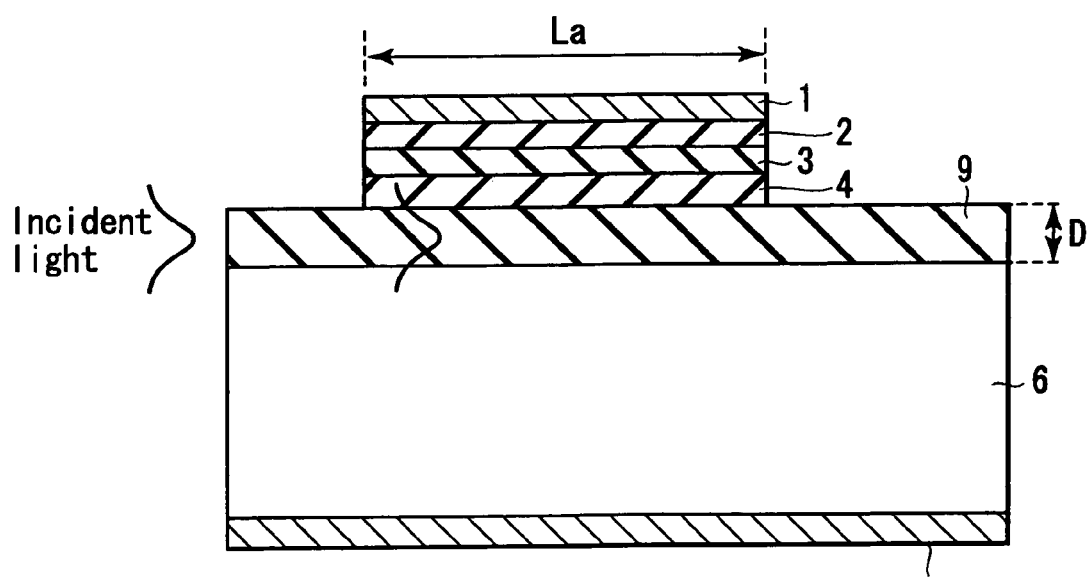
FIG. 39 is a cross sectional view showing a schematic configuration of the semiconductor light-receiving element in FIG. 38.

In this semiconductor light-receiving module, moreover, since the light is irradiated over a wide range beneath the light absorbing layer 4 obliquely from beneath the semiconductor light-receiving element 100 by the incident light direction device 200, unlike the conventional semiconductor light-receiving element of optical waveguide type shown in FIG. 36 or the conventional loaded optical waveguide type element having the thin loaded optical waveguide 9 shown in FIG. 38, current is not concentrated in a specific portion of the light absorbing layer 4 of the semiconductor light-receiving element 100.

As a result, in this semiconductor light-receiving module, breakdown of the semiconductor light-receiving element 100 due to Joule heat can be prevented.

Also in the semiconductor light-receiving module of the first embodiment, by the incident light direction device 200, a portion of large power of the light can be directly irradiated to the light absorbing layer 4 obliquely from beneath the semiconductor light-receiving element 100 and also part of the light can be propagated and absorbed in the light absorbing layer 4. Therefore, as compared with the conventional loaded optical waveguide type semiconductor light-receiving element having a thick loaded optical path shown in FIG. 40B or the conventional semiconductor light-receiving element of facet refractive type shown in FIG. 42 or FIG. 43, the photo responsivity is higher and hence the required light absorption length is shorter, so that the bandwidth limited by the CR time constant can be widened.

In the semiconductor light-receiving element 100 to be used in this semiconductor light-receiving module, the high refractive index of the light absorbing layer 4 for absorbing light is effectively utilized, and the effective index of the incident light is enhanced in a simple structure. Therefore, the conventional loaded optical waveguide 9 shown in FIG. 38 is not needed, the load to the crystal growth is small, and the manufacturing efficiency of the semiconductor light-receiving element is very high.

The same features are available also in the semiconductor light-receiving elements to be used in the semiconductor light-receiving modules according to second to sixth embodiments below.

In the semiconductor light-receiving element 100 to be used in the semiconductor light-receiving module in the first embodiment, furthermore, as shown in FIG. 1, the light reflected obliquely downward at the interface between the upper cladding layer 3 and the light absorbing layer 4 is reflected again obliquely upward at the interface between the optical waveguide layer 15 of high refractive index and the substrate 11 of low refractive index, and is absorbed again in the light absorbing layer 4 repeatedly, which contributes to enhancement of photo responsivity of the semiconductor light-receiving element 100.

Such features are also available in the semiconductor light-receiving elements 100 to be used in the semiconductor light-receiving modules in the second to sixth embodiments.

Second Embodiment

Figure 7:
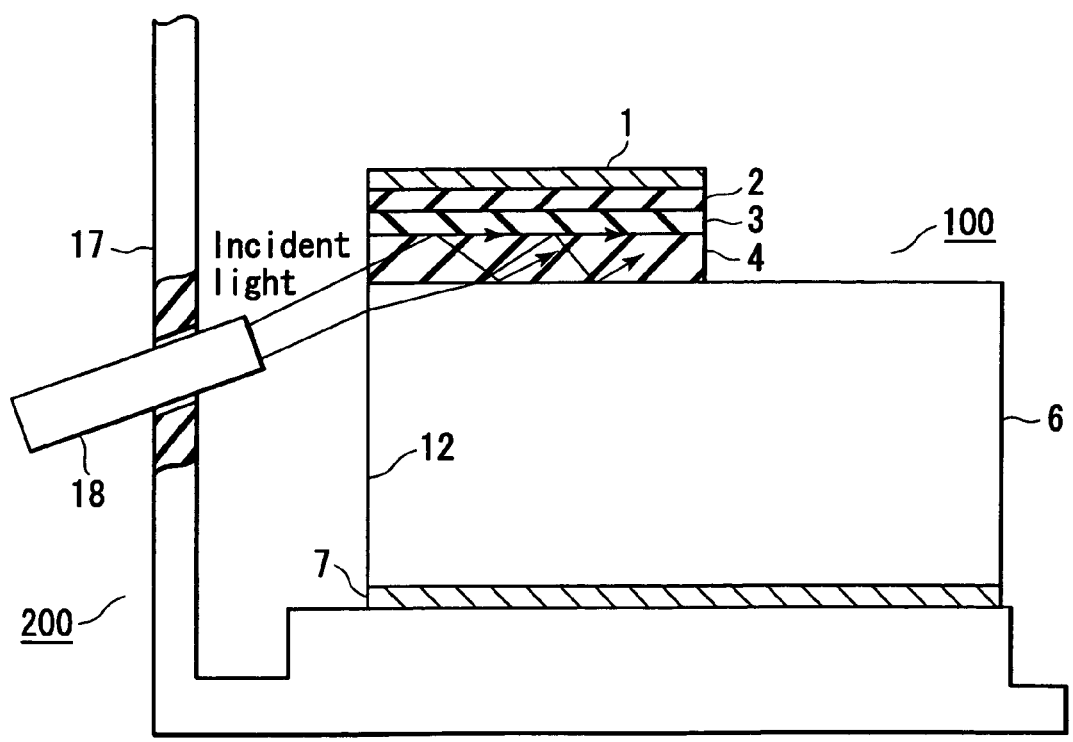
FIG. 7 is a cross sectional view showing a schematic configuration of a semiconductor light-receiving module according to a second embodiment of the invention.

FIG. 7 is a cross sectional view showing a schematic configuration of a semiconductor light-receiving module according to a second embodiment of the invention.

In FIG. 7, same parts as in the semiconductor light-receiving module in the first embodiment shown in FIG. 1 are identified with same reference numerals, and detailed description of duplicate parts is omitted.

In the semiconductor light-receiving module of the second embodiment, instead of a pedestal 16 as one part of the incident light direction device 200 of the first embodiment shown in FIG. 1, a casing 17 is provided for holding the semiconductor light-receiving element 100 horizontally as the incident light direction device 200, and from an optical fiber 18 as the incident light direction device 200 inclined and supported on this casing 17, the light is inclined and irradiated to a light incident facet 12 composed at least at one facet of the substrate 6 and light absorbing layer 4.

In the semiconductor light-receiving module having such configuration, the light entering the light incident facet 12 of the semiconductor light-receiving element 100 from the optical fiber 18 as the incident light direction device 200 is refracted by this light incident facet 12, and enters the light absorbing layer 4 obliquely from beneath, and is absorbed in this light absorbing layer 4.

In the semiconductor light-receiving module of the second embodiment, too, at least one part of the incident light is absorbed in the light absorbing layer 4 of the semiconductor photo detector 100 by the incident light direction device 200, such that the effective index $n_e$ of the incident light becomes higher than the refractive index $n_3$ of the upper cladding layer 3 on the absorbing layer 4, the light is reflected at the interface between the upper cladding layer 3 and the light absorbing layer 4, or part or whole of the incident light is horizontally propagated in the light absorbing layer 4.

Therefore, in the semiconductor light-receiving module of the embodiment, since reflection of light and propagation of light in the horizontal direction are utilized, the effective absorption length of the semiconductor light-receiving element 100 is extended, and the responsivity can be notably improved as the semiconductor light-receiving element.

Third Embodiment

Figure 8:
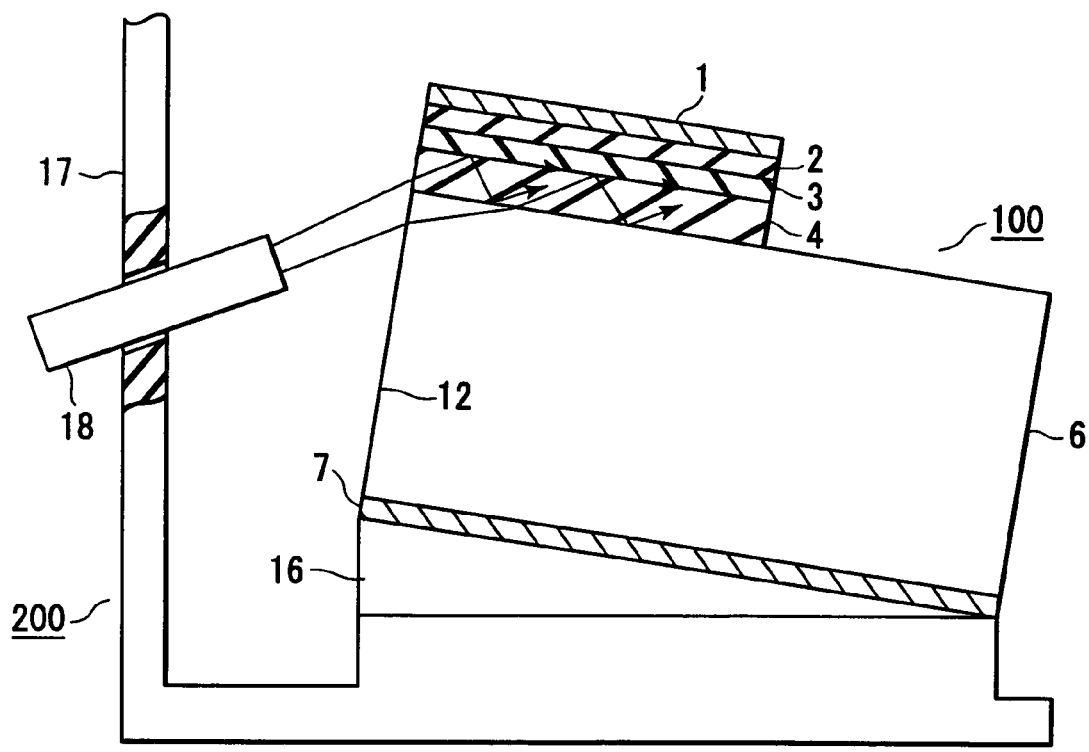
FIG. 8 is a cross sectional view showing a schematic configuration of a semiconductor light-receiving module according to a third embodiment of the invention.

FIG. 8 is a cross sectional view showing a schematic configuration of a semiconductor light-receiving module according to a third embodiment of the invention.

In FIG. 8, same parts as in the semiconductor light-receiving module in the second embodiment shown in FIG. 7 are identified with same reference numerals, and detailed description of duplicate parts is omitted.

In the semiconductor light-receiving module of the third embodiment, a wedge-shaped pedestal 16 is interposed between the casing 17 as the incident light direction device 200 and the substrate 6 in the semiconductor light-receiving module of the second embodiment shown in FIG. 7, and the light incident facet 12 of the semiconductor light-receiving element 100 is inclined.

By thus inclining the light incident facet 12 of the semiconductor light-receiving element 100 by the pedestal 16 as part of the incident light direction device 200, the angle formed by the incident light issued from the optical fiber 18 as the incident light direction device 200 and the light incident facet 12 of the semiconductor light-receiving element 100 becomes smaller, so that this angle may be easily set to a desired angle.

In the semiconductor light-receiving module of the third embodiment, too, by emitting at least part of the incident light to the light absorbing layer 4 of the semiconductor light-receiving element 100 by the incident light direction device 200, and setting the effective index $n_e$ of the incident light higher than the refractive index $n_3$ of the upper cladding layer 3 on the light absorbing layer 4, the light is reflected at the interface between the upper cladding layer 3 and the light absorbing layer 4, or part or whole of the incident light is horizontally propagated in the light absorbing layer 4.

Therefore, in the semiconductor light-receiving element to be used in the semiconductor light-receiving module of the embodiment, too, since reflection of light and propagation of light in the horizontal direction are utilized, the effective absorption length of the semiconductor light-receiving element 100 is longer, so that the responsivity can be enhanced substantially as the semiconductor light-receiving element.

Fourth Embodiment

Figure 9:
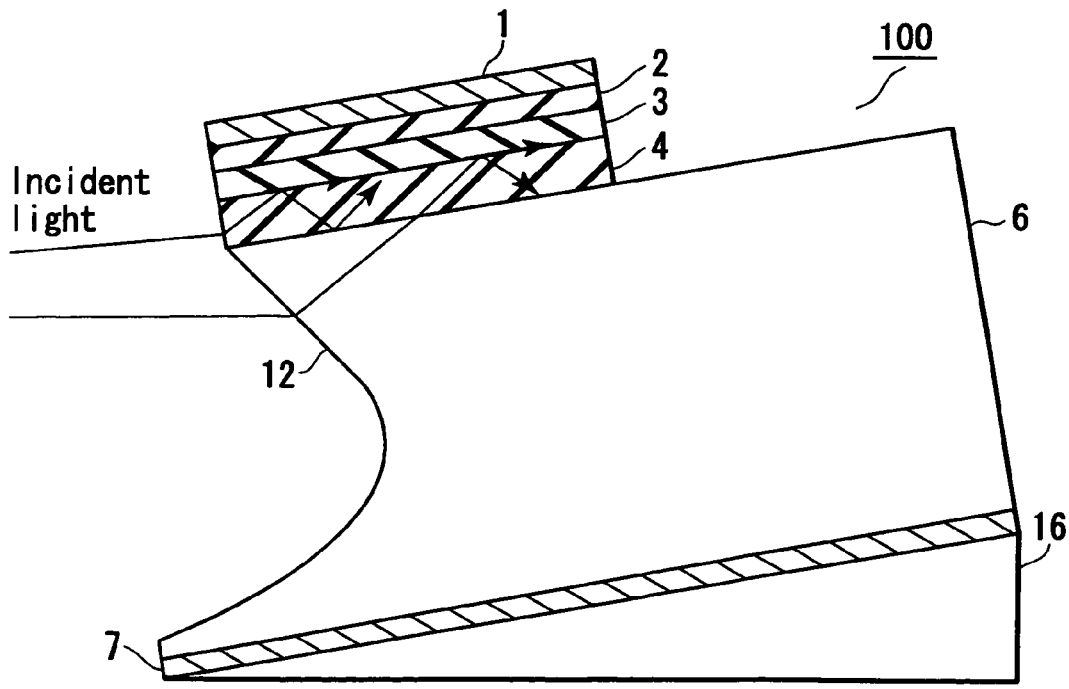
FIG. 9 is a cross sectional view showing a schematic configuration of a semiconductor light-receiving module according to a fourth embodiment of the invention.

FIG. 9 is a cross sectional view showing a schematic configuration of a semiconductor light-receiving module according to a fourth embodiment of the invention.

In FIG. 9, same parts as in the semiconductor light-receiving module in the first embodiment shown in FIG. 1 are identified with same reference numerals, and detailed description of duplicate parts is omitted.

Figure 42:
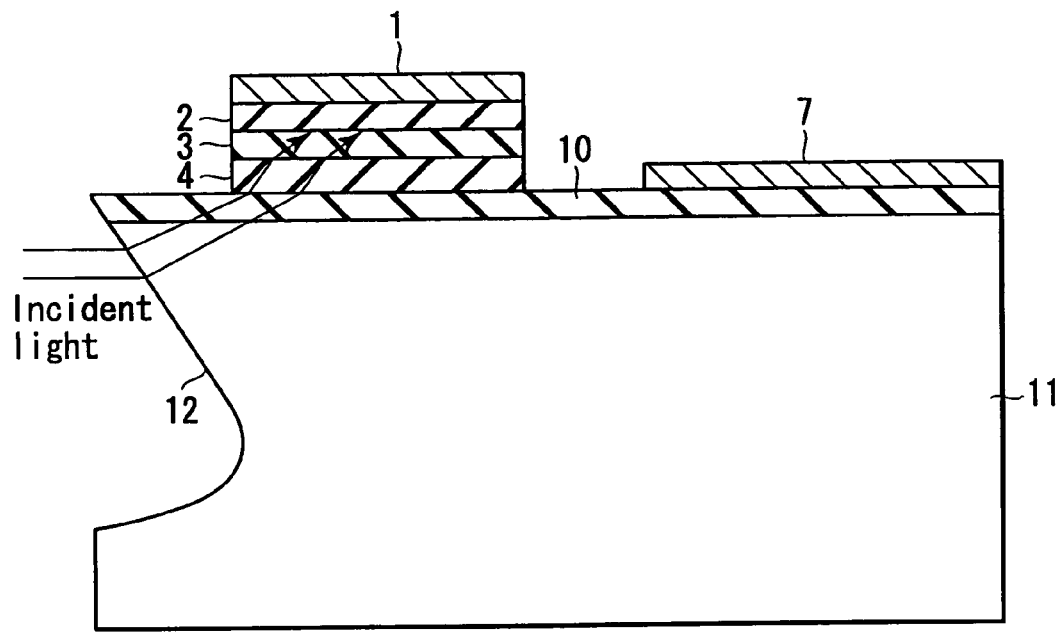
FIG. 42 is a cross sectional view showing a schematic configuration of a different conventional semiconductor light-receiving element.

In the semiconductor light-receiving module of the fourth embodiment, the light incident facet 12 including at least one facet of the substrate 6 and light absorbing layer 4 of the semiconductor light-receiving element 100 is formed by wet etching process same as in the conventional semiconductor light-receiving element shown in FIG. 42 or 43.

Therefore, the angle formed between the light incident facet 12 of the semiconductor light-receiving element 100 and the bottom face of the light absorbing layer 4 is about 54 degrees as determined by the crystal azimuth.

Further, in order to realize a small incident angle to the light absorbing layer 4 of the semiconductor light-receiving element 100, the entire structure of the semiconductor light-receiving element 100 is inclined by using the pedestal 16 as the incident light direction device 200.

In the semiconductor light-receiving module of the fourth embodiment, too, by emitting at least part of the incident light to the light absorbing layer 4 of the semiconductor light-receiving element 100 by the incident light direction device 200, and setting the effective index $n_e$ of the incident light higher than the refractive index $n_3$ of the upper cladding layer 3 on the light absorbing layer 4, the light is reflected at the interface between the upper cladding layer 3 and the light absorbing layer 4, or part or whole of the incident light is horizontally propagated in the light absorbing layer 4.

Therefore, in the semiconductor light-receiving module of the embodiment, too, since reflection of light and propagation of light in the horizontal direction are utilized, the effective absorption length of the semiconductor light-receiving element 100 is longer, so that the responsivity can be enhanced substantially as the semiconductor light-receiving element.

Fifth Embodiment

Figure 10:
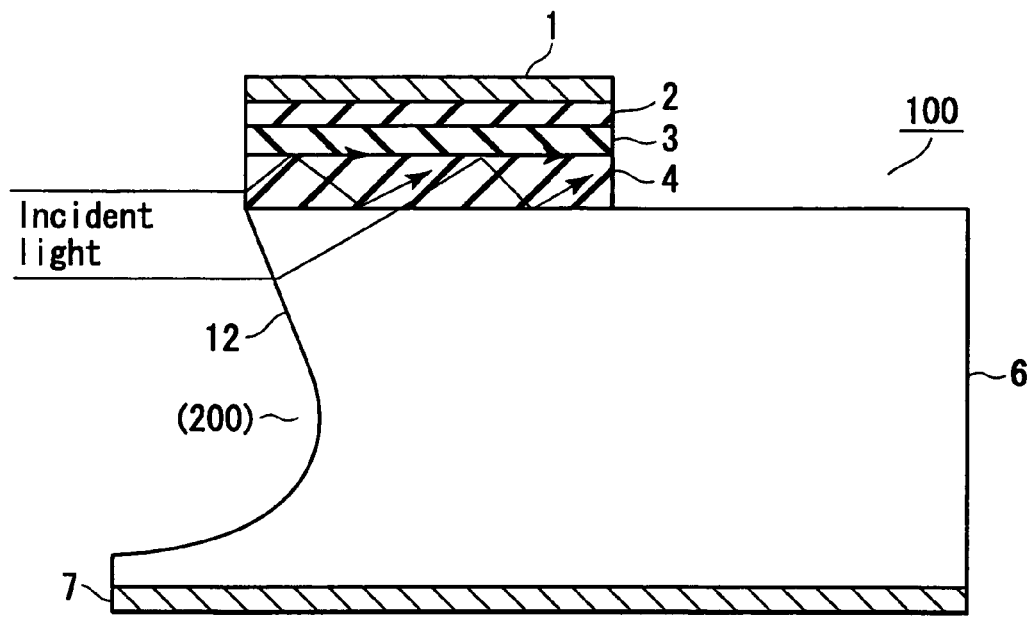
FIG. 10 is a cross sectional view showing a schematic configuration of a semiconductor light-receiving module according to a fifth embodiment of the invention.

FIG. 10 is a cross sectional view showing a schematic configuration of a semiconductor light-receiving module according to a fifth embodiment of the invention.

In FIG. 10, same parts as in the semiconductor light-receiving module in the first embodiment shown in FIG. 1 are identified with same reference numerals, and detailed description of duplicate parts is omitted.

In the semiconductor light-receiving element 100 to be used in the semiconductor light-receiving module of the fifth embodiment, the light incident facet 12 including at least one facet of the substrate 6 and light absorbing layer 4 is formed by wet etching process same as in the semiconductor light-receiving element to be used in the semiconductor light-receiving module of the fourth embodiment shown in FIG. 9.

In the fifth embodiment, however, the time of wet etching is set shorter.

Therefore, the angle formed between the light incident facet 12 of the semiconductor light-receiving element 100 and the bottom face of the light absorbing layer 4 is less than 90 degrees and larger than about 54 degrees determined by the crystal azimuth.

In this case, meanwhile, an angle larger than 90 degrees can be realized by selecting the crystal azimuth.

As a result, the pedestal 16 as one part of the incident light direction device 200 required in the fourth embodiment in FIG. 9 is no longer needed, and mounting is easier.

In the semiconductor light-receiving module of the fifth embodiment, too, by emitting at least part of the incident light to the light absorbing layer 4 of the semiconductor light-receiving element 100 by the incident light direction device 200, and setting the effective index $n_e$ of the incident light higher than the refractive index $n_3$ of the upper cladding layer 3 on the light absorbing layer 4, the light is reflected at the interface between the upper cladding layer 3 and the light absorbing layer 4, or part or whole of the incident light is horizontally propagated in the light absorbing layer 4.

Therefore, in the semiconductor light-receiving module of the embodiment, too, since reflection of light and propagation of light in the horizontal direction are utilized, the effective absorption length of the semiconductor light-receiving element 100 is longer, so that the responsivity can be enhanced substantially as the semiconductor light-receiving element.

Sixth Embodiment

Figure 11:
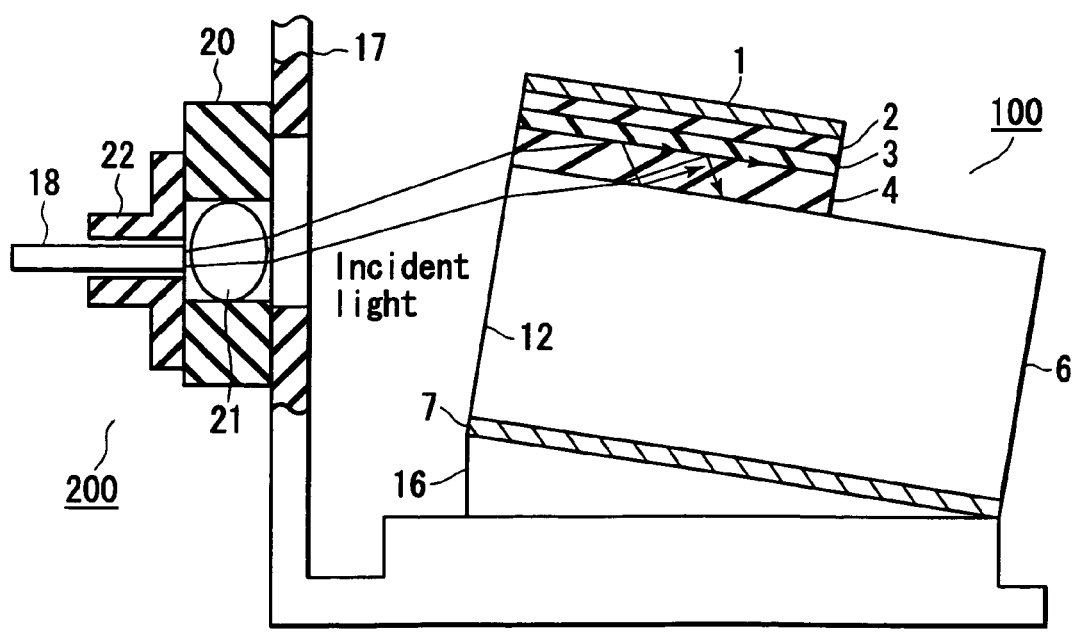
FIG. 11 is a cross sectional view showing a schematic configuration of a semiconductor light-receiving module according to a sixth embodiment of the invention.

FIG. 11 is a cross sectional view showing a schematic configuration of a semiconductor light-receiving module according to a sixth embodiment of the invention.

In FIG. 11, same parts as in the semiconductor light-receiving module in the third embodiment shown in FIG. 8 are identified with same reference numerals, and detailed description of duplicate parts is omitted.

In the semiconductor light-receiving module of the sixth embodiment, a lens 21 is fixed in a lens holder 20 as the incident light direction device 200 for emitting incident light into the semiconductor light-receiving element 100, and the optical fiber 18 is held in the holder 22.

Actually, the optical fiber 18 is once fixed in a ferrule, and then incident into the holder 22, but the ferrule is omitted herein for the sake of simplicity of explanation.

In such semiconductor light-receiving module of the sixth embodiment, by setting the relative configuration of the lens holder 20 as the incident light direction device 200 and the ferrule, that is, the optical fiber 18, it is possible to adjust at least one of the position and inclination at time of entry of the incident light in the light incident facet 12 of the semiconductor light-receiving element 100, so that the incident light can be efficiently irradiated to the light absorbing layer 4.

This embodiment is an applied example of the third embodiment shown in FIG. 8, and it can be also applied to other embodiments, including the embodiments not using the pedestal 16 as the incident light direction device 200.

In the foregoing first to sixth embodiments explained herein, the light is reflected or propagated horizontally at the interface between the light absorbing layer 4 and the upper cladding layer 3, but other layer configuration for reflecting or propagating horizontally before the light enters the contact layer 2 producing useless carrier may be also considered to be included as an example of the invention.

As an example of such layer composition, a layer of higher refractive index than InP such as p-InGaAsP (or i-InGaAsP, p-InGaAlAs or i-InGaAlAs) is formed on the light absorbing layer 4, and a layer of p-InP is formed thereon.

In this case, the layer having higher refractive index than InP formed on the light absorbing layer 4 plays the role of optical waveguide, and a further effect of the invention is expected.

It goes without saying that the angle formed between the incident light and the light incident facet 12 not limited to the numerical values explained in the semiconductor light-receiving elements 100 in the first to sixth embodiments, but may include other angles as far as the principle of the invention is established.

In the foregoing first to sixth embodiments, it is assumed that n-InP cladding layer is not present beneath the light absorbing layer 4, but it is merely for the sake of simplicity of explanation, and the same effects are obtained even if n-InP cladding layer is present beneath the light absorbing layer 4.

Further, if an n-InP cladding layer is preliminarily grown beneath the light absorbing layer 4, since it plays the role of a buffer, and the crystallinity of the light absorbing layer 4 is improved.

Also in the foregoing first to sixth embodiments, to couple (enter) the light in the semiconductor light-receiving element, it goes without saying that any means may be used such as leading ball fiber, plane fiber or lens system, and that the wavelength is not limited to 1.55 μm, but may include other wavelength as well.

It goes without saying that the material for the light absorbing layer 4 is not limited to p-InGaAs, but includes quaternary crystals such as p-InGaAsP or p-InGaAlAs, or various multiplex quantum well materials.

Further in the foregoing first to sixth embodiments, of course, part of the incident light to the light incident facet 12 may be also irradiated to the upper cladding layer 3 made of p-InP on the light absorbing layer 4.

In the foregoing first to sixth embodiments, the light absorbing layer 4 has a high mesa structure, but it may be also realized in semi-insulating InP or pn buried structure, or the substrate 6 is not limited to $n^+$-InP, but may be realized by semi-insulating InP.

The semiconductor light-receiving module of the first to sixth embodiments may be also applied in an avalanche photodiode.

Besides, p-type doping may be formed by diffusion by Zn or the like.

As explained in the first embodiment of the invention, in the foregoing explanations, the incident light enters the light incident facet 12 obliquely from beneath the semiconductor light-receiving element 100 by the incident light direction device 200. But, it goes without saying that the effects of the invention are also obtained by entering the light incident facet 12 obliquely from above the semiconductor light-receiving element 100 by the incident light direction device 200.

As the semiconductor light-receiving element 100 of the first to sixth embodiments, using an n type semiconductor of high concentration which is slightly lower in refractive index, when an n-type or $n^+$-type semiconductor layer is formed on the light absorbing layer 4, and a-p type or $p^+$-type semiconductor layer is formed beneath the light absorbing layer 4, the effects of the invention will be further exhibited.

For instance, an $n^+$-InP cladding layer may be formed on the light absorbing layer 4.

Further, a $p^+$-InP substrate may be used.

Generally, because of alloying when realizing an ohmic contact, the $p^+$-InGaAs contact layer 2 deteriorates in its crystallinity, and the smoothness is extremely poor at the interface between the p-electrode 1 and the p⁺-InGaAs contact layer 2.

By contrast, in the semiconductor light-receiving module of the first to sixth embodiments, the light propagating obliquely upward from the lower side of the semiconductor light-receiving element 100 is reflected or propagated horizontally at the interface of the semiconductor layer of the semiconductor light-receiving element 100 by the incident light direction device 200. Basically, this light does not reach the contact layer 2 or the interface between the p-electrode 1 and the contact layer 2, and it is free from carrier not contributing to the photoelectric conversion or scatter loss of light, so that the efficiency of photoelectric conversion is extremely high.

Even if a very slight portion of the light propagating obliquely upward from obliquely beneath the semiconductor light-receiving element 100 by means of the incident light direction device 200 exudes to the p-InP cladding layer 3 side, it is also considered within to be the scope of the invention.

It goes without saying that, even if the structure is turned upside down in the first to sixth embodiments, the function as the semiconductor light-receiving module of the invention is unchanged.

As explained herein, in the semiconductor light-receiving module of the first to sixth embodiments of the invention, by emitting the incident light by adjusting the angle in at least part of the light absorbing layer 4 high in refractive index in the semiconductor light-receiving element 100 by the incident light direction device 200, the effective index of the incident light is set higher than the refractive index of the upper cladding layer 3, and hence the light propagating in the light absorbing layer 4 is totally reflected at the interface between the light absorbing layer 4 and the upper cladding layer 3.

As a result, in the semiconductor light-receiving module of the first to sixth embodiments of the invention, the light entering the semiconductor light-receiving element 100 is not concentrated in part of the light absorbing layer 4, but is directly absorbed efficiently in a wide range of the light absorbing layer 4, and is converted into current, thereby substantially enhancing the photo responsivity, light fastness of input, high speed response, and dark current characteristic of the semiconductor light-receiving element 100.

Therefore, according to the first to sixth embodiments of the invention, as described herein, by adjusting the waveguide of the light entering the light absorbing layer of the semiconductor light-receiving element by the incident light direction device, the light can be efficiently converted into current in the light absorbing layer, and the semiconductor light-receiving module capable of substantially enhancing the photo responsivity, light fastness of input, high speed response, and dark current characteristic of the semiconductor light-receiving element can be provided.

Seventh Embodiment

Figure 12:
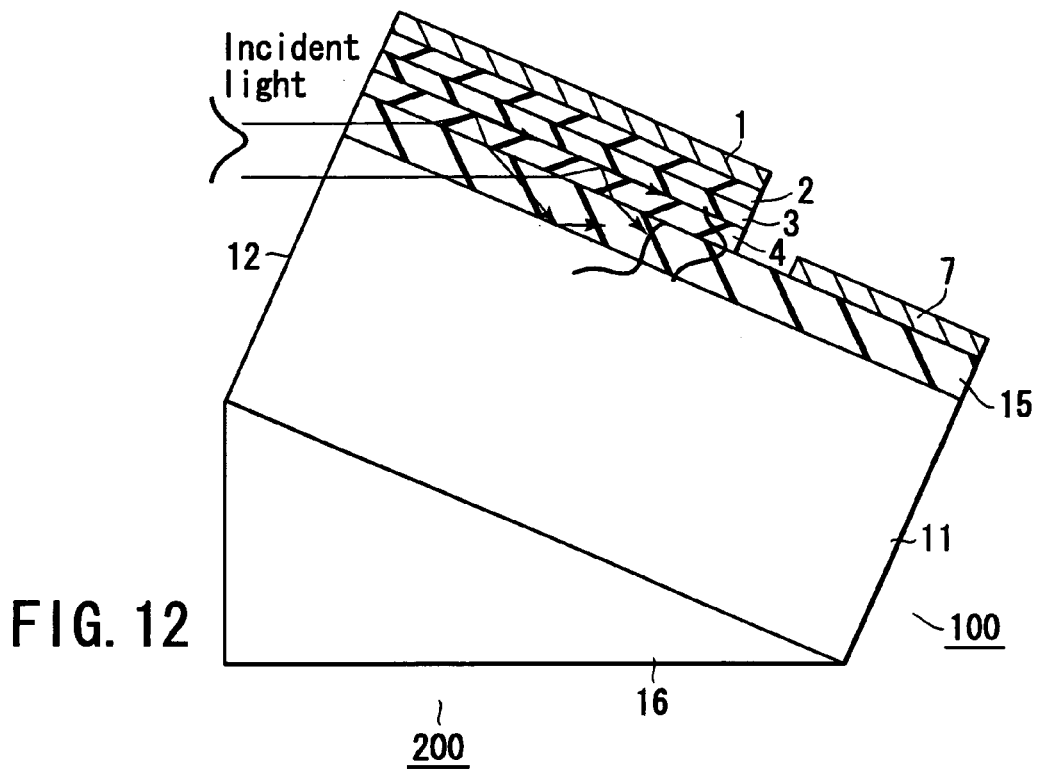
FIG. 12 is a cross sectional view showing a schematic configuration of a semiconductor light-receiving module according to a seventh embodiment of the invention.

FIG. 12 is a cross sectional view showing a schematic configuration of a semiconductor light-receiving module according to a seventh embodiment of the invention.

In FIG. 12, same parts as in the conventional semiconductor light-receiving element shown in FIG. 36 are identified with same reference numerals, and detailed description of duplicate parts is omitted.

That is, as shown in FIG. 12, the semiconductor light-receiving module of the seventh embodiment comprises, as described below, a semiconductor light-receiving element 100 having a lower semiconductor layer formed on a substrate 11 and having a function as an optical waveguide layer 15, a light absorbing layer 4 formed on the lower semiconductor layer and having a refractive index higher than that of the lower semiconductor layer, an upper cladding layer 3 formed on the light absorbing layer 4 and having a refractive index lower than that of the lower semiconductor layer, a light incident facet 12 formed on so as to include at least one facet of the substrate 11, lower semiconductor layer 15 and light absorbing layer 4, and electrodes 1, 7 for outputting the current generated by the light entering from the light incident facet 12 being absorbed in the light absorbing layer 4, to outside by way of the upper cladding layer 3 and lower semiconductor layer, and an incident light direction device 200 for directing the incident light obliquely to irradiate the light incident facet 12 of the semiconductor light-receiving element 100.

Herein, the semiconductor light-receiving element 100 is formed by sequentially laminating the optical waveguide layer 15 made of n-InGaAsP, the light absorbing layer 4 made of i-InGaAs, the upper cladding layer 3 made of p-InP, and a contact layer 2 made of p⁺-InGaAs, on the substrate 11 made of semi-insulating InP (SI-InP) material.

At the upper side of the contact layer 2, the p-electrode 1 is provided for taking out current.

In the optical waveguide layer 15 made of n-InGaAsP, similarly, the n-electrode 7 is provided for taking out current.

This semiconductor light-receiving element 100 is inclined by a wedge-shaped pedestal 16 disposed at the lower side of the substrate 11, as part of the incident light direction device 200 for directing the light obliquely to irradiate the light incident facet 12 of the semiconductor light-receiving element 100.

The optical waveguide layer 15 made of n-InGaAsP also has a function of an ohmic contact layer to the n-electrode 7 for taking out current.

In this semiconductor light-receiving module, the angle formed between the light incident facet 12 formed at least of one facet of the substrate 11, optical waveguide layer 15 and light absorbing layer 4 of the semiconductor light-receiving element 100 and the lower side of the light absorbing layer is set at 90 degrees.

Specifically, the light incident facet 12 of the semiconductor light-receiving element 100 is formed by cleavage.

In the semiconductor light-receiving module having such configuration, the optical waveguide layer 15 made of n-InGaAsP of the semiconductor light-receiving element 100 composes the lower semiconductor layer.

In the semiconductor light-receiving module of the seventh embodiment, the refractive indices $n_3$, $n_4$, $n_{15}$, $n_{11}$ of the upper cladding layer 3, light absorbing layer 4, optical waveguide layer 15, and substrate 11 of the semiconductor light-receiving element 100 are determined in the relation of $n_3(=3.17)=n_{11}(=3.17)<n_{15}(=3.35)<n_4(=\text{about } 3.6)$.

The principle of operation of the semiconductor light-receiving module of the seventh embodiment having such configuration is explained below by referring to FIGS. 13 and 14.

First, by the incident light direction device 200, when light is entered in the facet of at least the optical waveguide layer 15 out of the optical waveguide layer 15 and substrate 11. Here, the band gap wavelength of the optical waveguide layer 15 is 1.2 μm, for example, having higher refractive index than the upper cladding layer 3 above the light absorbing layer 4 in the semiconductor light-receiving element 100, this incident light feels its high refractive index.

Therefore, for the incident light, the effective index $n_e$ is higher than the refractive index of the substrate 11.

Herein, as mentioned above, since the refractive index $n_3$ of the upper cladding layer 3 and the refractive index $n_{11}$ of the substrate 11 are substantially equal to each other, for the incident light, hence, the effective index $n_e$ is higher than in the upper cladding layer 3.

Accordingly, Snell's law established at the interface between the optical waveguide layer 15 and the light absorbing layer 4 is as shown in formula (7) below:

$$n_e \sin \theta_{15} = n_4 \sin \theta_4 \quad (7)$$

At the interface between the light absorbing layer 4 and the upper cladding layer 3, Snell's law is as in formula (8):

$$n_4 \sin \theta_4 = n_3 \quad (8)$$

That is, putting formula (8) into formula (7), the following formula (9) is obtained:

$$n_e \sin \theta_{15} = n_3 \quad (9)$$

When this formula (9) is established, total reflection of light occurs at the interface.

Accordingly, considering the refractive indices $n_{15}$, $n_{11}$ of the optical waveguide layer 15 and substrate 11, it is important to have a feeling of high refractive index of at least the optical waveguide layer 15, and also to select properly the incident angle of the light.

In the semiconductor light-receiving module of the invention, therefore, the incident light direction device 200 is provided for emitting the incident light obliquely to the light incident facet 12 of the semiconductor light-receiving element 100.

Figure 13:
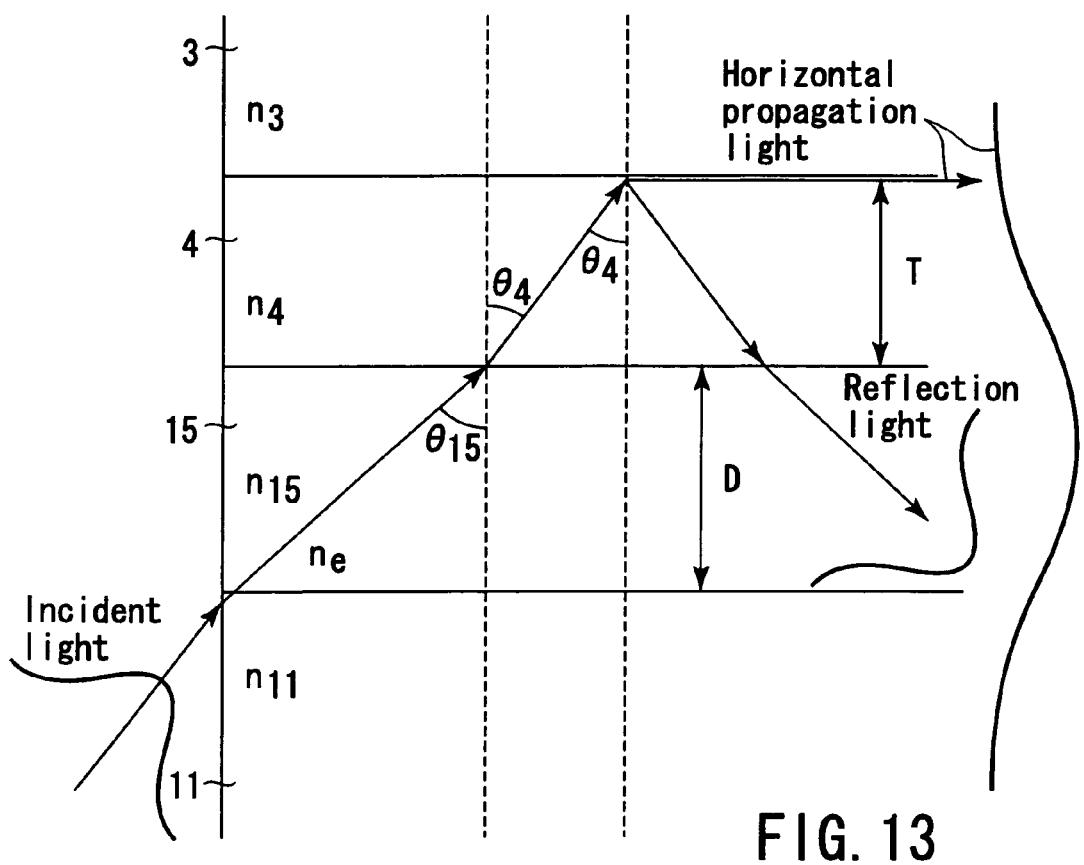
FIG. 13 is a diagram explaining an operation of the semiconductor light-receiving module in FIG. 12.

The optical waveguide layer 15 of the semiconductor light-receiving element 100 is designed to function has a loaded optical waveguide for propagating the light, and as shown in FIG. 13, by the incident light direction device 200, the incident angle $\theta_4$ to the upper cladding layer 3 of the semiconductor light-receiving element 100 is higher than the critical angle for inducing total reflection of light, it results in generation of horizontal propagation light propagating in the horizontal direction, in addition to the reflection light propagating obliquely in the light absorbing layer 4 at the interface between the light absorbing layer 4 and the upper cladding layer 3.

Figure 14:
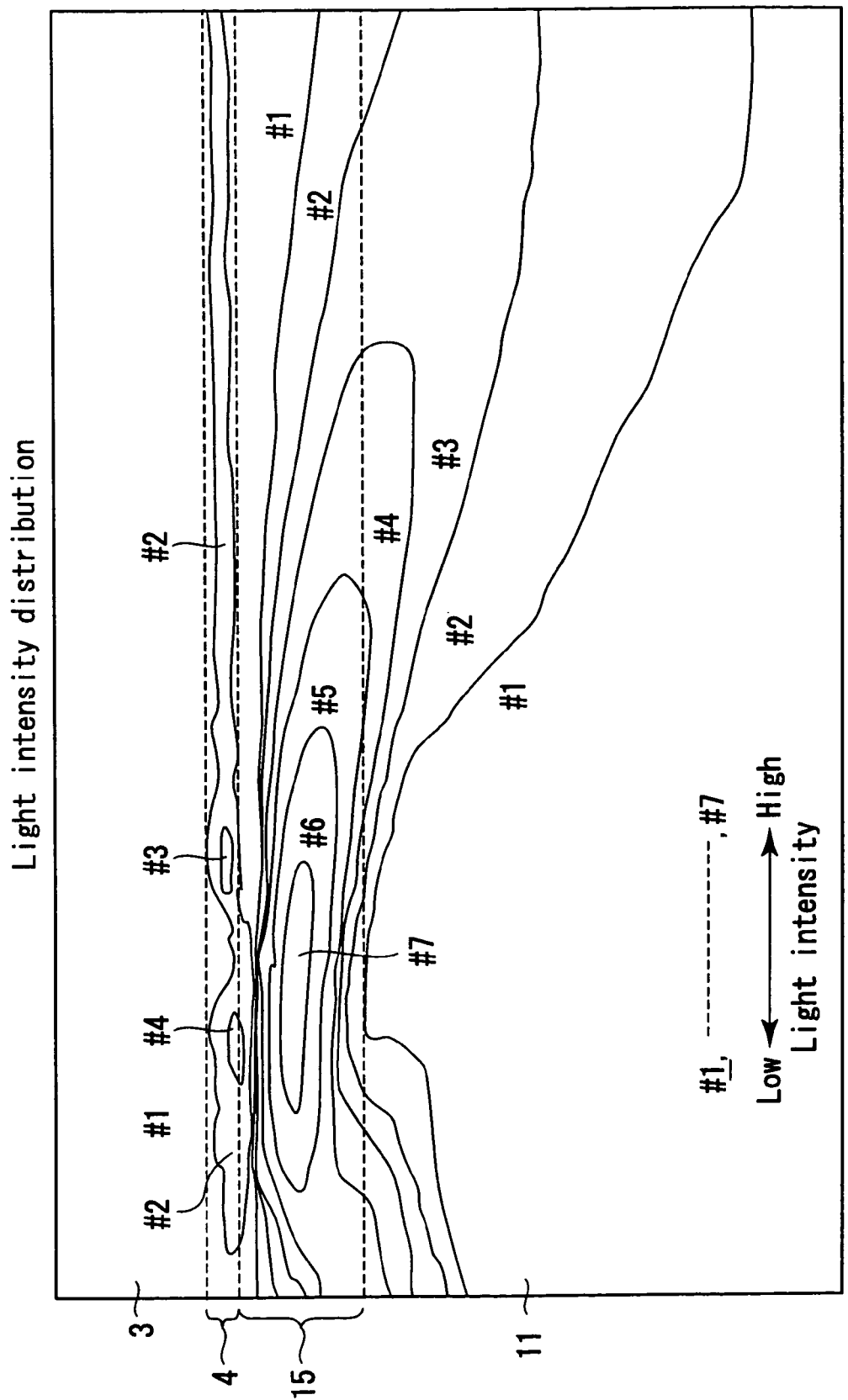
FIG. 14 is a diagram showing intensity distribution of light entering the semiconductor light-receiving element of the semiconductor light-receiving module in FIG. 12.

FIG. 14 is a diagram showing intensity distribution of light in the semiconductor light-receiving element 100 in the case of incidence from the light incident facet 12 of the semiconductor light-receiving element 100 in the above condition.

According to FIG. 14, evidently, there is a horizontal propagation light propagating in the horizontal direction in the light absorbing layer 4, in addition to the reflection light propagating obliquely in the right downward direction in the light absorbing layer 4 and optical waveguide layer 15 being reflected at the interface between the light absorbing layer 4 and the upper cladding layer 3 in the semiconductor light-receiving element 100.

Therefore, in this semiconductor light-receiving module, the light can be propagated efficiently in the light absorbing layer 4 and optical waveguide layer 15 in the semiconductor light-receiving element 100 by means of the incident light direction device 200.

The light thus propagating in the light absorbing layer 4 and optical waveguide layer 15 in the semiconductor light-receiving element 100 is absorbed in the light absorbing layer 4, and converted into current.

Figure 15:
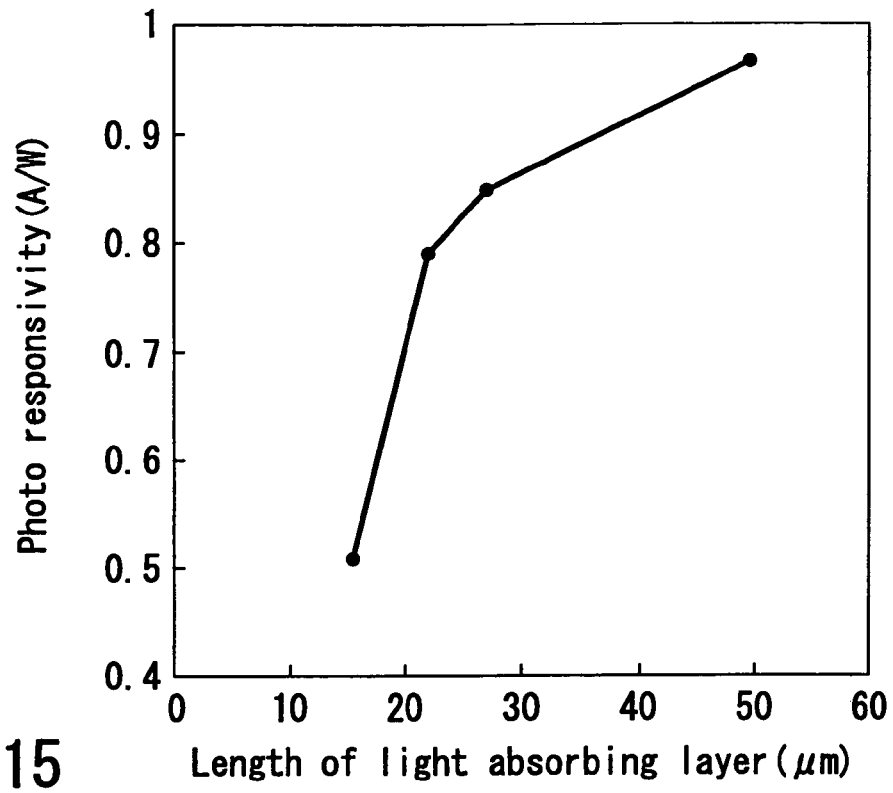
FIG. 15 is a diagram showing photo responsivity characteristic of the semiconductor light-receiving element of the semiconductor light-receiving module in FIG. 12.

FIG. 15 is a diagram showing measuring results of photo responsivity characteristic of four trial products for semiconductor light-receiving element as the semiconductor light-receiving element 100 to be used in the semiconductor light-receiving module of the seventh embodiment.

In FIG. 15, the axis of ordinates denotes the photo responsivity (A/W) of the trial product for the semiconductor light-receiving element, and the axis of abscissas represents the length of the light absorbing layer 4 of the trial product for the semiconductor light-receiving element.

As understood from the measuring results in FIG. 15, the photo responsivity is improved even in the semiconductor light-receiving element 100 of which length of light absorbing layer 4 is 30 μm or more.

In the trial products for the semiconductor light-receiving element 100, the thickness T of the light absorbing layer 4 is 0.5 μm, and the thickness D of the optical waveguide layer 15 is 2.0 μm.

In the trial products for the semiconductor light-receiving element 100, the incident angle of light from the horizontal direction is 40 degrees in all cases.

Figure 16:
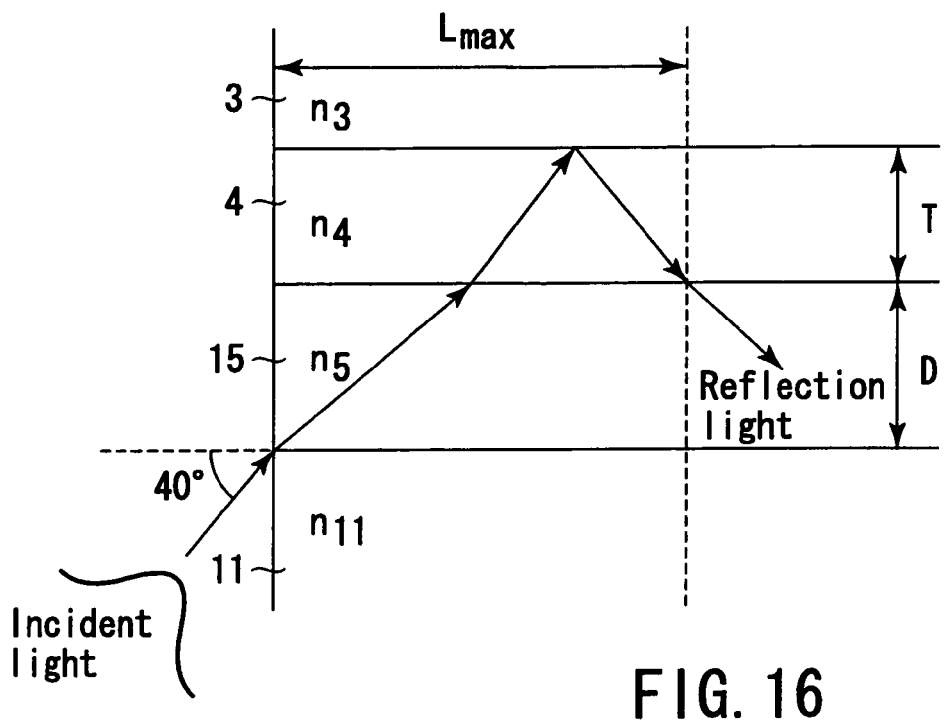
FIG. 16 is a diagram explaining a case of supposing once reflected at the interface between the light absorbing layer 4 and the upper cladding layer 3, and passing through the light absorbing layer 4, the length in the semiconductor light-receiving element of the semiconductor light-receiving module in FIG. 12.

As shown in FIG. 16, supposing the light entering from the lower end of the optical waveguide layer 15 of the semiconductor light-receiving element 100, being once reflected at the interface between the light absorbing layer 4 and the upper cladding layer 3, and passing through the light absorbing layer 4, the length Lmax of the light absorbing layer 4 is sufficiently shorter than 20 μm.

However, as mentioned above, even in the semiconductor light-receiving element of which length of light absorbing layer 4 is 30 μm or more, the photo responsivity is improved.

It is considered because, aside from the component of the light reflected at the interface between the light absorbing layer 4 and the upper cladding layer 3, there is a portion of light propagating in the length direction of the light absorbing layer 4 and optical waveguide layer 15, and it is absorbed in the light absorbing layer 4.

Thus, in the semiconductor light-receiving element 100 to be used in the semiconductor light-receiving module in the seventh embodiment, unlike the conventional semiconductor light-receiving element shown in FIG. 43, by extending the length of the light absorbing layer 4 as far as permitted by the bandwidth as the semiconductor light-receiving element 100, the photo responsivity as the semiconductor light-receiving element 100 can be enhanced.

Figure 40A:
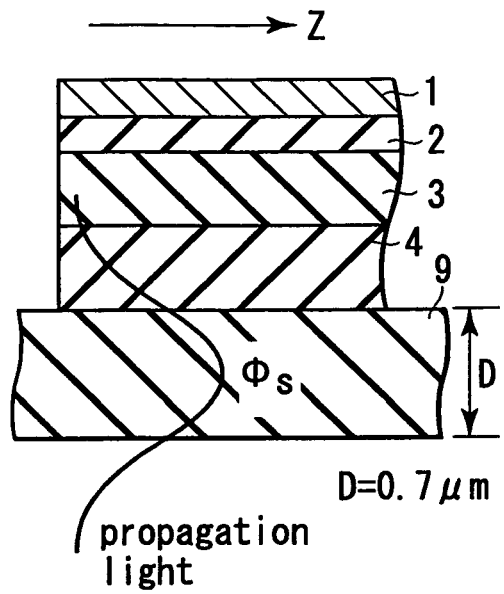
FIGS. 40A and 40B are views explaining an operation of the semiconductor light-receiving element in FIG. 38.
Figure 40B:
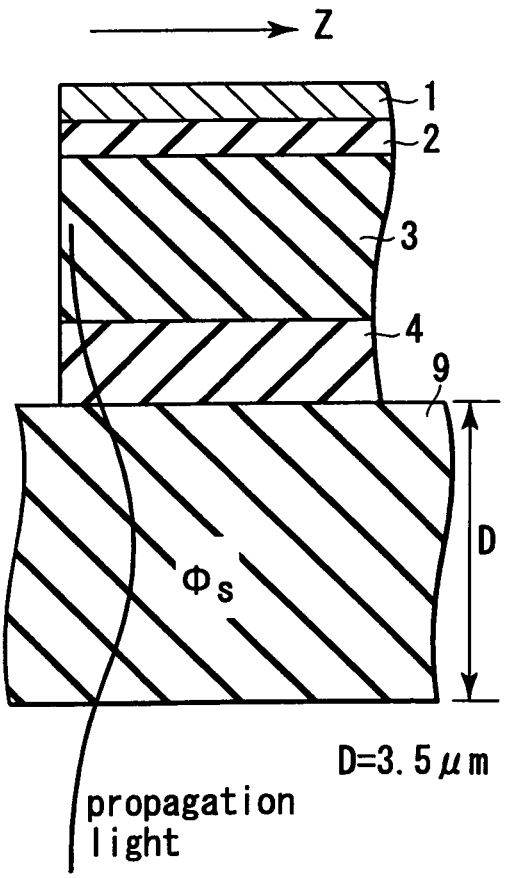
Figure 41A:
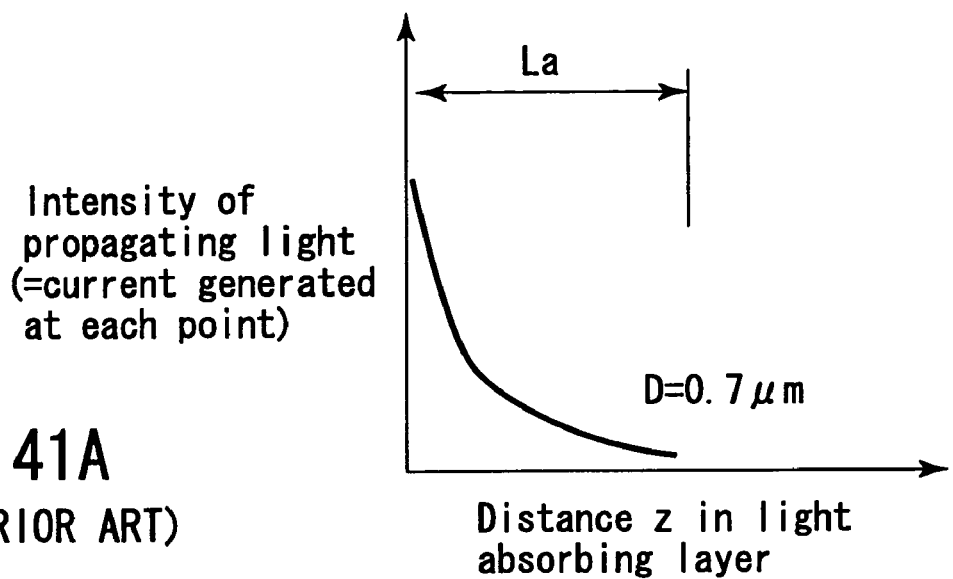
FIGS. 41A and 41B are views showing a schematic configuration of the semiconductor light-receiving element in FIG. 38.
Figure 41B:
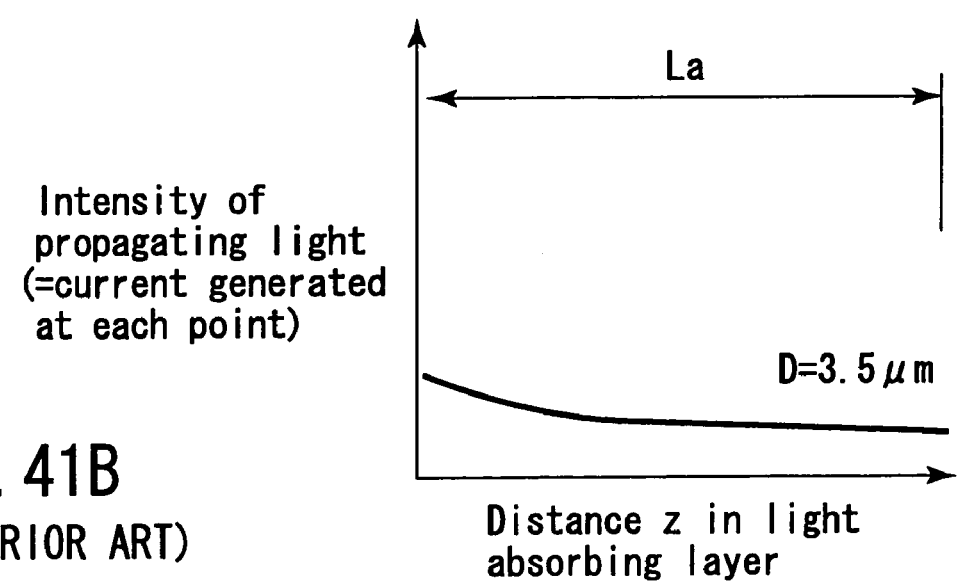

In the semiconductor light-receiving element 100 to be used in the semiconductor light-receiving module of the seventh embodiment, moreover, since the light is irradiated over a wide range beneath the light absorbing layer 4 obliquely from beneath the semiconductor light-receiving element 100 by the incident light direction device 200, unlike the conventional semiconductor light-receiving element of optical waveguide type shown in FIG. 36 or the conventional loaded optical waveguide type element having the thin loaded optical waveguide 9 shown in FIG. 40A, current is not concentrated in a specific portion of the light absorbing layer 4, and hence breakdown of the semiconductor light-receiving element 100 due to Joule heat can be prevented.

Further, in the semiconductor light-receiving module of the seventh embodiment, by the incident light direction device 200, a portion of large power of the light can be directly irradiated over a wide range of the bottom face of the light absorbing layer 4 obliquely from beneath the light absorbing layer 4 of the semiconductor light-receiving element 100, and also part of the light can be propagated and absorbed in the light absorbing layer 4 or optical waveguide layer 15. Therefore, as compared with the conventional loaded optical waveguide type semiconductor light-receiving element having a thick loaded optical path shown in FIG. 40B or the conventional semiconductor light-receiving element of facet refractive type shown in FIG. 42 or FIG. 43, the photo responsivity of the semiconductor light-receiving element 100 is higher and hence the required light absorption length of the semiconductor light-receiving element 100 is shorter, so that the bandwidth limited by the CR time constant can be widened.

In the semiconductor light-receiving module of the seventh embodiment, the thickness T of the optical waveguide layer 15 of the semiconductor light-receiving element 100 may be smaller than the diameter of the incident light, and hence the load to the crystal growth is small and the manufacturing efficiency of the semiconductor light-receiving element is excellent.

The same features are available also in the semiconductor light-receiving elements 100 to be used in the semiconductor light-receiving modules according to eighth to fourteenth embodiments below.

In the semiconductor light-receiving module in the seventh embodiment, furthermore, as shown in FIG. 12, the light reflected obliquely downward at the interface between the upper cladding layer 3 and the light absorbing layer 4 of the semiconductor light-receiving element 100 is reflected again obliquely upward at the interface between the optical waveguide layer 15 of high refractive index and the substrate 11 of low refractive index, and is absorbed again in the light absorbing layer 4 repeatedly, which contributes to enhancement of photo responsivity of the semiconductor light-receiving element 100.

Such features are also available in the semiconductor light-receiving elements 100 used in the semiconductor light-receiving modules in the eighth to fourteenth embodiments.

Eighth Embodiment

Figure 17:
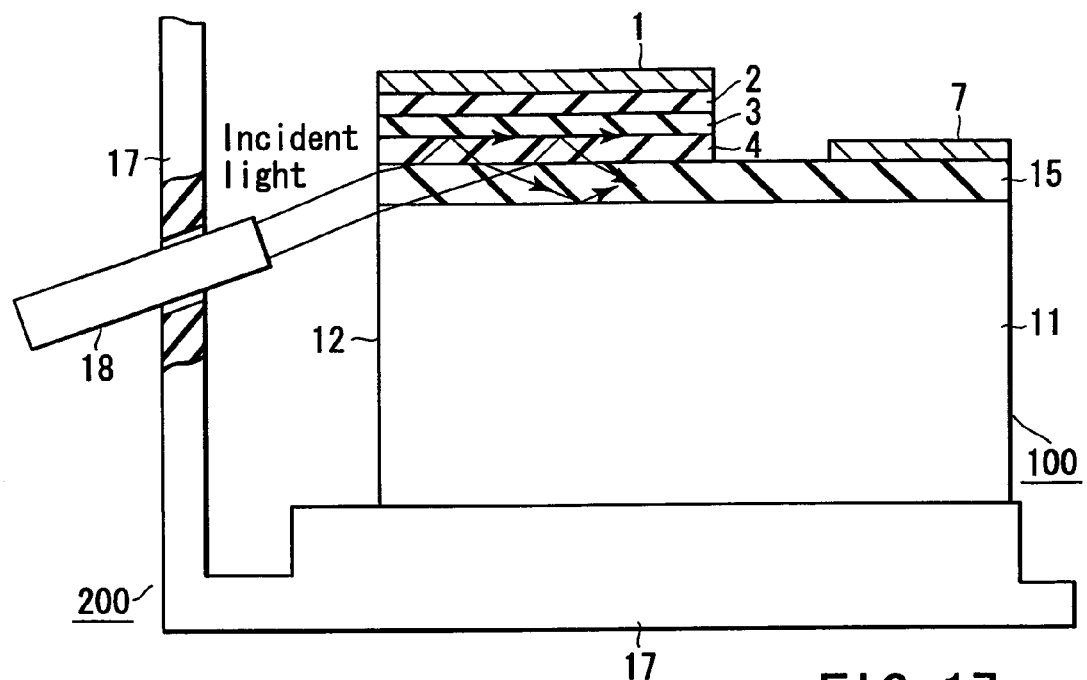
FIG. 17 is a cross sectional view showing a schematic configuration of a semiconductor light-receiving module according to an eighth embodiment of the invention.

FIG. 17 is a cross sectional view showing a schematic configuration of a semiconductor light-receiving module according to an eighth embodiment of the invention.

In FIG. 17, same parts as in the semiconductor light-receiving module of the seventh embodiment shown in FIG. 12 are identified with same reference numerals, and detailed description of duplicate parts is omitted.

In the semiconductor light-receiving module of the eighth embodiment, instead of the pedestal 16 in the semiconductor light-receiving module of the seventh embodiment shown in FIG. 12, a casing 17 is provided for holding the semiconductor light-receiving element 100 horizontally as the incident light direction device 200, and from the optical fiber 18 as the incident light direction device 200 inclined and supported on this casing 17, the light is inclined and irradiated to a light incident facet 12 composed at least at one facet of the substrate 11, optical waveguide layer 15 and light absorbing layer 4 of the semiconductor light-receiving element 100.

In the semiconductor light-receiving module having such configuration, the light entering the light incident facet 12 of the semiconductor light-receiving element 100 from the optical fiber 18 as the incident light direction device 200 is refracted by this light incident facet 12, and enters and is absorbed in the light absorbing layer 4 obliquely from beneath the light absorbing layer 4 positioned upward by way of the optical waveguide layer 15.

In the semiconductor light-receiving module of the eighth embodiment, too, at least one part of the incident light is irradiated to the optical waveguide layer 15 of the semiconductor photo detector 100 by the incident light direction device 200, and by setting the refractive index $n_{15}$ of the optical waveguide layer 15 of the semiconductor light-receiving element 100 higher than the refractive index $n_3$ of the upper cladding layer 3 positioned above the light absorbing layer 4, such that the effective index $n_e$ of the incident light becomes higher than the refractive index $n_3$ of the upper cladding layer 3 the light is reflected at the interface between the upper cladding layer 3 and the light absorbing layer 4, and part of the incident light is horizontally propagated in the light absorbing layer 4 or optical waveguide layer 15.

Therefore, in the semiconductor light-receiving element 100 to be used in the semiconductor light-receiving module of the eighth embodiment, since reflection of light and propagation of light in the horizontal direction are utilized, the effective absorption length is longer, and the responsivity can be notably improved as the semiconductor light-receiving element 100.

Ninth Embodiment

Figure 18:
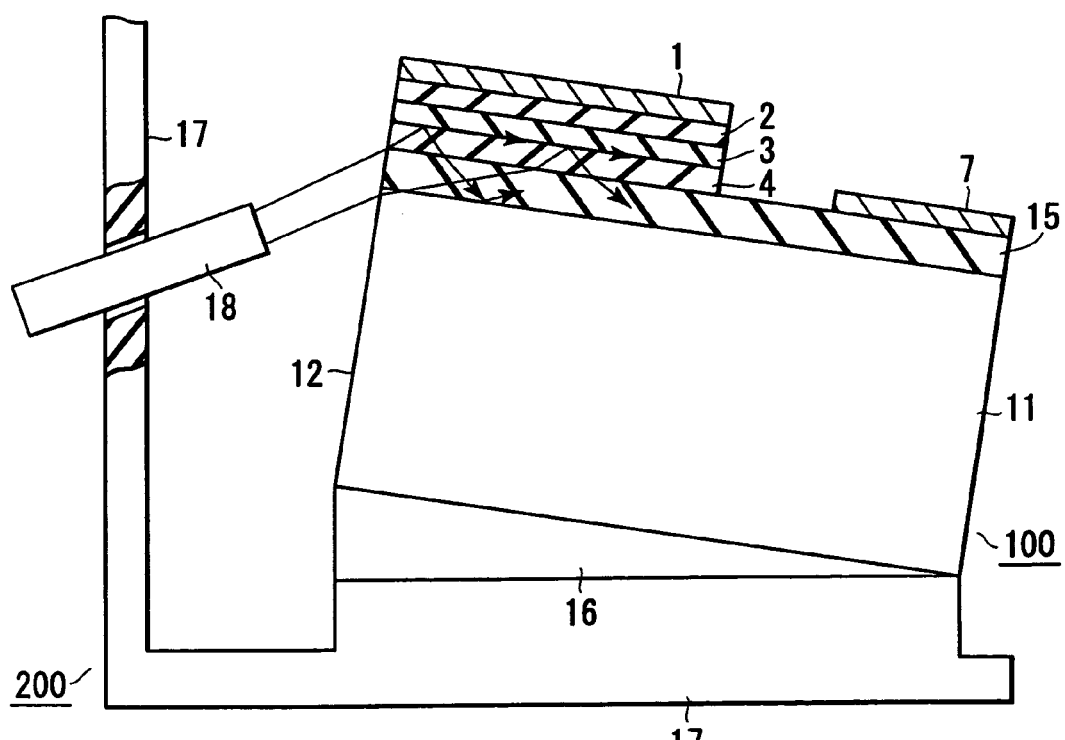
FIG. 18 is a cross sectional view showing a schematic configuration of a semiconductor light-receiving module according to a ninth embodiment of the invention.

FIG. 18 is a cross sectional view showing a schematic configuration of a semiconductor light-receiving module according to a ninth embodiment of the invention.

In FIG. 18, same parts as in the semiconductor light-receiving module in the eighth embodiment shown in FIG. 17 are identified with same reference numerals, and detailed description of duplicate parts is omitted.

In the semiconductor light-receiving module of the ninth embodiment, a wedge-shaped pedestal 16 is interposed between the casing 17 as the incident light direction device 200 and the substrate 11 in the semiconductor light-receiving module of the eighth embodiment shown in FIG. 17, and the light incident facet 12 of the semiconductor light-receiving element 100 is inclined.

In the semiconductor light-receiving module of the ninth embodiment, thus, by inclining the light incident facet 12 of the semiconductor light-receiving element 100 by the incident light direction device 200, the angle formed by the incident light issued from the optical fiber 18 as the incident light direction device 200 and the light incident facet 12 of the semiconductor light-receiving element 100 becomes smaller, so that a desired incident angle may be realized easily.

In the semiconductor light-receiving module of the ninth embodiment, too, by setting the refractive index $n_{15}$ of the optical waveguide layer 15 of the semiconductor light-receiving element 100 higher than the refractive index $n_3$ of the upper cladding layer 3 positioned above the light absorbing layer 4, such that the effective index $n_e$ of the incident light becomes higher than the refractive index $n_3$ of the upper cladding layer 3 the light is reflected at the interface between the upper cladding layer 3 and the light absorbing layer 4 of the semiconductor light-receiving element 100, and part of the incident light is horizontally propagated in the light absorbing layer 4 or optical waveguide layer 15.

Therefore, in the semiconductor light-receiving element 100 to be used in the semiconductor light-receiving module of the ninth embodiment, since reflection of light and propagation of light in the horizontal direction are utilized, the effective absorption length is longer, and the responsivity can be notably improved as the semiconductor light-receiving element 100.

Tenth Embodiment

Figure 19:
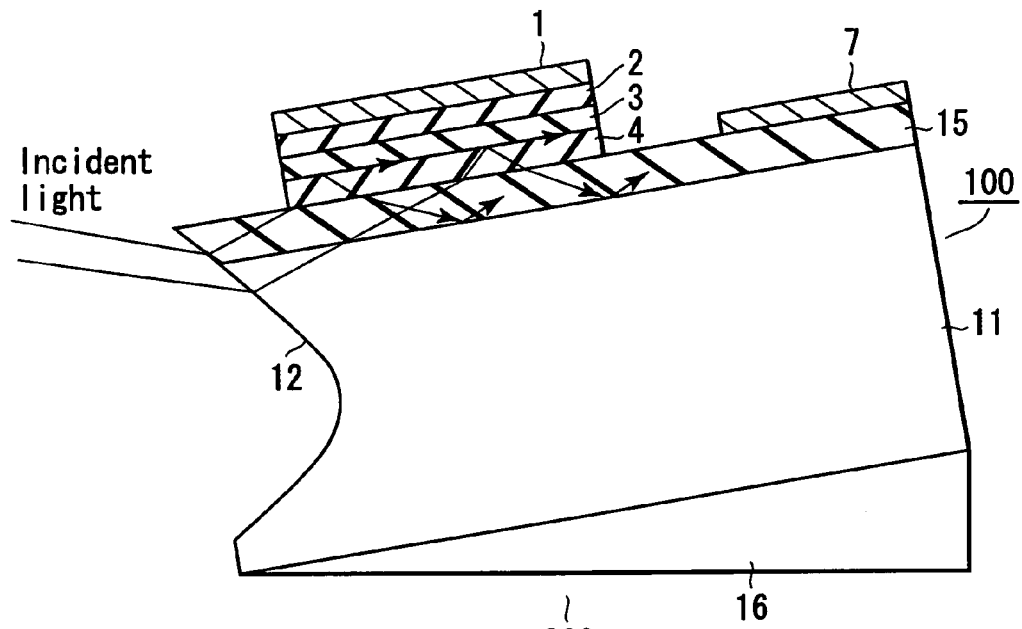
FIG. 19 is a cross sectional view showing a schematic configuration of a semiconductor light-receiving module according to a tenth embodiment of the invention.

FIG. 19 is a cross sectional view showing a schematic configuration of a semiconductor light-receiving module according to a tenth embodiment of the invention.

In FIG. 19, same parts as in the semiconductor light-receiving module in the seventh embodiment shown in FIG. 12 are identified with same reference numerals, and detailed description of duplicate parts is omitted.

In the semiconductor light-receiving module of the tenth embodiment, the light incident facet 12 including at least one facet of the substrate 11, the optical waveguide layer 15 made of n-InGaAsP and the light absorbing layer 4 of the semiconductor light-receiving element 100 is formed by wet etching process same as in the conventional semiconductor light-receiving element shown in FIGS. 42 and 43.

Therefore, the angle formed between the light incident facet 12 of the semiconductor light-receiving element 100 and the bottom face of the light absorbing layer 4 is about 54 degrees as determined by the crystal azimuth.

Further, to realize a small incident angle to the light absorbing layer 4 of the semiconductor light-receiving element 100, the entire structure of the semiconductor light-receiving element 100 is inclined by using the pedestal 16 as the incident light direction device 200.

The semiconductor light-receiving element 100 used in the semiconductor light-receiving module of the tenth embodiment seems to be similar to the conventional semiconductor light-receiving element shown in FIGS. 42 and 43. But, same as the semiconductor light-receiving element 100 to be used in the semiconductor light-receiving module of the seventh, eighth or ninth embodiment, by setting the refractive index $n_{15}$ of the optical waveguide layer 15 of the semiconductor light-receiving element 100 higher than the refractive index $n_3$ of the upper cladding layer 3 positioned above the light absorbing layer 4, such that the effective index $n_e$ of the incident light becomes higher than the refractive index $n_3$ of the upper cladding layer 3 the light is reflected at the interface between the upper cladding layer 3 and the light absorbing layer 4, and part of the incident light is horizontally propagated in the light absorbing layer 4 or optical waveguide layer 15.

Therefore, in the semiconductor light-receiving element 100 to be used in the semiconductor light-receiving module of the tenth embodiment, too, since reflection of light and propagation of light in the horizontal direction are utilized, its effective absorption length is longer, and the responsivity can be enhanced substantially as the semiconductor light-receiving element 100.

Eleventh Embodiment

Figure 20:
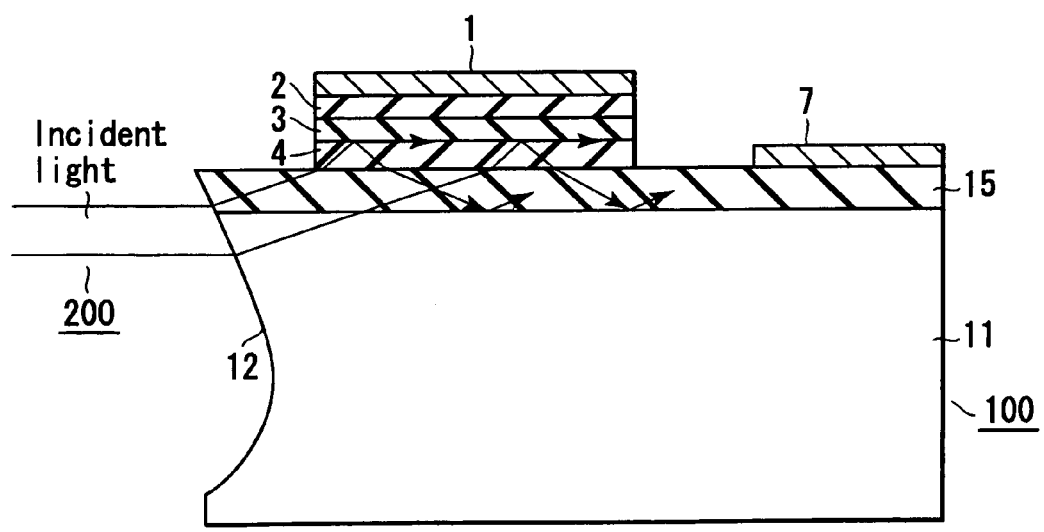
FIG. 20 is a cross sectional view showing a schematic configuration of a semiconductor light-receiving module according to an eleventh embodiment of the invention.

FIG. 20 is a cross sectional view showing a schematic configuration of a semiconductor light-receiving module according to an eleventh embodiment of the invention.

In FIG. 20, same parts as in the semiconductor light-receiving module in the tenth embodiment shown in FIG. 19 are identified with same reference numerals, and detailed description of duplicate parts is omitted.

In the semiconductor light-receiving module of the eleventh embodiment, the light incident facet 12 including at least one facet of the substrate 11, the optical waveguide layer 15 made of n-InGaAsP, and the light absorbing layer 4 of the semiconductor light-receiving element 100 is formed by wet etching process same as in the semiconductor light-receiving element 100 to be used in the semiconductor light-receiving module of the tenth embodiment shown in FIG. 19.

In the eleventh embodiment, however, the time of wet etching is set shorter.

Therefore, the angle formed between the light incident facet 12 of the semiconductor light-receiving element 100 and the top face of the optical waveguide layer 15 (bottom face of the light absorbing layer 4) is less than 90 degrees and larger than about 54 degrees determined by the crystal azimuth.

In this case, meanwhile, as the angle formed between the light incident facet 12 and the top face of the optical waveguide layer 15 (bottom face of the light absorbing layer 4), an angle larger than 90 degrees can be realized by selecting the crystal azimuth.

As a result, the pedestal 16 as part of the incident light direction device 200 required in the semiconductor light-receiving module in the tenth embodiment in FIG. 19 is no longer needed in this semiconductor light-receiving module of the eleventh embodiment, and hence the entire mounting is easier.

In the semiconductor light-receiving element 100 to be used in the semiconductor light-receiving module of the eleventh embodiment, too, by using the optical waveguide layer 15 having a higher refractive index than the upper cladding layer 3, same as in the semiconductor light-receiving element 100 to be used in the semiconductor light-receiving module of the tenth embodiment, since reflection of light and propagation of light in the horizontal direction are utilized, its effective absorption length is longer, and the responsivity can be enhanced substantially as the semiconductor light-receiving element 100.

Twelfth Embodiment

Figure 21:
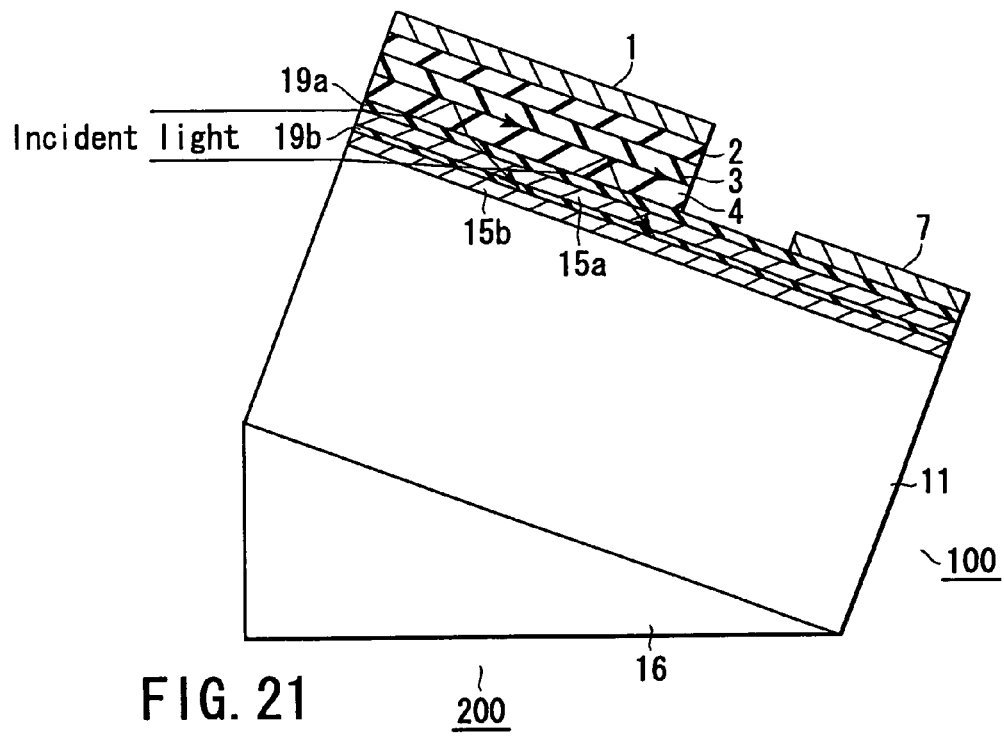
FIG. 21 is a cross sectional view showing a schematic configuration of a semiconductor light-receiving module according to a twelfth embodiment of the invention.

FIG. 21 is a cross sectional view showing a schematic configuration of a semiconductor light-receiving module according to a twelfth embodiment of the invention.

In FIG. 21, same parts as in the semiconductor light-receiving module in the seventh embodiment shown in FIG. 17 are identified with same reference numerals, and detailed description of duplicate parts is omitted.

In the semiconductor light-receiving module of the twelfth embodiment, by alternately combining plural optical waveguide layers 15 made of n-InGaAsP and plural lower cladding layers 19 made of n-InP of the semiconductor light-receiving element 100, when the light enters this semiconductor light-receiving element 100 by the incident light direction device 200, the refractive index felt equivalently by this light is set larger than the refractive index of the upper cladding layer 3 made of p-InP.

Thus, in the semiconductor light-receiving module of the twelfth embodiment, by composing the lower semiconductor layer existing between the substrate 11 and the light absorbing layer 4 of the semiconductor light-receiving element 100 in a multi-layer structure by mutually different materials, the manufacturing efficiency can be enhanced by improving the crystallinity in the manufacturing process of the semiconductor light-receiving element 100 in which the lower semiconductor layer including the optical waveguide layer 15 and lower cladding layer 19 is formed on the substrate 11 by crystal growth.

Thirteenth Embodiment

Figure 22:
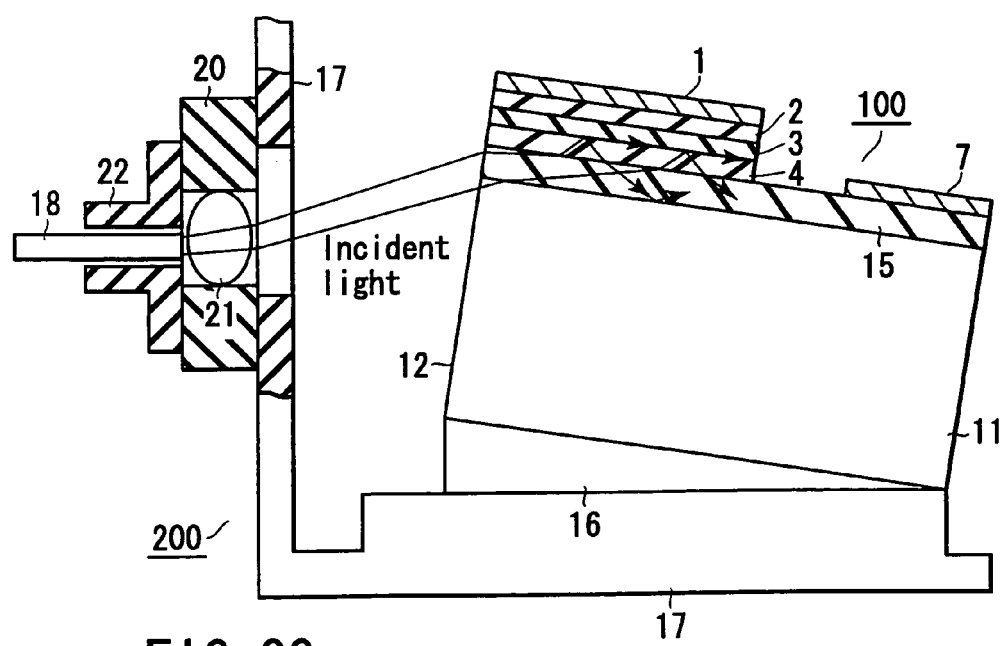
FIG. 22 is a cross sectional view showing a schematic configuration of a semiconductor light-receiving module according to a thirteenth embodiment of the invention.

FIG. 22 is a cross sectional view showing a schematic configuration of a semiconductor light-receiving module according to a thirteenth embodiment of the invention.

In FIG. 21, same parts as in the semiconductor light-receiving module in the ninth embodiment shown in FIG. 18 are identified with same reference numerals, and detailed description of duplicate parts is omitted.

In the semiconductor light-receiving module of the thirteenth embodiment, a lens 21 is fixed in a lens holder 20 as the incident light direction device 200, and the optical fiber 18 is held in the holder 22.

Actually, the optical fiber 18 is once fixed in a ferrule, and then incident into the holder 22, but the ferrule is omitted herein for the sake of simplicity of explanation.

Herein, by setting the relative configuration of the lens holder 20 as the incident light direction device 200 and the ferrule, that is, the optical fiber 18, it is possible to adjust at least one of the position and inclination at time of entry of the incident light in the light incident facet 12 of the semiconductor light-receiving element 100, so that the incident light can be efficiently irradiated to the light absorbing layer 4 of the semiconductor light-receiving element 100.

In the semiconductor light-receiving module of the thirteenth embodiment, the semiconductor light-receiving element 100 is an applied example of the semiconductor light-receiving element 100 to be used in the semiconductor light-receiving module of the ninth embodiment shown in FIG. 19, but it can be also applied to other seventh, eighth, and tenth to twelfth embodiments, including the embodiments not using the pedestal 16 as the incident light direction device 200.

Fourteenth Embodiment

Figure 23:
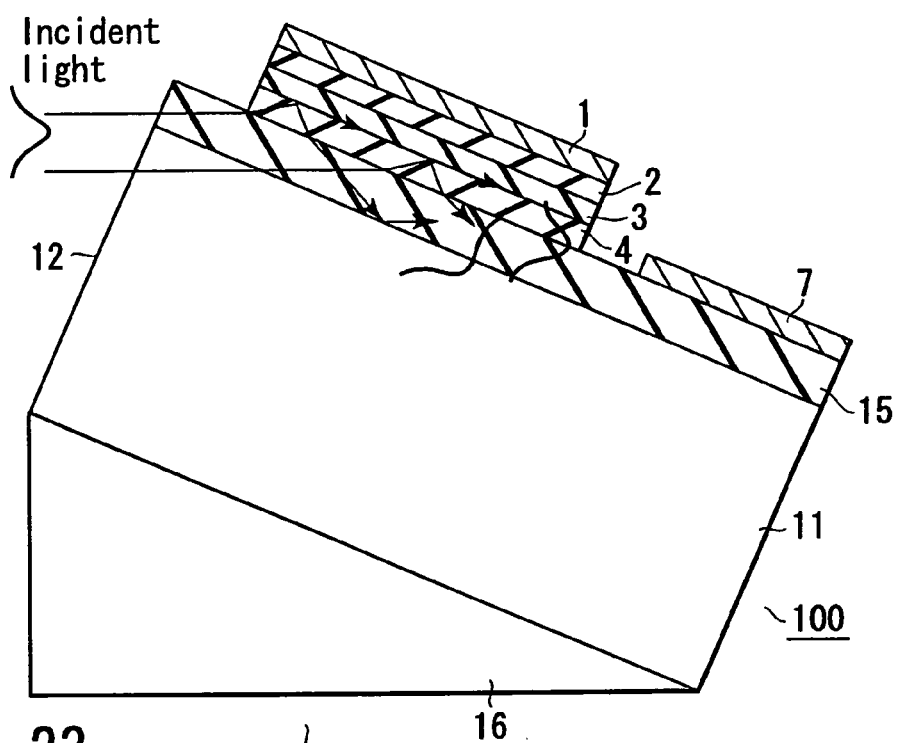
FIG. 23 is a cross sectional view showing a schematic configuration of a semiconductor light-receiving module according to a fourteenth embodiment of the invention.

FIG. 23 is a cross sectional view showing a schematic configuration of a semiconductor light-receiving module according to a fourteenth embodiment of the invention.

In FIG. 23, same parts as in the semiconductor light-receiving module in the seventh embodiment shown in FIG. 17 are identified with same reference numerals, and detailed description of duplicate parts is omitted.

In the semiconductor light-receiving module of the fourteenth embodiment, the position of the facet of the optical waveguide layer 4 and substrate 11 for composing the light incident facet 12 of the semiconductor light-receiving element 100 is shifted to the incident light side as compared with the position of the facet of the contact layer 2, upper cladding layer 3, and light absorbing layer 4.

In the semiconductor light-receiving element 100 having such configuration, the light enters the light absorbing layer 4 in the same condition as mentioned above of the incident light from the light incident facet 12 of the semiconductor light-receiving element 100, and is reflected at the interface between the upper cladding layer 3 and the light absorbing layer 4 by means of the incident light direction device 200, and part of the incident light propagates in the light absorbing layer 4 or optical waveguide layer 15. Therefore, it has the nearly same effects as the semiconductor light-receiving element 100 used in the semiconductor light-receiving module of the ninth embodiment.

As described herein, in the semiconductor light-receiving modules according to the seventh to fourteenth embodiments of the invention, by adjusting the refractive index of each layer surrounding the light absorbing layer 4 of the semiconductor light-receiving element 100 and the incident angle of the incident light by means of the incident light direction device 200, one part of the light entering the light absorbing layer 4 is propagated in at least one of the light absorbing layer 4 and the lower semiconductor layer, in a parallel direction beneath the upper cladding layer, and other part of the light entering the light absorbing layer 4 is reflected at the bottom face of the upper cladding layer, and is propagated in an oblique direction in the light absorbing layer and the optical waveguide layer 15.

Therefore, the light incident into the semiconductor light-receiving element 100 by the incident light direction device 200 is not concentrated in part of the light absorbing layer 4 in the process of propagation in the light absorbing layer 4 and the optical waveguide layer 15, but is efficiently absorbed directly or by evanescent coupling over a wide range of the light absorbing layer 4, and is converted into current.

Hence, in the semiconductor light-receiving modules of the seventh to fourteenth embodiments of the invention, the photo responsivity, light fastness of input, high speed response, and dark current characteristic are substantially enhanced as the semiconductor light-receiving element 100.

Fifteenth Embodiment

Figure 24:
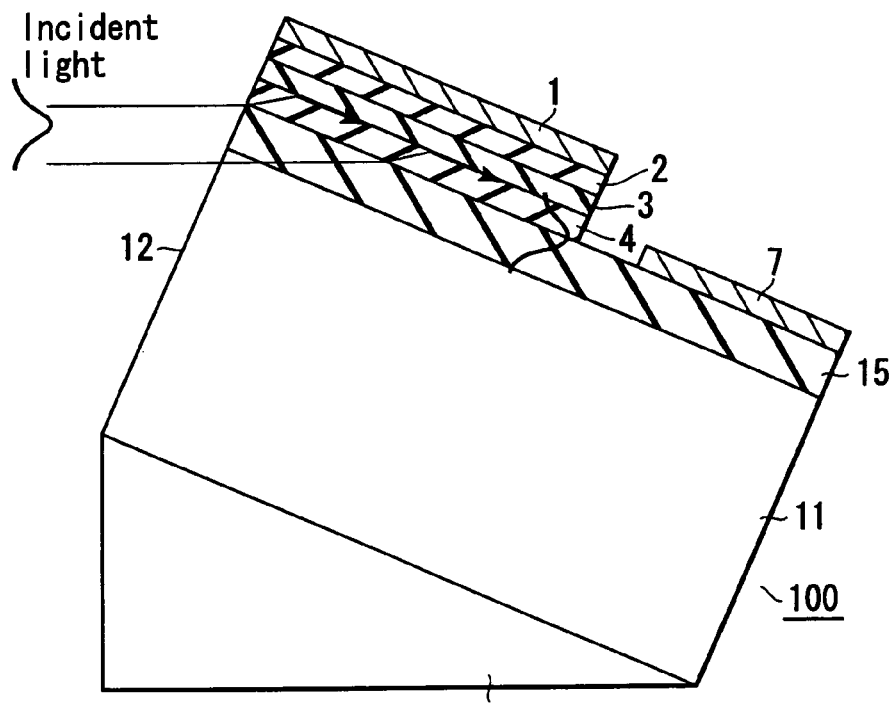
FIG. 24 is a cross sectional view showing a schematic configuration of a semiconductor light-receiving module according to a fifteenth embodiment of the invention.

FIG. 24 is a cross sectional view showing a schematic configuration of a semiconductor light-receiving module according to a fifteenth embodiment of the invention.

In FIG. 24, same parts as in the conventional semiconductor light-receiving element shown in FIG. 36 are identified with same reference numerals, and detailed description of duplicate parts is omitted.

That is, as shown in FIG. 24, the semiconductor light-receiving module of the fifteenth embodiment comprises, as described below, a semiconductor light-receiving element 100 having a lower semiconductor layer formed on a substrate 11 and having a function as an optical waveguide layer 15, a light absorbing layer 4 laminated on this optical waveguide layer 15 and having a higher refractive index than an upper cladding layer 3 formed on the light absorbing layer 4 and having a lower refractive index than the optical waveguide layer 15, a light incident facet 12 formed on so as to include at least one facet of the substrate 11, optical waveguide layer 15 and light absorbing layer 4, and electrodes 1, 7 for outputting the current generated by the light entering from the light incident facet 12 being absorbed in the light absorbing layer 4, to outside by way of the upper semiconductor layer and lower semiconductor layer, and an incident light direction device 200 for directing the incident light obliquely to irradiate the light incident facet 12 of the semiconductor light-receiving element 100.

Herein, the semiconductor light-receiving element 100 is formed by sequentially laminating the optical waveguide layer 15 made of n-InGaAsP, the light absorbing layer 4 made of i-InGaAs, the upper cladding layer 3 made of p-InP, and a contact layer 2 made of $p^+$-InGaAs, on the substrate 11 made of semi-insulating InP (SI-InP) material.

At the upper side of the contact layer 2, the p-electrode 1 is provided for taking out current.

In the optical waveguide layer 15 made of n-InGaAsP, similarly, the n-electrode 7 is provided for taking out current.

This semiconductor light-receiving element 100 is inclined on the whole by a wedge-shaped pedestal 16 disposed at the lower side of the substrate 11, as part of the incident light direction device 200 for emitting the light obliquely.

The optical waveguide layer 15 made of n-InGaAsP also has a function of an ohmic contact layer to the n-electrode 7 for taking out current.

In the semiconductor light-receiving element 100 having such configuration, the angle formed between the light incident facet 12 formed on at least one facet of the substrate 11, optical waveguide layer 15 and light absorbing layer 4 and the bottom face of the light absorbing layer 4 is set at 90 degrees.

Specifically, the light incident facet 12 of the semiconductor light-receiving element 100 is formed by cleavage.

In the semiconductor light-receiving element 100 having such configuration, the optical waveguide layer 15 made of n-InGaAsP composes the lower semiconductor layer.

In the semiconductor light-receiving element 100 used in the semiconductor light-receiving module of the fifteenth embodiment, the refractive indices $n_3$, $n_4$, $n_{15}$, $n_{11}$ of the upper cladding layer 3, light absorbing layer 4, optical waveguide layer 15, and substrate 11 are determined in the relation of $n_3(=3.17)=n_{11}(=3.17)<n_{15}(=3.35)<n_4(=$about 3.6$)$.

The principle of operation of the semiconductor light-receiving module of the fifteenth embodiment having such configuration is explained below by referring to FIGS. 25 and 26.

First, in the semiconductor light-receiving element 100, when light is entered in the facet of at least the optical waveguide layer 15 out of the optical waveguide layer 15 and substrate 11. Here, the band gap wavelength of the optical waveguide layer 15 is 1.2 μm, for example, having higher refractive index than the upper cladding layer 3 above the light absorbing layer 4, this incident light feels its high refractive index.

Therefore, for the incident light, the effective index $n_e$ becomes higher than the refractive index of the substrate 11.

Herein, as mentioned above, since the refractive index $n_3$ of the upper cladding layer 3 and the refractive index $n_{11}$ of the substrate 11 are substantially equal to each other, for the incident light, the effective index $n_e$ can be set higher than in the upper cladding layer 3.

Accordingly, Snell's law established at the interface between the optical waveguide layer 15 and the light absorbing layer 4 is as shown in formula (10) below:

$$n_e \sin \theta_{15} = n_4 \sin \theta_4 \quad (10)$$

At the interface between the light absorbing layer 4 and the upper cladding layer 3, Snell's law is as in formula (11):

$$n_4 \sin \theta_4 = n_3 \quad (11)$$

That is, putting formula (11) into formula (10), when the following formula (12) is obtained, total reflection occurs at the interface.

$$n_e \sin \theta_{15} = n_3 \quad (12)$$

At this time, the incident angle $\theta_4$ of the light to the upper cladding layer 3 is called the critical angle.

In order to establish this formula (12), considering the refractive indices $n_{15}$, $n_{11}$ of the optical waveguide layer 15 and substrate 11, it is important to have a feeling of high refractive index of at least the optical waveguide layer 15, and also to select properly the incident angle of the light.

In the semiconductor light-receiving module of the invention, therefore, the incident light direction device 200 is provided for emitting the incident light obliquely to the light incident facet 12 of the semiconductor light-receiving element 100.

Figure 25:
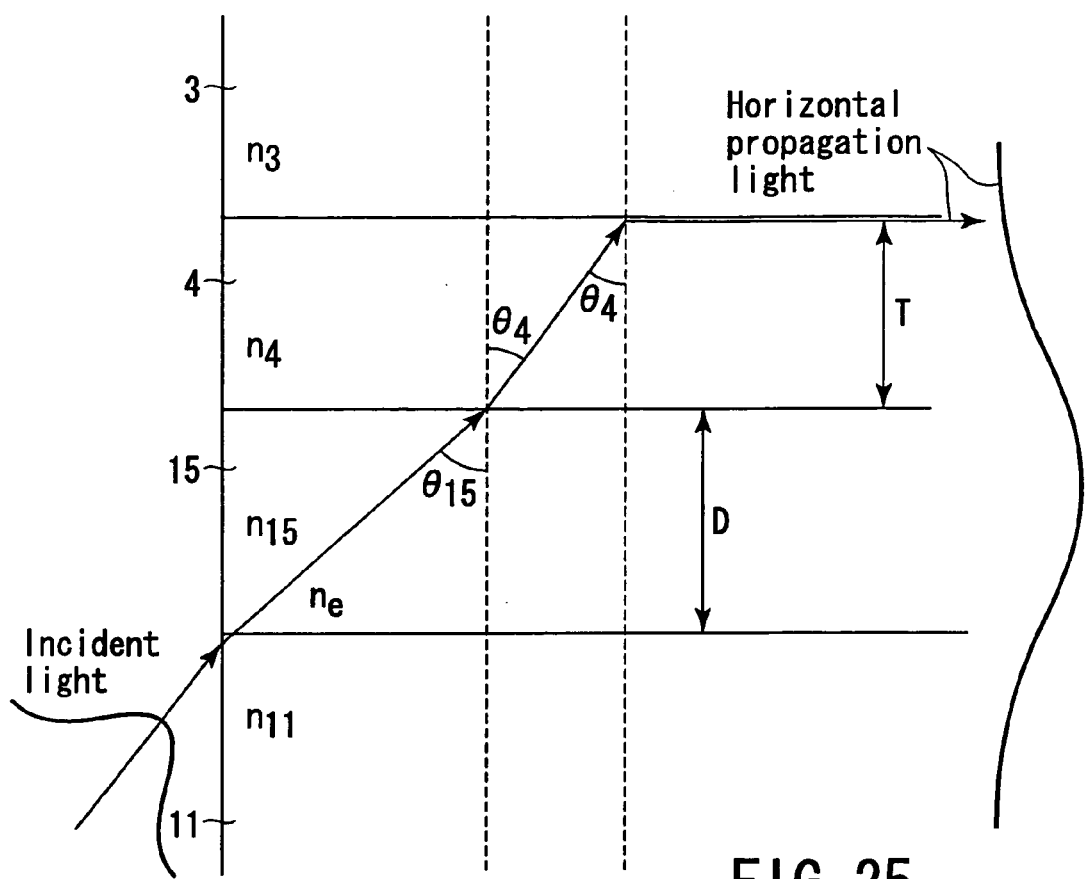
FIG. 25 is a diagram explaining an operation of the semiconductor light-receiving module in FIG. 24.

The optical waveguide layer 15 of the semiconductor light-receiving element 100 is designed to function has a loaded optical waveguide for propagating the light, and as shown in FIG. 25, by the incident light direction device 200, the incident angle $\theta_4$ to the upper cladding layer 3 of the semiconductor light-receiving element 100 must be set at the critical angle for inducing total reflection of light.

It results in, as shown in FIGS. 24 and 25, generation of light propagation in the horizontal direction in the light absorbing layer 4 and optical waveguide layer 15 of the semiconductor light-receiving element 100.

Figure 26:
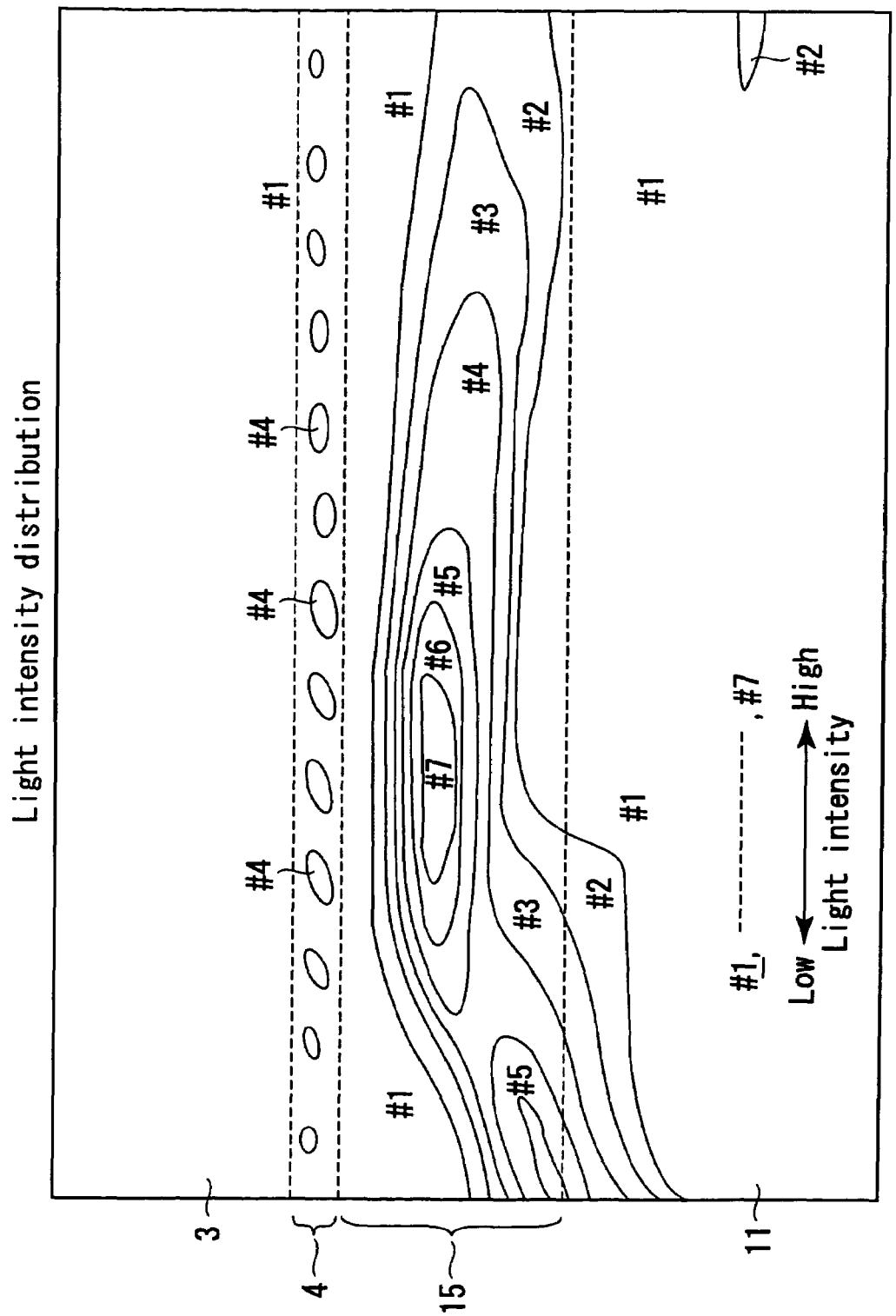
FIG. 26 is a view showing intensity distribution of light entering the semiconductor light-receiving element of the semiconductor light-receiving module in FIG. 24.

FIG. 26 is a diagram showing intensity distribution of light obtained by calculation in the semiconductor light-receiving element 100 in the case of incidence from the light incident facet 12 such that the incident angle $\theta_4$ to the upper cladding layer 3 of the semiconductor light-receiving element 100 coincides with the critical angle for inducing total reflection of light.

According to FIG. 26, it is confirmed that the majority of the light entering the semiconductor light-receiving element 100 is totally reflected at the interface between the light absorbing layer 4 and the upper cladding layer 3 of the semiconductor light-receiving element 100, and propagates horizontally in the light absorbing layer 4 and optical waveguide layer 15.

Therefore, in this semiconductor light-receiving module, the light can be propagated efficiently in the light absorbing layer 4 and optical waveguide layer 15 in the semiconductor light-receiving element 100.

The light thus propagating in the light absorbing layer 4 and optical waveguide layer 15 in the semiconductor light-receiving element 100 is absorbed in the light absorbing layer 4, and converted into current.

Figure 27:
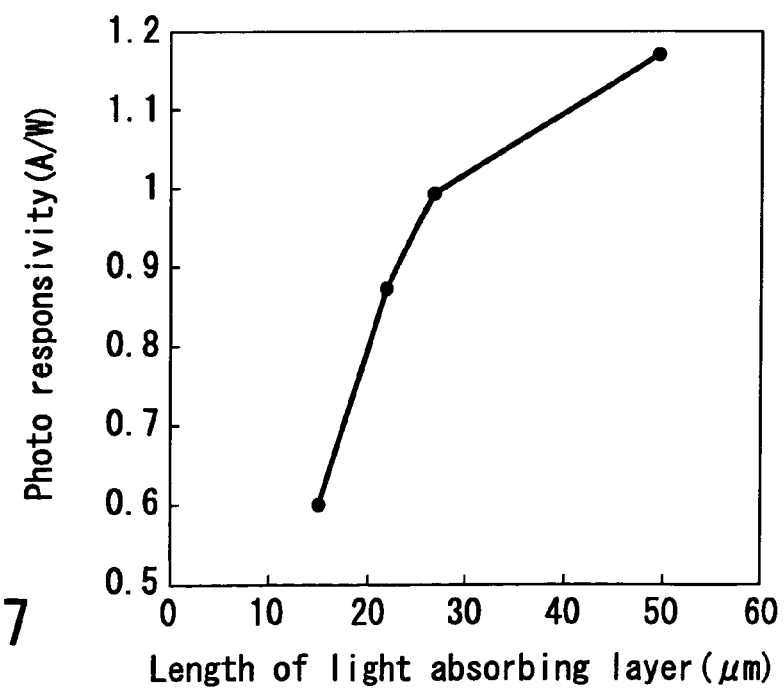
FIG. 27 is a diagram showing photo responsivity characteristic of the semiconductor light-receiving element of the semiconductor light-receiving module in FIG. 24.

FIG. 27 is a diagram showing measuring results of the characteristic of four trial products for the semiconductor light-receiving element as the semiconductor light-receiving element 100 to be used in the semiconductor light-receiving module of the fifteenth embodiment.

In FIG. 27, the axis of ordinates denotes the photo responsivity (A/W) of the trial product for the semiconductor light-receiving element, and the axis of abscissas represents the length of the light absorbing layer 4 of the trial product for the semiconductor light-receiving element.

As understood from the measuring results in FIG. 27, the photo responsivity is improved even in the semiconductor light-receiving element 100 of which length of light absorbing layer 4 is 30 μm or more.

In the trial products of the semiconductor light-receiving element 100, the thickness T of the light absorbing layer 4 is 0.5 μm, and the thickness D of the optical waveguide layer 15 is 2.0 μm.

In the trial products for the semiconductor light-receiving element 100, the incident angle of light from the horizontal direction is 44 degrees in all cases.

Figure 28:
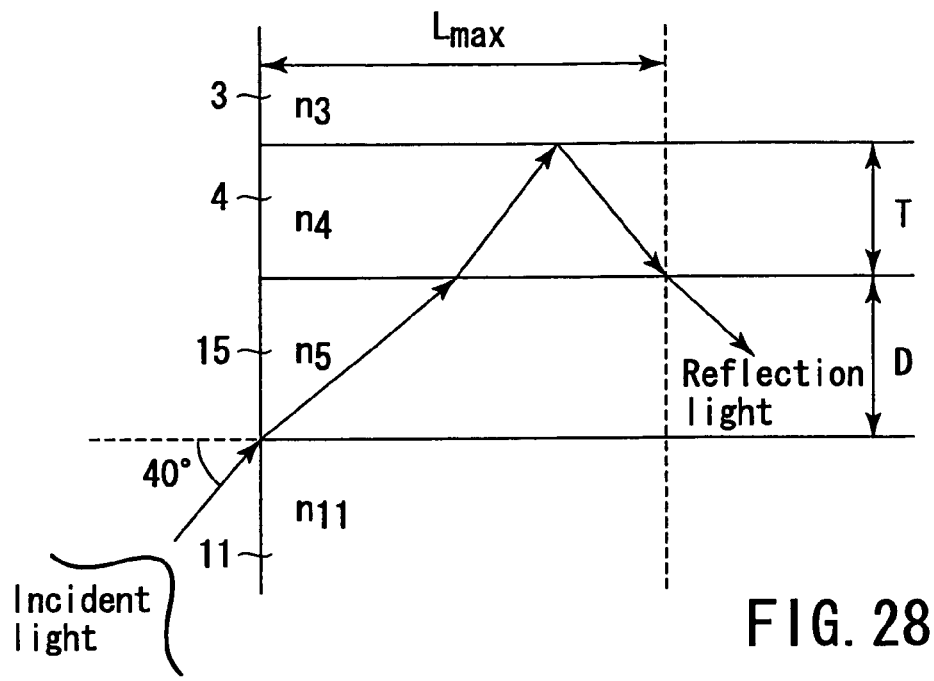
FIG. 28 is a diagram explaining a case of supposing once reflected at the interface between the light absorbing layer 4 and the upper cladding layer 3, and passing through the light absorbing layer 4, the length in the semiconductor light-receiving module in FIG. 24.

As shown in FIG. 28, supposing the light entering from the lower end of the optical waveguide layer 15 of the semiconductor light-receiving element 100, being once reflected at the interface between the light absorbing layer 4 and the upper cladding layer 3, and passing through the light absorbing layer 4, the length Lmax of the light absorbing layer 4 is considerably shorter than 20 μm.

However, as mentioned above, even in the semiconductor light-receiving element of which length of light absorbing layer 4 is 30 μm or more, the photo responsivity is improved.

That is, the light propagating in the light absorbing layer 4 of the semiconductor light-receiving element 100 is reflected at a critical angle to the interface between the light absorbing layer 4 and the upper cladding layer 3, and by total reflection at this interface, the light propagates in the light absorbing layer 4 and optical waveguide layer 15. Therefore, the optical path of the light is in horizontal direction, and by extending the length of the light absorbing layer 4, the photo responsivity as the semiconductor light-receiving element 100 is substantially improved.

In this manner, in the semiconductor light-receiving element 100 to be used in the semiconductor light-receiving module in the fifteenth embodiment, unlike the conventional semiconductor light-receiving element shown in FIG. 43, by extending the length of the light absorbing layer 4 as far as permitted by the bandwidth as the semiconductor light-receiving element 100, the photo responsivity as the semiconductor light-receiving element 100 can be enhanced.

In the semiconductor light-receiving element 100 to be used in the semiconductor light-receiving module of the fifteenth embodiment, moreover, since the light is irradiated over a wide range beneath the light absorbing layer 4 obliquely from beneath the semiconductor light-receiving element 100 by the incident light direction device 200, unlike the conventional semiconductor light-receiving element of optical waveguide type shown in FIG. 36 or the conventional loaded optical waveguide type element having the thin loaded optical waveguide 9 shown in FIG. 38, current is not concentrated in a specific portion of the light absorbing layer 4. As a result, breakdown of the semiconductor light-receiving element 100 due to Joule heat can be prevented.

Further, in the semiconductor light-receiving module of the fifteenth embodiment, by the incident light direction device 200, since a portion of large power of the light can be directly irradiated over a wide range of the bottom face of the light absorbing layer 4 obliquely from beneath the semiconductor light-receiving element 100, and also one part of the light can be propagated and absorbed in the light absorbing layer 4 or optical waveguide layer 15. Therefore, as compared with the conventional loaded optical waveguide type semiconductor light-receiving element having a thick loaded optical path shown in FIG. 38 or the conventional semiconductor light-receiving element of facet refractive type shown in FIGS. 42 and 43, the photo responsivity of the semiconductor light-receiving element 100 is higher and hence the required light absorption length of the semiconductor light-receiving element 100 is shorter, so that the bandwidth limited by the CR time constant can be widened.

In the semiconductor light-receiving element 100 to be used in the semiconductor light-receiving module of the fifteenth embodiment, the thickness D of the optical waveguide layer 15 may be smaller than the diameter of the incident light, so that the load to the crystal growth is small and the manufacturing efficiency of the semiconductor light-receiving element is excellent.

The same features are available also in the semiconductor light-receiving elements used in the semiconductor light-receiving modules according to sixteenth to twenty-second embodiments below.

Sixteenth Embodiment

Figure 29:
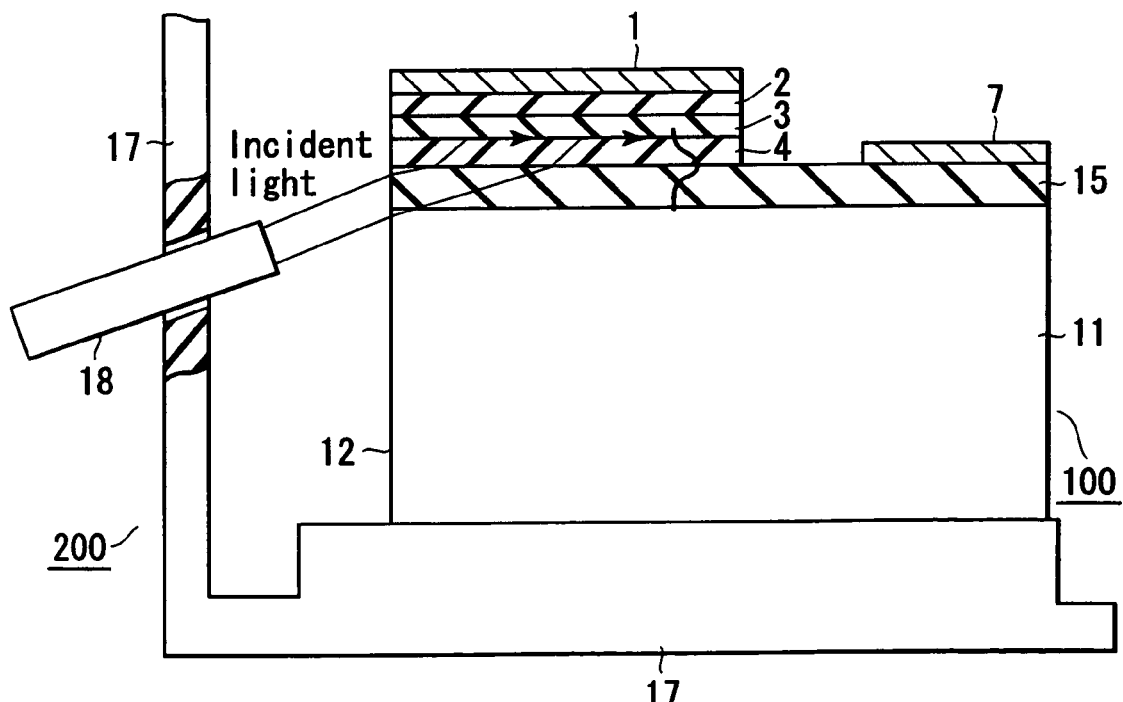
FIG. 29 is a cross sectional view showing a schematic configuration of a semiconductor light-receiving module according to a sixteenth embodiment of the invention.

FIG. 29 is a cross sectional view showing a schematic configuration of a semiconductor light-receiving module according to a sixteenth embodiment of the invention.

In FIG. 29, same parts as in the semiconductor light-receiving module of the fifteenth embodiment shown in FIG. 24 are identified with same reference numerals, and detailed description of duplicate parts is omitted.

In the semiconductor light-receiving module of the sixteenth embodiment, instead of the pedestal 16 in the semiconductor light-receiving module of the fifteenth embodiment shown in FIG. 24, a casing 17 is provided for holding the semiconductor light-receiving element 100 horizontally as an incident light direction device 200, and from an optical fiber 18 as the incident light direction device 200 inclined and supported on this casing 17, the light is inclined and irradiated to a light incident facet 12 composed at least at one facet of the substrate 11, optical waveguide layer 15 and light absorbing layer 4.

In the semiconductor light-receiving module having such configuration, the light entering the light incident facet 12 of the semiconductor light-receiving element 100 from the optical fiber 18 as the incident light direction device 200 is refracted by this light incident facet 12, and enters and is absorbed in the light absorbing layer 4 obliquely from beneath the light absorbing layer 4 positioned upward by way of the optical waveguide layer 15.

In the semiconductor light-receiving module of the sixteenth embodiment, too, at least one part of the incident light is irradiated to the light absorbing layer 4 of the semiconductor photo detector 100 by the incident light direction device 200, and by setting the refractive index $n_{15}$ of the optical waveguide layer 15 of the semiconductor light-receiving element 100 higher than the refractive index $n_3$ of the upper cladding layer 3 positioned above the light absorbing layer 4, such that the effective index $n_e$ of the incident light becomes higher than the refractive index $n_3$ of the upper cladding layer 3, the light propagating in the light absorbing layer 4 is incident into the interface between the light absorbing layer 4 and the upper cladding layer 3 at a critical angle, and is totally reflected at this interface, and then is propagated in the horizontal direction in the light absorbing layer 4 or optical waveguide layer 15.

Therefore, in the semiconductor light-receiving element 100 used in the semiconductor light-receiving module of the sixteenth embodiment, by extending the length of the light absorbing layer 4, the photo responsivity is notably improved as the semiconductor light-receiving element 100.

Seventeenth Embodiment

Figure 30:
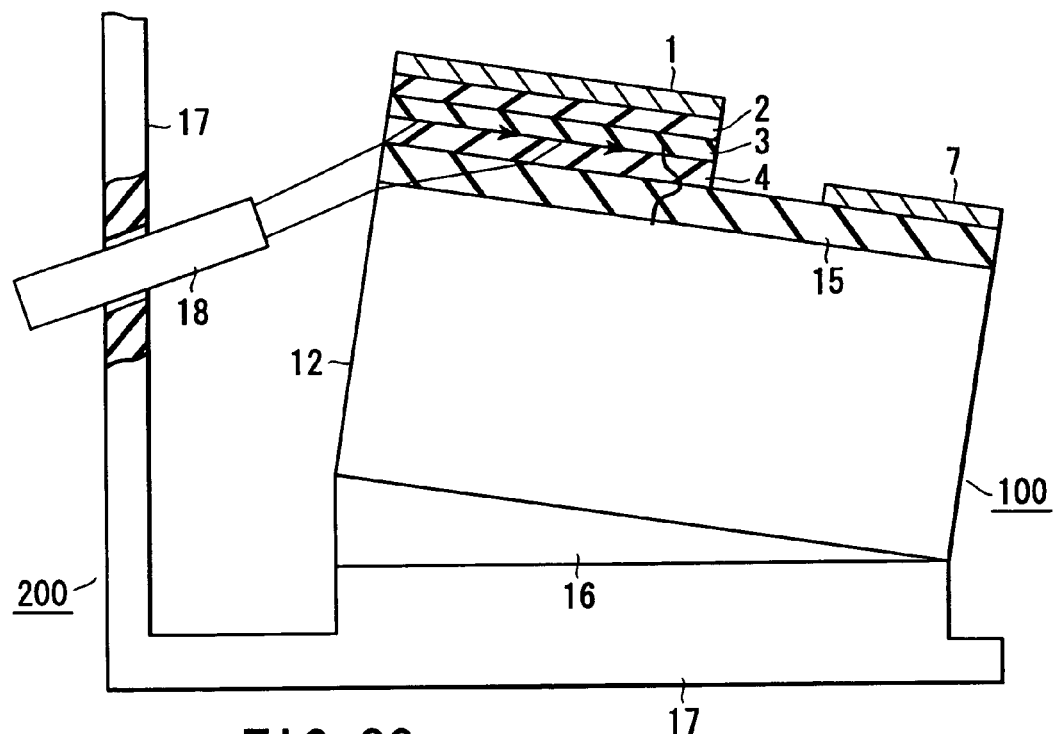
FIG. 30 is a cross sectional view showing a schematic configuration of a semiconductor light-receiving module according to a seventeenth embodiment of the invention.

FIG. 30 is a cross sectional view showing a schematic configuration of a semiconductor light-receiving module according to a seventeenth embodiment of the invention.

In FIG. 30, same parts as in the semiconductor light-receiving module in the sixteenth embodiment shown in FIG. 29 are identified with same reference numerals, and detailed description of duplicate parts is omitted.

In the semiconductor light-receiving module of the seventeenth embodiment, a wedge-shaped pedestal 16 is interposed between the casing 17 as the incident light direction device 200 and the substrate 11 in the semiconductor light-receiving module of the sixteenth embodiment shown in FIG. 29, and the light incident facet 12 is inclined.

In the semiconductor light-receiving module of the seventeenth embodiment, thus, by inclining the light incident facet 12 of the semiconductor light-receiving element 100 by the incident light direction device 200, the angle formed by the incident light issued from the optical fiber 18 as the incident light direction device 200 and the light incident facet 12 of the semiconductor light-receiving element 100 becomes smaller, so that a desired incident angle may be realized easily.

In the semiconductor light-receiving module of the seventeenth embodiment, too, by setting the refractive index $n_{15}$ of the optical waveguide layer 15 of the semiconductor light-receiving element 100 higher than the refractive index $n_3$ of the upper cladding layer 3 positioned above the light absorbing layer 4, such that the effective index $n_e$ of the incident light becomes higher than the refractive index $n_3$ of the upper cladding layer 3 the light propagating in the light absorbing layer 4 is incident into the interface between the light absorbing layer 4 and the upper cladding layer 3 at a critical angle, and is totally reflected at this interface, and then is propagated in the horizontal direction in the light absorbing layer 4 or optical waveguide layer 15.

Therefore, in the semiconductor light-receiving element 100 to be used in the semiconductor light-receiving module of the seventeenth embodiment, by extending the length of the light absorbing layer 4, the photo responsivity is notably improved as the semiconductor light-receiving element 100.

Eighteenth Embodiment

Figure 31:
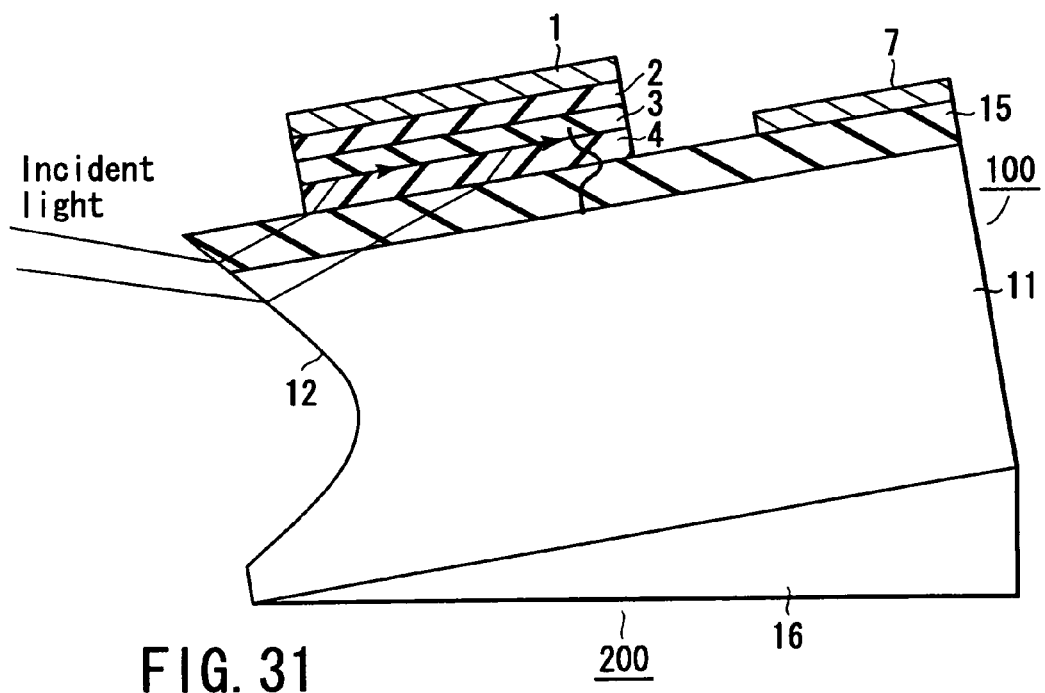
FIG. 31 is a cross sectional view showing a schematic configuration of a semiconductor light-receiving module according to an eighteenth embodiment of the invention.

FIG. 31 is a cross sectional view showing a schematic configuration of a semiconductor light-receiving module according to an eighteenth embodiment of the invention.

In FIG. 31, same parts as in the semiconductor light-receiving module in the fifteenth embodiment shown in FIG. 24 are identified with same reference numerals, and detailed description of duplicate parts is omitted.

In the semiconductor light-receiving module of the eighteenth embodiment, the light incident facet 12 including at least one facet of the substrate 11, the optical waveguide layer 15 made of n-InGaAsP and the light absorbing layer 4 of the semiconductor light-receiving element 100 is formed by wet etching process same as in the conventional semiconductor light-receiving element shown in FIGS. 42 and 43.

Therefore, the angle formed between the light incident facet 12 of the semiconductor light-receiving element 100 and the bottom face of the light absorbing layer 4 is about 54 degrees as determined by the crystal azimuth.

Further, to realize a small incident angle to the light absorbing layer 4 of the semiconductor light-receiving element 100, the entire structure of the semiconductor light-receiving element 100 is inclined by using the pedestal 16 as the incident light direction device 200.

The semiconductor light-receiving element 100 to be used in the semiconductor light-receiving module of the eighteenth embodiment seems to be similar to the conventional semiconductor light-receiving element shown in FIGS. 42 and 43. But, same as the semiconductor light-receiving element 100 to be used in the semiconductor light-receiving module of the fifteenth, sixteenth or seventeenth embodiment, by setting the refractive index $n_{15}$ of the optical waveguide layer 15 of the semiconductor light-receiving element 100 higher than the refractive index $n_3$ of the upper cladding layer 3 positioned above the light absorbing layer 4, such that the effective index $n_e$ of the incident light becomes higher than the refractive index $n_3$ of the upper cladding layer 3 the light propagating in the light absorbing layer 4 is incident into the interface between the light absorbing layer 4 and the upper cladding layer 3 at a critical angle, and is totally reflected at this interface, and then is propagated in the horizontal direction in the light absorbing layer 4 or optical waveguide layer 15.

Therefore, in the semiconductor light-receiving element 100 to be used in the semiconductor light-receiving module of the eighteenth embodiment, by extending the length of the light absorbing layer 4, the photo responsivity is notably improved as the semiconductor light-receiving element 100.

Nineteenth Embodiment

Figure 32:
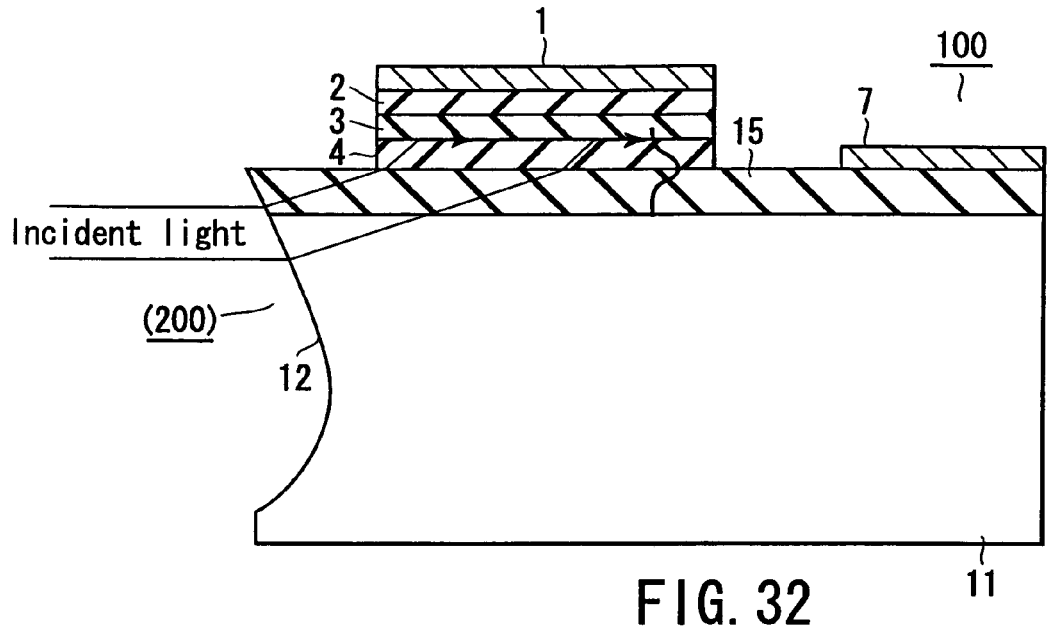
FIG. 32 is a cross sectional view showing a schematic configuration of a semiconductor light-receiving module according to a nineteenth embodiment of the invention.

FIG. 32 is a cross sectional view showing a schematic configuration of a semiconductor light-receiving module according to a nineteenth embodiment of the invention.

In FIG. 32, same parts as in the semiconductor light-receiving module in the eighteenth embodiment shown in FIG. 31 are identified with same reference numerals, and detailed description of duplicate parts is omitted.

In the semiconductor light-receiving element 100 used in the semiconductor light-receiving module of the nineteenth embodiment, the light incident facet 12 including at least one facet of the substrate 11, the optical waveguide layer 15 made of n-InGaAsP, and the light absorbing layer 4 is formed by wet etching process same as in the semiconductor light-receiving element 100 used in the semiconductor light-receiving module of the eighteenth embodiment shown in FIG. 31.

In the nineteenth embodiment, however, the time of wet etching is set shorter than the specified time.

Therefore, the angle formed between the light incident facet 12 of the semiconductor light-receiving element 100 and the top face of the optical waveguide layer 15 (bottom face of the light absorbing layer 4) is less than 90 degrees and larger than about 54 degrees determined by the crystal azimuth.

In this case, meanwhile, as the angle formed between the light incident facet 12 and the top face of the optical waveguide layer 15 (bottom face of the light absorbing layer 4), an angle larger than 54 degrees can be realized by selecting the crystal azimuth.

As a result, the pedestal 16 as one part of the incident light direction device 200 required in the eighteenth embodiment shown in FIG. 31 is no longer needed in this semiconductor light-receiving module of the nineteenth embodiment, and hence the entire mounting is easier.

In the semiconductor light-receiving element 100 to be used in the semiconductor light-receiving module of the nineteenth embodiment, too, by using the optical waveguide layer 15 having a higher refractive index than the upper cladding layer 3, same as in the semiconductor light-receiving element to be used in the semiconductor light-receiving module of the eighteenth embodiment, such that the effective index $n_e$ of the incident light becomes higher than the refractive index $n_3$ of the upper cladding layer 3 the light propagating in the light absorbing layer 4 is incident into the interface between the light absorbing layer 4 and the upper cladding layer 3 at a critical angle, and is totally reflected at this interface, and then is propagated in the horizontal direction in the light absorbing layer 4 or optical waveguide layer 15.

Therefore, in the semiconductor light-receiving element 100 to be used in the semiconductor light-receiving module of the nineteenth embodiment, by extending the length of the light absorbing layer 4, the photo responsivity is notably improved as the semiconductor light-receiving element 100.

Twentieth Embodiment

Figure 33:
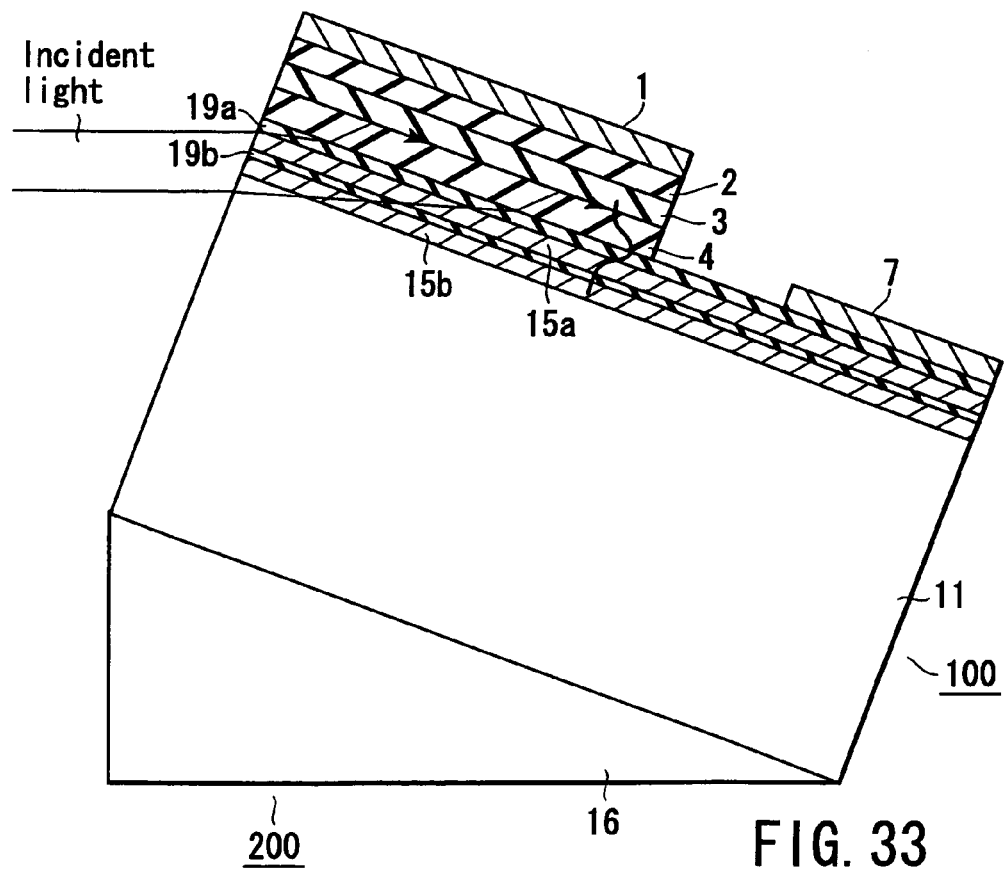
FIG. 33 is a cross sectional view showing a schematic configuration of a semiconductor light-receiving module according to a twentieth embodiment of the invention.

FIG. 33 is a cross sectional view showing a schematic configuration of a semiconductor light-receiving module according to a twentieth embodiment of the invention.

In FIG. 33, same parts as in the semiconductor light-receiving module in the fifteenth embodiment shown in FIG.

24 are identified with same reference numerals, and detailed description of duplicate parts is omitted.

In the semiconductor light-receiving element 100 used in the semiconductor light-receiving module of the twentieth embodiment, by alternately combining plural optical waveguide layers 15a, 15b made of n-InGaAsP and plural lower cladding layers 19a, 19b made of n-InP, when the light enters this semiconductor light-receiving element 100 by the incident light direction device 200, the refractive index felt equivalently by this light is set larger than the refractive index of the upper cladding layer 3 made of p-InP.

Thus, in the semiconductor light-receiving element of the semiconductor light-receiving module of the twentieth embodiment, by composing the lower semiconductor layer existing between the substrate 11 and the light absorbing layer 4 in a multi-layer structure by mutually different materials, the manufacturing efficiency can be enhanced by improving the crystallinity in the manufacturing process of the semiconductor light-receiving element 100 in which the lower semiconductor layer including the optical waveguide layers 15a, 15b and lower cladding layers 19a, 19b is formed on the substrate 11 by crystal growth.

Twenty-First Embodiment

Figure 34:
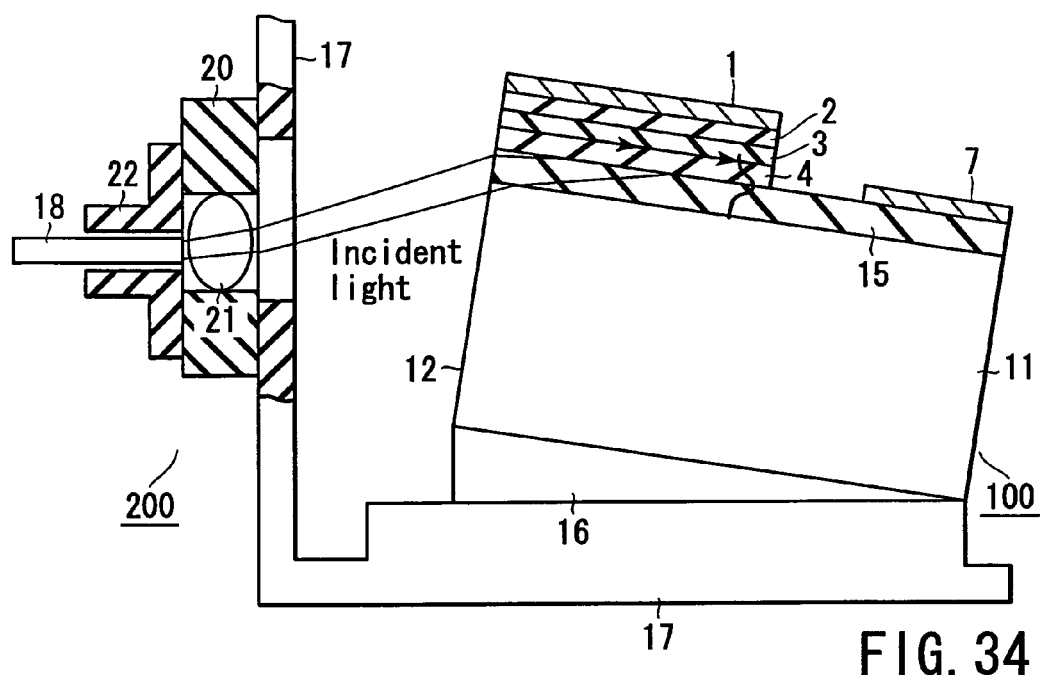
FIG. 34 is a cross sectional view showing a schematic configuration of a semiconductor light-receiving module according to a twenty-first embodiment of the invention.

FIG. 34 is a cross sectional view showing a schematic configuration of a semiconductor light-receiving module according to a twenty-first embodiment of the invention.

In FIG. 34, same parts as in the semiconductor light-receiving module in the seventeenth embodiment shown in FIG. 30 are identified with same reference numerals, and detailed description of duplicate parts is omitted.

In the semiconductor light-receiving module of the twenty-first embodiment, a lens 21 is fixed in a lens holder 20 as the incident light direction device 200, and the optical fiber 18 is held in the holder 22.

Actually, the optical fiber 18 is once fixed in a ferrule, and then incident into the holder 22, but the ferrule is omitted herein for the sake of simplicity of explanation.

Herein, by setting the relative configuration of the lens holder 20 as the incident light direction device 200 and the ferrule, that is, the optical fiber 18, it is possible to adjust at least one of the position and inclination at time of entry of the incident light in the light incident facet 12 of the semiconductor light-receiving element 100, so that the incident light can be efficiently irradiated to the light absorbing layer 4 of the semiconductor light-receiving element 100.

In the semiconductor light-receiving element 100 to be used in the semiconductor light-receiving module of the twenty-first embodiment, the seventeenth embodiment shown in FIG. 30 is applied, but it can be also applied in other embodiments, including the embodiments not using the pedestal 16 as the incident light direction device 200.

Twenty-Second Embodiment

Figure 35:
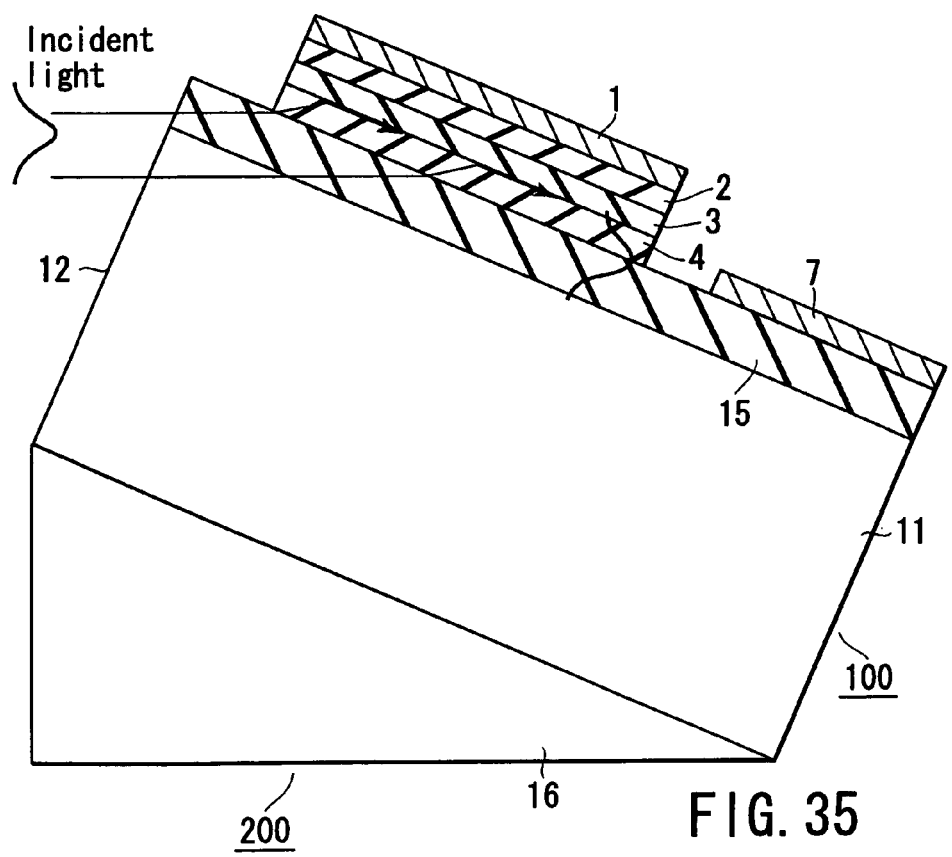
FIG. 35 is a cross sectional view showing a schematic configuration of a semiconductor light-receiving module according to a twenty-second embodiment of the invention.

FIG. 35 is a cross sectional view showing a schematic configuration of a semiconductor light-receiving module according to a twenty-second embodiment of the invention.

In FIG. 35, same parts as in the semiconductor light-receiving module in the fifteenth embodiment shown in FIG. 24 are identified with same reference numerals, and detailed description of duplicate parts is omitted.

In the semiconductor light-receiving element 100 to be used in the semiconductor light-receiving module of the twenty-second embodiment, the position of the facet of the optical waveguide layer 15 and substrate 11 for composing the light incident facet 12 is moved to the incident light side as compared with the position of the facet of the contact layer 2, upper cladding layer 3, and light absorbing layer 4.

In such configuration, too, the light entering from the light incident facet 12 of the semiconductor light-receiving element 100 and propagating in the light absorbing layer 4 is reflected at the interface between the light absorbing layer 4 and the upper cladding layer 3 at a critical angle by means of the incident light direction device 200, and is totally reflected at this interface, and is propagated in the horizontal direction in the light absorbing layer 4 or optical waveguide layer 15.

Therefore, the semiconductor light-receiving module of the twenty-second embodiment has the nearly same effects as the semiconductor light-receiving module of the fifteenth embodiment.

As described herein, in the semiconductor light-receiving modules of the fifteenth to twenty-second embodiments of the invention, by adjusting the refractive index of each layer surrounding the light absorbing layer 4 of the semiconductor light-receiving element 100 and the incident angle of the incident light by means of the incident light direction device 200, the light propagating in the light absorbing layer 4 is incident into the interface between the light absorbing layer 4 and the upper cladding 3 layer at a critical angle, and is totally reflected at this interface, and then is propagated in the horizontal direction in the light absorbing layer 4 and the optical waveguide layer 15.

Therefore, the light incident into the semiconductor light-receiving element 100 by the incident light direction device 200 is not concentrated in part of the light absorbing layer 4 in the process of propagation in the light absorbing layer 4 and the optical waveguide layer 15, but is efficiently absorbed directly or by evanescent coupling over a wide range of the light absorbing layer 4, and is converted into current.

Hence, in the semiconductor light-receiving modules of the fifteenth to twenty-second embodiments of the invention, the photo responsivity, light fastness of input, high speed response, and dark current characteristic are substantially enhanced as the semiconductor light-receiving element 100.

The seventh to twenty-second embodiments of the invention are not limited to the illustrated examples alone.

That is, in the seventh to twenty-second embodiments, the material for the optical waveguide layer 15 is n-InGaAsP, but instead of n-InGaAsP, any material having a higher refractive index than the upper cladding layer 3 made of p-InP may be used.

For example, n-InGaAsP of which band gap wavelength is other than 1.2 μm, or other n-InGaAlAs, n-InAlAs or the like may be used.

Further, in the seventh to twenty-second embodiments, the light is reflected or propagated horizontally at the interface between the light absorbing layer 4 and the upper cladding layer 3, but any other layer composition is possible as far as the light is reflected or propagated horizontally before entering the contact layer 2 in which the generated carrier is wasteful.

In an example of such layer composition, a layer higher in refractive index than InP is formed on the light absorbing layer 4, such as p-InGaAsP (or i-InGaAsP, p-InGaAlAs or i-InGaAlAs), and a layer of p-InP is formed thereon.

The angle formed between the incident light and the light incident facet 12 is not limited to the numerical value explained in the semiconductor light-receiving element of the embodiments, but other angle may be formed as far as the principle of the invention is established.

In the seventh to twenty-second embodiments, it is supposed that the lower cladding layer 5 made of n-InP is not formed beneath the light absorbing layer 4, but as far as the lower cladding layer 5 is sufficiently thin, a lower cladding layer 5 maybe formed beneath the light absorbing layer 4.

In the foregoing embodiments, to couple (enter) the light in the semiconductor light-receiving element, any means may be used such as leading ball fiber, plane fiber or lens system, and the wavelength is not limited to 1.55 µm, but may include other wavelength as well.

The material for the light absorbing layer 4 is not limited to p-InGaAs, but includes quaternary crystals such as p-InGaAsP or p-InGaAlAs, or various multiplex quantum well materials.

Further in the foregoing seventh to twenty-second embodiments, the light absorbing layer 4 has a high mesa structure, but it may be also realized in semi-insulating InP or pn buried structure.

The substrate 11 is not limited to semi-insulating substrate made of InP, may be included, for example, a semiconductor substrate made of $n^+$-InP.

Meanwhile, using an n type semiconductor of high concentration which is slightly lower in refractive index, an n-type or $n^+$-type semiconductor layer may be formed on the light absorbing layer 4, and a p-type or $p^+$-type semiconductor layer may be formed beneath the light absorbing layer 4.

For instance, an $n^+$-InP cladding layer may be formed on the light absorbing layer.

In such a case, in the seventh to twenty-second embodiments, the contact layer 2 may be made of $n^+$-InGaAs, the upper cladding layer 3 may be made of $n^+$-InP, and the lower cladding layer 5 may be made of p-InP (however, this layer may be omitted), and the optical waveguide layer 15 may be made of p-InP or $p^+$-InP, or any other material capable of enhancing the refractive index such as p-InGaAsP or $p^+$-InGaAsP.

Further, the substrate 11 may be made of $p^-$-InP or $p^+$-InP.

The semiconductor light-receiving module of the seventh to twenty-second embodiments may be also applied avalanche photodiode.

Generally, because of alloying when realizing an ohmic contact, the $p^+$-InGaAs contact layer 2 deteriorates in its crystallinity, and the smoothness is extremely poor at the interface between the p-electrode 1 and the $p^+$-InGaAs contact layer 2.

By contrast, in the seventh to twenty-second embodiments, the light propagating obliquely upward from the lower side of the semiconductor light-receiving element 100 is reflected or propagated horizontally at the interface of the semiconductor layer by the incident light direction device 200, and basically this light does not reach the contact layer 2 or the interface between the p-electrode 1 and the contact layer 2, and it is free from carrier not contributing to the photoelectric conversion or scatter loss of light, and hence the efficiency of photoelectric conversion is extremely high.

If a very slight portion of the light propagating obliquely upward from obliquely beneath exudes to the upper cladding layer 3 side, it is also considered to be within the scope of the invention.

If the structure is turned upside down, for example, by positioning the optical waveguide layer 15 on the upper side of the light absorbing layer 4, the function as the invention is unchanged.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-receiving module comprising:
   a semiconductor light-receiving element; and
   an incident light direction device;
   wherein the semiconductor light-receiving element comprises:
   a substrate;
   a lower semiconductor layer formed on the substrate, and having a function as an optical waveguide;
   a light absorbing layer formed on the lower semiconductor layer, and having a refractive index higher than a refractive index of the lower semiconductor layer;
   an upper cladding layer formed on the light absorbing layer, and having a refractive index lower than the refractive index of the lower semiconductor layer;
   a light incident facet including at least one facet of the substrate, the lower semiconductor layer and the light absorbing layer; and
   electrodes which output current generated by absorption of light entering from the light incident facet in the light absorbing layer, by way of the upper cladding layer and the lower semiconductor layer; and
   wherein the incident light direction device positions the semiconductor light-receiving element such that the light is irradiated onto the light incident facet at a predetermined angle, such that the light entering the light absorbing layer is incident on the bottom face of the upper cladding layer at a critical angle and is totally reflected at the bottom face of the upper cladding layer, and propagates in at least one of the light absorbing layer and the lower semiconductor layer in a direction parallel to the bottom face of the upper cladding layer.

2. The semiconductor light-receiving module according to claim 1, wherein an angle formed between the light incident facet and a bottom face of the light absorbing layer is 90 degrees.

3. The semiconductor light-receiving module according to claim 1, wherein an angle formed between the light incident facet and a bottom face of the light absorbing layer is less than 90 degrees, and is determined by a crystal azimuth of a material from which the light incident facet is formed.

4. The semiconductor light-receiving module according to claim 1, wherein an angle formed between the light incident facet and a bottom face of the light absorbing layer is less than 90 degrees, and is larger than an angle determined by a crystal azimuth of a material from which the light incident facet is formed.

5. The semiconductor light-receiving module according to claim 1, wherein the lower semiconductor layer is made of a semiconductor material of quaternary composition.

6. The semiconductor light-receiving module according to claim 1, wherein the lower semiconductor layer comprises a combination of at least one high?refractive-index layer and at least one low-refractive-index layer such that an effective index of the lower semiconductor layer is higher than the refractive index of the upper cladding layer, for the light entering the light incident facet.

7. The semiconductor light-receiving module according to claim 1, wherein the lower semiconductor layer is made of an n-type semiconductor material, and the upper cladding layer is made of a p-type semiconductor material.

8. The semiconductor light-receiving module according to claim 1, wherein the lower semiconductor layer is made of a p-type semiconductor material, and the upper cladding layer is made of an n-type semiconductor material.

9. The semiconductor light-receiving module according to claim 1, wherein the light entering the light incident facet is irradiated to the light absorbing layer through at least the lower semiconductor layer, by adjusting at least one of an incident position and an incident angle of the light with respect to the light incident facet.

* * * * *